US006320220B1

United States Patent
Watanabe et al.

(10) Patent No.: US 6,320,220 B1
(45) Date of Patent: Nov. 20, 2001

(54) QUANTUM TUNNELING EFFECT DEVICE AND SEMICONDUCTOR COMPOSITE SUBSTRATE

(75) Inventors: Hiroshi Watanabe, Kawasaki; Naoki Yasuda, Yokohama; Akira Toriumi, Yokohama; Tomoharu Tanaka, Yokohama; Toru Tanzawa, Ebina, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/617,251

(22) Filed: Jul. 14, 2000

Related U.S. Application Data

(62) Division of application No. 09/042,610, filed on Mar. 17, 1998, now Pat. No. 6,111,288.

(30) Foreign Application Priority Data

Mar. 18, 1997 (JP) .................................... 9-065150

(51) Int. Cl.$^7$ .................. H01L 29/06; H01L 29/66; H01L 29/78; H01L 29/788; H01L 31/328
(52) U.S. Cl. ................ 257/321; 257/299; 257/290; 257/30; 257/25; 257/14; 365/185.01; 365/185.18
(58) Field of Search ................................ 257/321, 299, 257/290, 314–322, 30, 25, 14, 17, 21, 22, 97; 365/185.01, 185.18

(56) References Cited

U.S. PATENT DOCUMENTS

| 5,485,017 | * | 1/1996 | Nishizawa | 257/24 |
| 5,486,704 | * | 1/1996 | Morishita | 259/39 |
| 5,606,175 | * | 2/1997 | Trussott . | |
| 5,665,978 | * | 9/1997 | Uenoyama et al. | 257/30 |
| 5,731,717 | * | 3/1998 | Ohshima et al. | 326/136 |
| 5,877,511 | * | 3/1999 | Tanamoto et al. | 257/30 |
| 5,896,315 | * | 4/1999 | Wong | 365/185.01 |
| 5,999,444 | * | 12/1999 | Fujiwara et al. | 365/185.02 |
| 6,069,820 | * | 5/2000 | Inomata et al. | 365/171 |
| 6,211,531 | * | 4/2001 | Nakazato et al. | 257/28 |

OTHER PUBLICATIONS

M. Buettiker, et al. "Traversal Time for Tunneling", Physical Review Letters, vol. 49, No. 23 (Dec. 6, 1982), pp. 1739–1742.
M. Buettiker, et al., "Traversal Time for Tunneling", Physica Scripta, vol. 32, (Apr. 2, 1985), pp. 429–434.

* cited by examiner

Primary Examiner—Alexander O. Williams
(74) Attorney, Agent, or Firm—Oblon, Spivak, McClelland, Maier & Neustadt, P.C.

(57) ABSTRACT

A new switching element and a circuit device and the like using the same element are provided, which comprises semiconductor in which a channel region is formed at an interface with an insulating film, first and second terminals S, D, which are located in corresponding manner to both ends of the channel region, and through which a tunnel current is let to flow into the channel region, and a third terminal G giving a high frequency vibration to a potential barrier of the channel region through the insulating film, wherein the tunnel current flowing into the channel region is increased as a value of an exponential function is increased with a predetermined threshold vibration frequency as a boundary value.

15 Claims, 40 Drawing Sheets

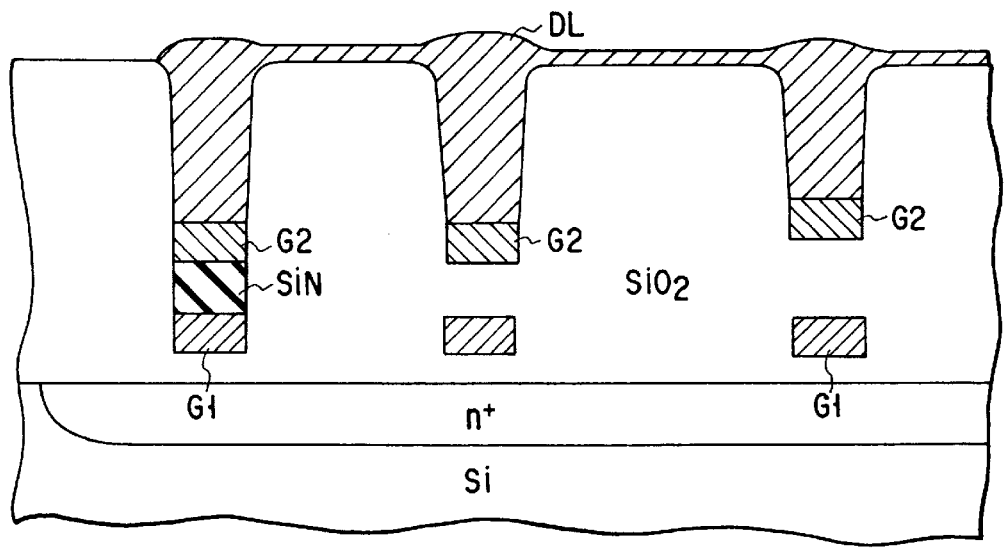
FIG. 28
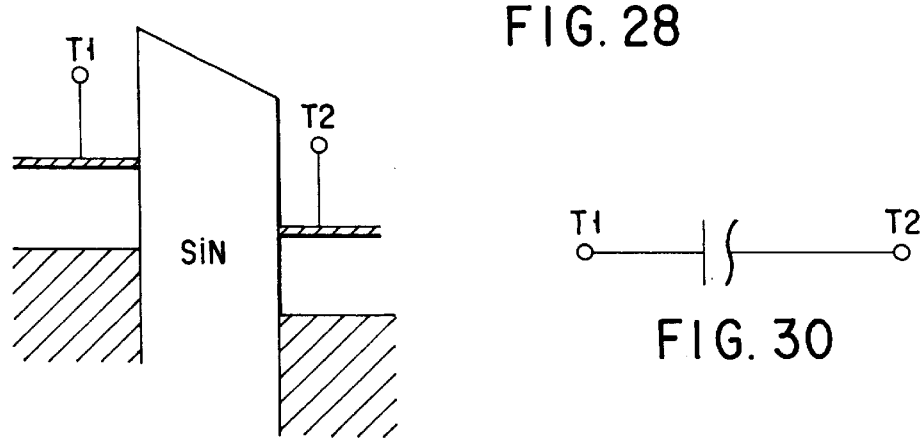
$V2-V1=V0+V1\cos\omega t$
FIG. 29
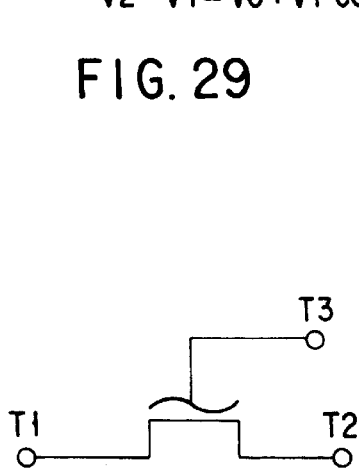
FIG. 30
FIG. 32
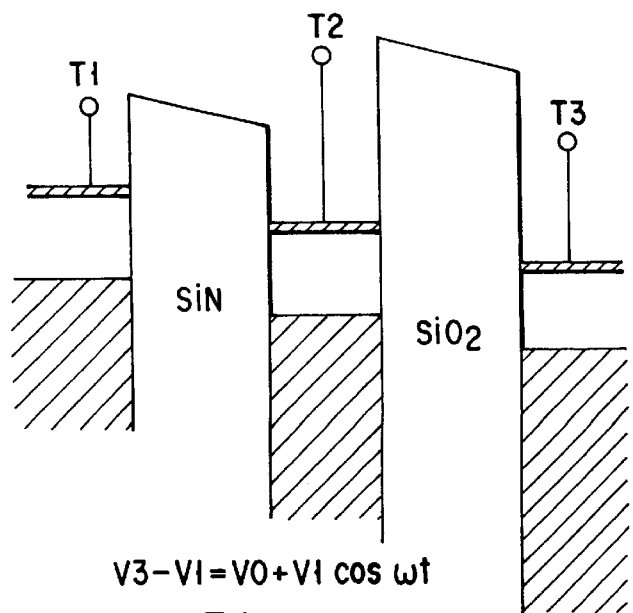
$V3-V1=V0+V1\cos\omega t$
FIG. 31

QUANTUM TUNNELING EFFECT DEVICE AND SEMICONDUCTOR COMPOSITE SUBSTRATE

CROSS REFERENCE TO RELATED APPLICATIONS

This divisional application claims priority under 35 USC §120 to U.S. patent application Ser. No. 09/042,610 filed Mar. 17, 1998, now U.S. Pat. No. 6,111,288 the entire contents of which are incorporated by reference.

BACKGROUND OF THE INVENTION

The present invention relates to a quantum effect device and the like used for super-integration of an electronic circuit.

The semiconductor industry has achieved a high degree of integration by reducing an area occupied by one functional element and developed together with improvements on technologies, for example, of a process, an element, circuit design and the like to achieve such a high degree of integration.

As a switching element used for switching in a semiconductor chip, while a MOS transistor has mainly employed, control of a diffused layer formed in an Si substrate has been harder and in addition improvement on reliability of an isolation oxide film has been problematic since the transistor is operated by applying an electric field to an interface with progress in miniaturization of an element. Particularly, in connection with the reliability of an isolation oxide film, it has been widely known that a trap level caused by an impurity, a defect and the like in the oxide film and a high electric field encourage tunneling of electrons and generate a leakage current.

Under such circumstances, although efforts have been conducted to improve a film quality at a molecular level in order to solve the problem, it has not sufficiently been understood how to improve the film quality and therefore, it is hard to improve a film quality at a molecular level in a semiconductor fabrication process under the current technologies, so that it is considered that the improvement is rather impossible. Further, since a semiconductor substrate which is uniform in structure and in composition has been employed, it is difficult to fabricate various devices in one chip.

For such reasons, a functional element, which has a margin in film quality, whose switching function is not deteriorated even with the presence of a some leakage current, and which has no diffused layer has been required. In detail, it is required to provide a function element, which operates at a low voltage of 1V or lower, and which can make a current drastically larger than a leakage current flow in a conductive condition or a circuit device which uses a semiconductor composite substrate and various kinds of converter, and which can process an optical signal, an analogue signal, a digital signal and the like at the same time.

BRIEF SUMMARY OF THE INVENTION

It is an object of the present invention to provide a new switching element having the above mentioned features and a circuit device and the like using the same new switching element.

A quantum effect device according to the present invention has a feature that a tunnel current is increased exponentially by making a quantum absorbed by tunneling electron in or releasing it from a tunneling electron.

A quantum effect device according to the present invention has a feature that a tunnel current is increased exponentially by making a quantum absorbed by tunneling electron in or releasing it from a tunneling electron and switching is conducted based on presence or non-presence of the increase of the tunnel current.

In the quantum effect device, as the quantum, for example, a photon or excitation of energy by a high frequency vibration of a potential barrier is used. Particularly, increase in a tunnel current caused by the latter is called BL tunneling.

A quantum effect device according to the present invention has a feature that the device comprises a tunnel film and a pair of electrodes with the tunnel film interposing therebetween, wherein a tunnel current flowing between the pair of electrodes is increased exponentially by quantum exchange between light passing through the tunnel film and a tunneling electron flowing between the pair of electrodes.

A quantum effect device according to the present invention has a feature that the device comprises a first and second terminals, and a tunnel film through which a tunnel current is let to flow between those two terminals, wherein a high frequency vibration is given to a potential barrier of the tunnel film by applying a high frequency to at least one of the first and second terminals and thus the tunnel current flowing through the tunnel film is increased with the frequency if it is larger than a predetermined threshold frequency as a boundary value (BL tunneling). Particularly, such a quantum effect device is called a two terminal BL tunnel element.

A quantum effect device according to the present invention has a feature that the device comprises a first and second terminals, and a tunnel film through which a tunnel current is let to flow between those two terminals and a third terminal by which a high frequency vibration is given to a potential barrier of the tunnel film, wherein the tunnel current flowing through the tunnel film is increased with the frequency if it is larger than a predetermined threshold vibration frequency as a boundary value (BL tunneling). Particularly, such an quantum effect device is called a three-terminal BL tunnel element.

A quantum effect device according to the present invention has a feature that the device comprises a first tunnel film formed on a substrate, a first gate formed on the first tunnel film, a second tunnel film formed on the first gate and a second gate formed on the second tunnel film, wherein a tunnel current flowing between the first gate and the substrate or the first gate and the second gate is increased with a high frequency vibration input to the first or the second gate if the frequency is larger than a predetermined threshold vibration frequency as a boundary value.

A quantum effect device according to the present invention has a feature that the device comprises: a channel region formed in semiconductor underlying an insulating film interposing a first and second terminals by which a tunnel current is let to flow through the channel region, and which are located in corresponding manner to both ends of the channel region; and a third terminal located across the insulating film and giving a high frequency vibration to a potential barrier of the channel region, wherein the tunnel current flowing through the channel region is increased with the frequency if it is larger than a predetermined threshold vibration frequency as a boundary value.

A semiconductor composite substrate according to the present invention has a feature that the substrate comprises: plural kinds of semiconductor region which are different from each other or one another in composition or structure each in the shape of a band; and a substrate isolation region sandwiched between semiconductor regions.

According to the present invention, since quantum absorption in a tunneling electron is used as a operational principle, there can be obtained a new device which has a feature that a margin in reliability of an insulating film is secured.

Besides, since the semiconductor composite substrate is used, semiconductor regions of respectively different characteristics can be formed in one chip, so that, for example, a high frequency generator and the quantum effect device can be formed in respective semiconductor regions which are suitable for the generator and the device.

Detailed embodiments of the present invention will be described in aspects of the present inventions A to M in a separate manner.

[A Constitution of an Aspect A of the Present Invention]

(Feature: A1)

The aspect A has a feature that a quantum effect switching device is constituted in such a manner that a tunneling electron is subjected to an intentional quantum exchange and thereby a quantity of a tunnel current is adjusted at an exponential rate.

(Feature: A2)

A feature is that the switching device set forth in A1 comprises a thin tunnel film, two electrodes, and a quantum generator which can directly exchange a quantum with a tunneling electron in said tunnel film interposing between said two electrodes.

(Feature: A3)

A feature is that the switching device is constituted in such a manner that a tunnel current is increased by a factor of exp (2 ω/ωo) when the tunneling electron in the tunnel film set forth in A2 absorbs a quantum [hω](hω=hν) from the quantum generator set forth in A2 and the tunnel current is not increased exponentially when the absorption does not occur.

Herein, the characteristic frequency $\omega_o$ is given by a mathematical formula (1):

$$\omega_T < \omega_O = \sqrt{\frac{2}{m}} \left[ \int_0^{T_{ox}} \frac{dx}{\sqrt{U(x) - E}} \right]^{-1} \quad (1)$$

where U(x) is a potential of the tunnel film, $T_{ox}$ is the thickness of a tunnel film and m is the effective mass of an tunneling electron.

(Feature: A4)

A feature is that the state that the tunnel current set forth in A3 is exponentially increased is used as "switch ON" and the state that the tunnel current is not increased exponentially is used as "switch OFF."

(Feature: A5)

A feature is that a switching device has a feature that a photon, energy excitation by electric high frequency vibration of a potential, or the like, is used as the quantum set forth in A1.

(Feature: A6)

A feature is that a switching device using the photon in A5 as the quantum set forth in A1 has a feature that as a tunnel film, a thin film made of a material which has a high electrical insulating property, and optical transparence (quartz glass, soda-lime glass, boro-silicate glass, flint glass, organic glass and the like) is used, and an internal structure such that refractive indexes are smaller on both electrode sides of the thin film, makes an efficiency improved.

(Feature: A7)

A feature is that one of the two electrodes set forth in A2 is used as a source and the other is used as a drain, a terminal through which an energy quantum is injected into a tunnel film is provided so that a three terminal switching device is constituted.

(Feature: A8)

A feature is that the switching device using the photon in A5 as the quantum set forth in A1 is constituted so that the switching device can be applied as a photoelectric converter in which a light signal is converted to an electric signal.

(Feature: A9)

A feature is that the photoelectric converter is constituted in such a manner that two electrodes are mounted in the diameter direction of an optical fiber used instead of the tunnel film set forth in A6. Several optical fibers may be used in a bundle as the tunnel film set forth in A6.

(Feature: A10)

A feature is that the electric high frequency vibration set forth in A5 causes a periodical high frequency vibration of a tunnel barrier, and a tunnel electron absorbs a quantum from the periodical vibration of the tunnel barrier and the tunnel current is increased exponentially when the frequency is sufficiently high (BL tunneling).

[Action and Effect of the Aspect A of the Present Invention]

A new tunnel element with a quantum exchange of a tunnel electron as an operational principle can be realized.

[A Constitution of an Aspect B of the Present Invention]

(Feature: B1)

The aspect B is directed to a switching device having a feature that an input signal which periodically vibrates is input and a specific threshold vibration frequency is present for the signal and further has a feature that it is conductive when a vibration frequency of the input signal is larger than the threshold vibration frequency but not conductive when a vibration frequency of the input signal is smaller than the threshold vibration frequency.

(Feature: B2)

A feature is that a switching device has a feature that the input signal set forth in B1 has a non-vibration component and a vibration component having a vibration frequency larger than the threshold vibration frequency and the non-vibration component and the vibration component are controlled by a control device. As a whole, a circuit device is designed as a circuit comprising a switching element, a control device and a peripheral functional element. By the control device, a non-vibration component of the input signal is controlled on its magnitude and sign, a vibration component of the input signal is controlled on its phase, amplitude and vibration frequency. A constitution of the control device is different according to a way of utilization of the switching device. In the case where an input signal is a voltage, a non-vibration component of the input signal is a direct current voltage to be controlled by a direct current electric supply, control parameters therefor are a magnitude and a sign thereof, a vibration component of the input signal is an alternating current voltage to be controlled by an alternating current power supply and control parameters therefor are a phase, amplitude and vibration frequency. When an input signal is a current, a non-vibration component of the input signal is a direct current to be controlled by a direct current power supply, control parameters therefor are a magnitude and sign thereof, a vibration component of the input signal is an alternating current to be controlled by an alternating current power supply and control parameters therefor are a phase, amplitude and a vibration frequency.

(Feature: B3)
A feature is that in the switching device set forth in B1, one state of being conductive and not being conductive is used as the ON state and the other is used as the OFF state.

(Feature: B4)
A feature is that the switching device set forth in B1 comprises a tunnel insulating film and a current is made to flow not to a surface of a substrate but to the insulating film directly by BL tunneling, and the current is exponentially increased according to a vibration frequency.

(Feature: B5)
The threshold vibration frequency set forth in B1 can be freely adjusted after fabrication by controlling a non-vibration component of the periodical vibration input signal set forth in B2 or can selectively set in advance in a fabrication process by selecting a kind of the tunnel insulating film set forth in B4, wherein the kind of the tunnel insulating film can be discriminated based on a material, a fabrication method, a thickness, an impurity or the like. The threshold vibration frequency can selectively set in advance in a step of the fabrication process by selecting kinds of substrate and gate electrode in addition of a kind of tunnel insulating film as well, wherein the kinds of substrate and gate electrode are also selectively set in advance in a step of a fabrication process by changing a compositional element or its fraction of the substrate or the gate electrode.

(Feature: B6)
A feature is that the input signal set forth in B1 periodically vibrates a potential barrier with a voltage, which periodically vibrates, light, a chemical reaction, or an exchange of a chemical material and a very small material of an atomic or molecular size equivalent to the chemical material and the like, or in a relative manner periodically vibrates a Fermi surface of a layer directly adjacent to the potential barrier or a Fermi surface of a layer adjacent to the potential barrier with one or more layers interposing therebetween with any method available.

(Feature: B7)
The chemical material and a very small material of an atomic or molecular size equivalent thereto set forth in B6 has a feature to transport a positive or negative charge and the potential barrier set forth in B6 has a feature that the barrier is made of the tunnel insulating film set forth in B4.

(Feature: B8)
A feature is that the switching element set forth in B1 has two terminals, the signal which periodically vibrates set forth in B1 is input to both or one of the two terminals, and the two terminals are made conductive therebetween when a vibration frequency of the input signal set forth in B1 is larger than the threshold vibration frequency set forth in B1 but the two terminals are not made conductive when the vibration frequency is smaller than the threshold vibration frequency. A current flowing between the two terminals is adjusted by a voltage applied between the terminals, a periodical vibration component or non-vibration component of the input signal.

(Feature: B9)
The switching element set forth in B1 has three terminals, the signal which periodically vibrates set forth in B1 is input to one of the terminals, the other two terminals are made conductive when a vibration frequency thereof is larger than the threshold vibration frequency set forth in B1 but the other two terminals are not made conductive when the vibration frequency thereof is smaller than the threshold vibration frequency. A current flowing between the other two terminals is adjusted by a voltage applied between the other two terminals and a non-vibration component of the input signal or a vibration component thereof.

(Feature: B10)
The tunnel insulating film set forth in B4 and the thin insulating film set forth in B6 can be made of: an insulating film made of a chemical compound including a silicon, for example, nitride film, a silicon oxide film or the like; an insulating film made of an organic material or inorganic material; or a compound semiconductor.

(Feature: B11)
It is preferable that an amplitude of a periodical vibration of the potential barrier set forth in B6 is smaller than the height of the potential barrier (a time average of height of the potential barrier), and further an input is higher than 0.02V when the input which causes a potential vibration is a voltage.

(Feature: B12)
It is preferable that the thin insulating film set forth in B6 has a barrier lower or thinner than that of the tunnel insulating film set forth in B4.

(Feature: B13)
The threshold vibration frequency set forth in B1 can be reduced by thickening the tunnel insulating film set forth in B4 or by lowering a time average of height of the potential barrier set forth in B6.

(Feature: B14)
A substrate which is used for fabricating an integrated circuit comprising the switching element set forth in B1 and an oscillating device for oscillating a vibration component of the input signal set forth in B2 can be constituted of a silicon substrate, a compound semiconductor substrate or a composite substrate which is formed by bonding a silicon substrate and a compound semiconductor substrate. Particularly in the case of the composite substrate, the oscillating device is fabricated on one or both, in a bridging manner, of the silicon substrate and the compound semiconductor substrate and the switching element is fabricated on one or both, in a bridging manner, of the silicon substrate and the compound semiconductor substrate.

(Feature: B15)
A feature is that the switching element set forth in B1 is realized in a vertical structure in which: an insulating film, a gate 1, an insulating film and a gate 2 formed on an n-type or a p-type well contacted to an independent electrode and the well, the gate 1; the gate 2 are respectively connected to independent electrodes; and the input signal set forth in B1 is applied to the well, the gate 1 or the gate 2.

(Feature: B16)
A feature is that the gate 2 is constituted of polysilicon formed at the bottom of a contact fabricated above the gate 1, and the gate 1 is a fine wire made of a metal or polysilicon extending in parallel to the surface of a substrate, passing through between a well and the gate 2, and a source/drain are not fabricated in a region of the substrate on which region the vertical structure corresponding to a unit cell is constructed, and the size of the unit cell is determined by the width of the contact or the width of the gate 1, whichever is larger.

(Feature: B17)
A feature is that tunnel insulating films set forth in B4 are fabricated between a well and a gate 1, and between the gate 1 and the gate 2 formed thereon, and the threshold vibration frequency set forth in B1 and a quantity of the current set forth in B4 can freely changed by changing a film thickness ratio thereof.

(Feature: B18)
A feature is that when a voltage is used as an input signal applied to gate 1, the magnitude of a constant voltage which is a non-vibration component of the input signal set forth in B2 is larger than the amplitude of an alternating voltage which is a vibration component of the input signal.

(Feature: B19)

A feature is that a quantity of a current flowing through the tunnel insulating film set forth in B4 is adjusted by adjusting the magnitude of the constant voltage set forth in B18.

(Feature: B20)

A feature is that the threshold vibration frequency set forth in B1 is adjusted by use of the magnitude of the constant voltage set forth in B18 in the structure set forth in B15.

(Feature: B21)

A feature is that the two terminal set forth in B8 has an element structure similar to that of an ordinary capacitor and a voltage is used as the input signal set forth in B1, and a feature is that the voltage is applied to both electrodes of a capacitor to generate a potential difference, and a product obtained by multiplying an amplitude of the vibration component by the elementary charge is smaller than the potential barrier set forth in B6, and the two terminal is conductive when a vibration frequency of the vibrating voltage component is larger than the threshold vibration frequency set forth in B1 but is not conductive when a vibration frequency of the vibrating voltage component is smaller than the threshold vibration frequency set forth in B1.

(Feature: B22)

A feature is that a current flowing a capacitor structure in its conductive condition is alternating when a constant voltage component of the input voltage set forth in B1 is smaller than a vibrating voltage component, and to the contrary, the current is direct when the constant voltage component is lager than the vibrating voltage component.

(Feature: B23)

A feature is that the switching device set forth in B7 is constituted of a MOS type BL tunnel element having a feature that the tunnel barrier set forth in B7 is a channel region of an n-MOS transistor and the tunnel barrier vibrates by a high frequency alternating voltage applied to a gate and a tunnel current which is increased exponentially is BL tunnel current.

[Action and Effect of the Aspect B of the Present Invention]

Since BL tunneling is adopted as an operational principle, a vibration frequency threshold type switching element (BL tunnel element) which has a margin in reliability of an insulating film can be realized. Besides, since an area occupied by one cell is equal to that of one gate contact, a switching element, which is finer than one conventionally available, can be formed and since a source/drain are not required, a diffusion step for fabricating the source/drain is omitted. As a result, a two-terminal and three-terminal switching devices can be fabricated with ease. A threshold value can be selectively in advance in a step of a fabrication process or can selectively be adjusted even in its operation.

[A Constitution of an Aspect C of the Present Invention]

(Feature: C1)

The aspect C has a feature that a read only memory device is constituted by a switching device using a BL tunnel element instead of a switching device using a MOS transistor.

(Feature: C2)

The read only memory device s (et forth in C1 has a feature that a switch input to a wordline is an alternating current input to the tunnel element set forth in C1, a threshold vibration frequency of the tunnel element is present as a threshold value for a vibration frequency of an input signal of the read-only memory device and an output current of the read only memory device can be controlled as an exponential function of the vibration frequency and the threshold value.

(Feature: C3)

A feature is that the threshold value set forth in C2 can selectively be set in advance in a step of a fabrication process based on a kind of tunnel insulating film, kinds of gate and substrate and the like used in the tunnel element set forth in C1.

(Feature: C4)

The kind of the tunnel insulating film set forth in C3 is discriminated by a fabrication process, a material, a film thickness, a shape, a kind of impurity and its quantity, and kinds of the gate and the substrate set forth in C3 can be discriminated by the kind of impurity, its quantity, a fabrication process or the like.

(Feature: C5)

The read only memory device set forth in C1 has a feature that the device is a binary read only memory device utilizing whether an output current quantity set forth in C2 is finite or so small e as can be neglected as outputs of 0 or 1. The device can be used as a multiple-valued (three or more-valued) read only memory device, which uses the current quantity itself as an output, and with which the device can realize a multiple-valued output.

[Action and Effect of the Aspect C of the Present Invention]

The aspect C has merits that since a BL tunnel element is used, a read only memory device using a quantum effect element can be realized, an exclusively used area for one cell is small, it is unnecessary to fabricate a source and drain, and the device can be operable with a low electric field and is advantageous in multiple-valued application.

[A Constitution of an Aspect D of the Present Invention]

(Feature: D1)

The aspect D is directed to a dynamic random access memory device, which has a feature that it does not use a MOS transistor and require no diffusion layer in each cell and is constituted of a switching device using a BL tunnel element instead of a switching device using a MOS transistor.

(Feature: D2)

The dynamic random access memory device set forth in D1 has a feature that a switch input to a word line is an alternating input to the BL tunnel element set forth in D1, a threshold vibration frequency of the tunnel element is present as a threshold value for a vibration frequency of an input signal of the dynamic random access memory device and an output of the dynamic random access memory device is controlled as an exponential function of the vibration frequency and the threshold value.

(Feature: D3)

A feature is that the threshold value set forth in D2 is selectively set in advance in a step of a fabrication process by a kind of a tunnel insulating film or kinds of gate, substrate and the like used on the tunnel element set forth in D1.

(Feature: D4)

A feature is that a kind of the tunnel insulating film set forth in D3 is discriminated by a fabrication process, a material, a film thickness, a shape, a kind of impurity and its quantity, and kinds of gate and substrate set forth in D3 are discriminated by a kind of impurity, its quantity, a fabrication process or the like.

(Feature: D5)

A feature is that BL tunnel elements set forth in D1 have two kinds of two-terminal and three-terminal types and wordlines which are independently controlled are respectively connected to the two kinds of BL tunnel devices and the two kinds of BL transistors are used in one cell constituting the dynamic random access memory device set forth in D1 at the same time.

(Feature: D6)

A feature is that the dynamic random access memory device is constituted of a three-terminal BL tunnel element set forth in D1 only.

[Action and Effect of the Aspect D of the Present Invention]

Since a BL tunnel element is used, a dynamic random access memory device using a quantum effect element can be realized. Besides, the device has advantages that an exclusively used area for one cell is small, it is unnecessary to fabricate a source/drain and the device is operable at a low electric field and the like. Furthermore, the device can be formed in a layer stacked on an integrated circuit fabricated on a silicon substrate.

[A Constitution of an Aspect E of the Present Invention]

(Feature: E1)

The aspect E has a feature that a non-volatile memory device is constituted of a switching device using a BL tunnel element instead of a switching device using a MOS transistor.

(Feature: E2)

The non-volatile memory device set forth in E1 has a feature that a switch input to a wordline is an alternating input to the tunnel element set forth in E1, a threshold vibration frequency of the tunnel element is present as a threshold value for a vibration frequency of an input signal of the non-volatile memory device and an output of the non-volatile memory device can be controlled as an exponential function of the vibration frequency and the threshold value.

(Feature: E3)

A feature is that the threshold value set froth in E2 can selectively set in advance in a step of a fabrication process by a kind of a tunnel film or kinds of gate and substrate and the like used in the tunnel element set forth in E1.

(Feature: E4)

A feature is that a kind of the tunnel film set forth in E3 is discriminated by a fabrication process, a material, a film thickness, a shape, a kind of impurity and its quantity and kinds of gate and substrate set forth in E3 are discriminated by a kind of impurity, its quantity, a fabrication process or the like.

(Feature: E5)

A feature is that the switching device used in the non volatile memory device set forth in E1 utilizes whether an output current quantity is finite or so small as can be neglected as outputs of 0 or 1.

[Action and Effect of the Aspect E of the Present Invention]

Since a BL tunnel element is used, a non-volatile memory device using a quantum effect element can be realized. Moreover, since the device can be operable at a low electric field, a problem of reliability of a tunnel film can thoroughly be avoided.

[A Constitution of an Aspect F of the Present Invention]

(Feature: F1)

The aspect F has a feature that an analogue/digital conversion device is constituted by converting an analogue input which is a combination of a direct current component and an alternating component to a digital quantity consisting of 0 or 1.

(Feature: F2)

A feature is that the analogue/digital conversion device set forth in F1 has a characteristic threshold value for an input frequency and is constituted by use of a switching device comprising a BL tunnel element which can flow a direct current when the input frequency is larger than the threshold value.

(Feature: F3)

A feature is that a length of a numeral sequence consisting of 0 or 1 set forth in F1 is determined by the number of switching devices set forth in F2.

(Feature: F4)

A feature is that the switching device set forth in F2 has a tunnel film, the threshold value set forth in F2 is adjustable according to a kind of the tunnel film and the threshold value can be controlled by the direct current component set forth in F1.

(Feature: F5)

A feature is that a kind of the tunnel film set forth in F4 is discriminated by a film thickness, a material quality, a concentration of impurity and its kind, and the like.

(Feature: F6)

A feature is that in the analogue/digital conversion device set forth in F1, plural switching devices set forth in F2 are used for one word, and the length of a numeral sequence for one word set forth in F1 is determined by the number of the plural switching devices.

(Feature: F7)

A feature is that in the analogue/digital conversion device set forth in F1, alternating current components of inputs of the switching devices set forth in F2 are in parallel connected, which is in the same way as the case of inputs of an analogue/digital conversion device.

(Feature: F8)

A feature is that in the analogue/digital conversion device set forth in F1, a direct current component of an input applied to each switching device within one word can be applied to each switching device independently of the other switching devices.

(Feature: F9)

A feature is that the numeral 0 or 1 set forth in F1 is decided to be taken based on whether a direct current has flown or not in the dataline

[Action and Effect of the Aspect F of the Present Invention]

Since a BL tunnel element is used, an analogue/digital conversion device using a quantum effect can be realized. Besides, it is easier for the device to be in a layered manner formed on an integrated circuit formed on a silicon substrate.

[A Constitution of an Aspect G of the Present Invention]

(Feature: G1)

The aspect has a feature that a frequency counter device is constituted which expresses an output by a numerical sequence consisting of 0 or 1 for an input having a frequency, no matter whether the frequency is analogue or digital.

(Feature: G2)

A feature is that the frequency counter device set forth in G1 has a characteristic threshold value for an input frequency set forth in G1 and uses a switching device comprising a BL tunnel element which makes a direct current flow when the input frequency is larger than the threshold value.

(Feature: G3)

A feature is that a length of a numeral sequence consisting of 0 or 1 set forth in G1 is determined by the number of switching devices set forth in G2.

(Feature: G4)

A feature is that the switching device set forth in G2 has a tunnel film and the threshold value set forth in G2 is adjustable by a kind of the tunnel film.

(Feature: G5)

A feature is that the kind of the tunnel film set forth in F4 is discriminated by a film thickness, a quality of material, a concentration of impurity, its kind and the like.

(Feature: G6)

A feature is that the frequency counter device set forth in G1 comprises plural switching devices set forth in G2 and any two of the switching devices do not have the same threshold values.

(Feature: G7)

A feature is that in the frequency counter device set forth in G1, inputs of plural switching devices set forth in G2 are in parallel connected, which is the same as the input of the frequency counter device.

(Feature: G8)

A feature is that the switching device set forth in G2 is used as a high pass filter device.

[Action and Effect of the Aspect G of the Present Invention]

Since a BL element is used, a frequency counter device for a digital output using a quantum effect can be realized.

[A Constitution of an Aspect H of the Present Invention]

(Feature: H1)

The aspect H is directed to a read only memory device using a MOS type BL tunnel element and a feature is that a gate length of the MOS type BL tunnel element may be longer or shorter as compared with a channel length and the element is operable in a condition that an inversion layer is not produced in a channel region. A current flowing in the channel region is a BL tunnel current by BL tunneling and the BL tunnel current is operable by an alternating current applied to the gate.

(Feature: H2)

A feature is that in the read only memory device set forth in H1, a switching input to a word line is an alternating input to the MOS type BL tunnel element set forth in H1, a threshold vibration frequency of the MOS type BL tunnel element is present as a threshold value for a vibration frequency of an input signal of the read only memory device and an output current quantity of the read only memory device can be controlled as an exponential function of the vibration frequency and the threshold value.

(Feature: H3)

A feature is that the threshold value set forth in H2 is selectively set in advance in a step of a fabrication process by a kind of an insulating film, a gate length, a channel length, kinds of gate and substrate and the like used in the MOS type BL tunnel element set forth in H1.

(Feature: H4)

A feature is that a kind of the insulating film set forth in H3 can be discriminated by a fabrication process, material, a film thickness, a shape, a kind of impurity and its quantity, and kinds of gate and substrate set forth in H3 can be discriminated by a kind of impurity and its quantity, a fabrication process and the like.

(Feature: H5)

A feature is that the read only memory device set forth in H1 is a binary read only memory device utilizing whether an output current quantity set forth in H2 is finite or so small as can be neglected as outputs of 0 or 1. The device can be used as a read only memory device, which uses the current quantity itself as an output, and which can realize a multiple-valued (three or more-valued) output.

[Action and Effect of the Aspect H of the Present Invention]

Since a MOS type BL tunnel element is used, a read only memory device using a quantum effect element can be realized. Besides, since an inversion layer is not used, the device can be operable in a low electric field and a margin in reliability of an insulating film arises. Moreover, since a current quantity can be adjusted in a manner of an exponential function, the device has an advantage in use as a multiple-valued device.

[A Constitution of an Aspect I of the Present Invention]

(Feature: I1)

The aspect I is directed to a dynamical random access memory device using a MOS type BL tunnel element, and a feature is that a gate length of the MOS type BL tunnel element may be longer or shorter as compared with a channel length, and that the element is operable in a condition that an inversion layer is not produced in a channel region. A current flowing in the channel region is a BL tunnel current by BL tunneling and the BL tunnel current is operable by an alternating voltage applied to the gate.

(Feature: I2)

A feature is that in the dynamical random access memory device set forth in I1, a switch input to a word line is an alternating input to the MOS type BL transistor set forth in I1, a threshold vibration frequency of the tunnel element is present as a threshold value for a vibration frequency of an input signal of the dynamical random access memory device and an output of the dynamical random memory device is controlled as an exponential function of the vibration frequency and the threshold value.

(Feature: I3)

A feature is that the threshold value set forth in I2 is selectively set in advance in a step of a fabrication process by a kind of an insulating film, a gate length, a channel length, kinds of gate and substrate and the like used in the MOS type BL tunnel element set forth in I1.

(Feature: I4)

A feature is that a kind of the insulating film set forth in I3 can be discriminated by a fabrication process, material, a film thickness, a shape, a kind of impurity and its quantity and kinds of gate and substrate set forth in I3 can be discriminated by a shape, a kind of impurity, its quantity, a fabrication process or the like.

(Feature: I5)

A feature is that the MOS type BL tunnel element set forth in I1 is a three-terminal element comprising a source and drain made of $n^+$ diffused regions formed in the substrate, and a gate applied with an alternating current voltage which is an input from the wordline set forth in I2, and the source and drain are respectively connected to a ground line or a data line with a capacitor lying therebetween.

[Action and Effect of the Aspect I of the Present Invention]

Since a MOS type BL tunnel element is used, a dynamical random access memory device using a quantum effect element can be realized. Besides, since an inversion layer is not used, the memory device can be operable in a low electric field and a margin in reliability of an insulating film arises.

[A Constitution of an Aspect J of the Present Invention]

(Feature: J1)

The aspect J has a feature i s that an analogue/digital conversion device is constituted which outputs an digital quantity after an analogue input which is a combination of a direct current component and an alternating component is converted to the digital quantity consisting of 0 or 1.

(Feature: J2)

A feature is that the analogue/digital conversion device set forth in J1 has a characteristic threshold value for a vibration frequency of an input alternating current voltage and uses a MOS type BL tunnel element as a switching device in which element a direct current flows between diffused layers when an input vibration frequency is larger than the threshold value.

(Feature: J3)

A feature is that in the analogue/digital conversion device set forth in J1, a length of a numeral sequence consisting of 0 or 1 set forth in J1 is determined by the number of MOS type BL tunnel elements set forth in J2.

(Feature: J4)

A feature is that in the analogue/digital conversion device set forth in J1, the threshold value set forth in J2 is set in advance in a step of a fabrication process by adjusting an internal variable of the MOS type BL tunnel element set forth in J3 or it can be set by adjusting a direct current voltage of an input set forth in J1 while the tunnel element is in operation.

(Feature: J5)

A feature is that the internal variable of the MOS type BL tunnel element set forth in J4 is: a kind or a concentration of impurity in diffused layers; a kind or a concentration of impurity in a channel region; a material quality or a thickness of an insulating film; a kind or a concentration of impurity in the insulating film; a material of, or a kind or a concentration of impurity of a gate electrode; or the like.

(Feature: J6)

A feature is that in the analogue/digital conversion device set forth in J1, the direct current input voltage set forth in J1 is controlled by use of a data line control device, the alternating input voltage set forth in J1 is controlled by use of a wordline control device, the wordline is connected to the gate of the MOS type BL tunnel element set forth in J2 and the data line is connected to a diffused layer of the MOS type BL tunnel element set forth in J2.

(Feature: J7)

A feature is that in the analogue/digital conversion device set forth in J1, plural switching devices set forth in J2 are used for one word and a length of a numeral sequence of one word set forth in J1 is determined by the number of the plural switching devices.

(Feature: J8)

A feature is that in the analogue/digital conversion device set forth in J1, an alternating current component of an input of the switching device set forth in J2 is in parallel connected, which is in the same way as the case of an input of an analogue/digital conversion device.

(Feature: J9)

A feature is that in the analogue/digital conversion device set forth in J1, the direct current component of an input applied to each switching device within one word can be applied to each switching device independently of the other switching devices by use of the data line control device set forth in J6.

(Feature: J10)

A feature is that in the analogue/digital conversion device set forth in J1, the numeral 0 or 1 set forth in J1 is decided to be taken based on whether a direct current has flown or not in the dataline.

[Action and Effect of the Aspect J of the Present Invention]

Since a MOS type BL tunnel element is used, an analog/digital conversion device using a quantum effect can be realized.

[A Constitution of an Aspect K of the Present Invention]

(Feature: K1)

The aspect K has a feature that a frequency counter device is constituted which expresses an output as a numerical sequence consisting of 0 or 1 for an input having a frequency, no matter whether the frequency is analogue or digital.

(Feature: K2)

A feature is that the frequency counter device set forth in K1 has a characteristic threshold value for an input frequency and uses as a switching device a MOS type BL tunnel element which flows a direct current when the input frequency is larger than the threshold value.

(Feature: K3)

A feature is that in the frequency counter device set forth in K1, the length of a numeral sequence consisting of 0 or 1 set forth in G1 is determined by the number of switching devices set forth in K2.

(Feature: K4)

A feature is that in the frequency counter device set forth in K1, the threshold value set forth in K2 is a threshold vibration frequency of the MOS type BL tunnel element set forth in K2 and the threshold vibration frequency can be set in advance in a step of a fabrication process by an internal variable of the MOS type BL tunnel element.

(Feature: K5)

A feature is that the internal variable of the MOS type BL tunnel element set forth in K4 is: a kind or a concentration of impurity in a diffused layer; a kind or a concentration of impurity in a channel region; a material quality or a thickness of an insulating film; a kind or a concentration of impurity in the insulating film; a material of, or a kind or a concentration of impurity of a gate electrode, or the like.

(Feature: K6)

A feature is that the frequency counter device set forth in K1 comprises plural switching devices set forth in K2 and any two of switching devices do not have the same threshold values.

(Feature: K7)

A feature is that in the frequency counter device set forth in K1, inputs of plural switching devices set forth in K2 are in parallel connected, which is the same as the case of inputs of the frequency counter device.

(Feature: K8)

A high pass filter device may be constituted by use of the switching device set forth in K2.

[Action and Effect of the Aspect K of the Present Invention]

Since a BL element is used, a frequency counter device and a high pass filter for a digital output using a quantum effect can be realized.

[A Constitution of an Aspect L of the Present Invention]

(Feature: L1)

The aspect L has a feature that a super high frequency oscillating device and an optical signal/electric signal conversion device are constituted by used of a photon type quantum exchange switching device.

(Feature: L2)

A feature is that the photon type quantum exchange switching device set forth in L1 increases a tunnel current exponentially by a tunneling electrons absorbing a photon released from light passing through a light waveguide while a very small current by direct tunneling is made to flow in such a manner that the current traverses the light wave guide.

(Feature: L3)

A feature is that the super high frequency oscillating device and the optical signal/electric signal conversion device set forth in L1 comprise plural photon type quantum exchange switching device set forth in L2 in parallel arranged to one light waveguide, and outputs an output current which is the sum of tunnel currents from the respective switching devices.

(Feature: L4)

A feature is that in the super high frequency oscillating device and the optical signal/electric signal conversion device set forth in L1, a wave form of an output current can be adjusted by adjusting a velocity of light propagating through the guide, a distance between cells, a shape of an electrode of each cell, a sign and magnitude of a voltage applied to each cell to directly make a tunnel current flow, and the like.

(Feature: L5)

A feature is that in the super high frequency oscillating device and the optical signal/electric signal conversion device set forth in L1, a time required for light to pass through between cells is larger as compared with a time required for an increased current in each cell to be recognized as an output.

(Feature: L6)

A feature is that the optical signal/electric signal conversion device set forth in L1 is to make sequence of time intervals in continuous release of light correspond to a wave form of a tunnel current as an output, the wave form comprises peaks having several kinds of magnitude corresponding to the sequence and the peaks of different magnitudes are present in the wave form in the number corresponding to the sequence.

[Action and Effect of the Aspect L of the Present Invention]

Since a photon type quantum exchange switching device whose operational principle is energy quantum absorption of a tunneling electron is used, a super high frequency oscillating device and an optical signal/electric signal conversion device can be realized.

[A Constitution of an Aspect M of the Present Invention]

(Feature: M1)

The aspect M is directed to a semiconductor composite substrate having plural kinds of semiconductor region which are respectively different from each other or one another in material, surface orientation, molecular structure and the like, and the semiconductor regions are formed on one wafer and separated by a substrate isolation region.

(Feature: M2)

A feature is that in the semiconductor composite substrate set forth in M1, semiconductor devices which have functions respectively suitable for the semiconductor regions in regard to material or the like are integrated in the respective semiconductor regions.

(Feature: M3)

A feature is that more than two or more kinds of semiconductor region set forth in M1 provided in semiconductor composite chips cut out from the semiconductor composite substrate set forth in M1 and semiconductor devices suitable for the materials of semiconductor regions in a chip is respectively integrated in the semiconductor regions.

(Feature: M4)

A feature is that in the semiconductor composite chips set forth in M3, semiconductor devices which respectively achieve advantages by characteristics of semiconductor materials used in semiconductor regions are respectively fabricated in the semiconductor regions and semiconductor devices respectively fabricated in semiconductor regions are associated with each other or one another through a connection device on a semiconductor composite chip or provided in the outside and thus a highly functional integrated circuit which operates in the whole semiconductor composite chip as one chip can be fabricated.

(Feature: M5)

A feature is that when the semiconductor composite substrate set forth in M1 comprises silicon, GaAs and a substrate isolation region, a semiconductor device which is advantageously made by GaAs, such as a high frequency device, an optical device and the like are fabricated in a GaAs region, a semiconductor device which is advantageously made by silicon, such as a memory device, a logic device and the like are fabricated in a silicon region, signals between both regions are sent or received through a connection device set forth in M4 and functions of both regions are controlled in an integrated manner, whereby a highly functional integrated circuit is realized in the whole of the semiconductor composite chip set forth in M3.

(Feature: M6)

A feature is that a functional device using a BL tunnel element is formed on the silicon substrate set forth in M5, when a high frequency of about 10 GHz or higher is required as an input of the BL tunnel element, a high frequency functional device set forth in M5 for functionally controlling high frequency is fabricated on a GaAs substrate, signals between functional devices on both substrates are sent or received through the connection device set in M4 and both functions are integrally controlled, whereby a highly functional integrated circuit is realized in the whole of the semiconductor composite chip as one semiconductor device.

[Action and Effect of the Aspect M of the Present Invention]

Since a semiconductor composite substrate is used, plural kinds of semiconductor materials which are respectively different from each other or one another in characteristics can be used in one chip and thereby a high functionality integrated circuit can be realized. Besides, in the case where a composite substrate comprising silicon and GaAs, a high frequency device, an optical device and the like are fabricated in a GaAs region and a memory device, a logic device and the like are fabricated in a silicon region and a high functionality integrated circuit can thus be attained by association between both devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 28 is a sectional view of a structure of a cell of a fourth embodiment of a read only memory device according to the aspect C of the present invention;

FIG. 29 is a band diagram of a two-terminal BL tunnel element according to the aspect D of the present invention;

FIG. 30 is a diagram showing a two-terminal BL tunnel element as a circuit according to the aspect D of the present invention;

FIG. 31 is a band diagram of a three-terminal NAND type BL tunnel element according to the aspect D of the present invention;

FIG. 32 is a diagram showing a three-terminal BL tunnel element as a circuit according to the aspect D of the present invention;

DETAILED DESCRIPTION OF THE INVENTION

Figure 108:
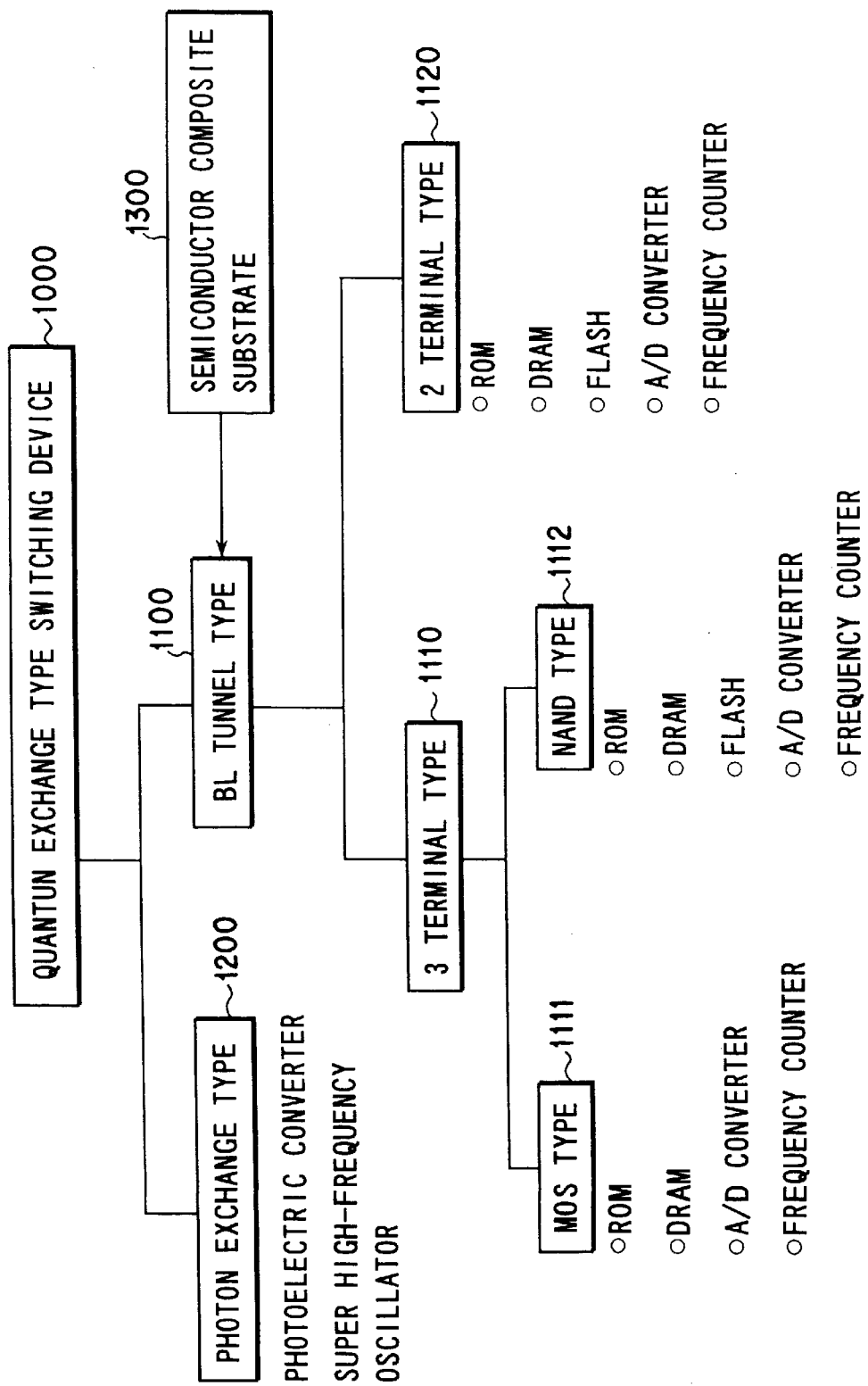
FIG. 108 is a diagram showing an overall structure of the present invention.

Embodiments of the aspect A to M of the present invention will be described below. First of all, the general structure of the aspect A to M is explained using a tree of FIG. 108. The aspect A relates to Quantum Exchange Type Switching Device 1000. The aspects B, C, D, E, F, G, and K relates to BL Tunnel Type Device 1100, the aspects H, I and J to MOS Type BL Tunnel Device 1111, the aspect L to Photon Exchange Type Device 1200, and the aspect M to Semiconductor Composite Substrate 1300. The BL Tunnel Type Device 1100 includes Three Terminal Type Device 1110 and Two Terminal Type Device 1120. The Three Terminal Type Device includes MOS Type Device 1111 and NAND Type Device 1112.

[Embodiment of the Aspect A of the Present Invention]

A fundamental constitution of the aspect A of the present invention will first described.

The aspect A is directed to an absolutely new type of a quantum switching element using a quantum exchange Effect in order to realize a super fine switching element used in a semiconductor device or the like. As element materials, while the element can be constituted by use of compound semiconductor, materials which are currently used in the semiconductor industry are sufficient for production of the element and minimum requirements are a silicon substrate, a silicon oxide film, polysilicon, materials for an electrode, impurities such as arsenic, bromine, phosphorus. An oscillating circuit to produce an input signal is used together in order to directly operate switching. As desired embodiments, the following examples will be shown.

A thin film made of a material which has a high electric insulating property and a good optical transmittance is used as a tunnel film, both ends of the thin film is fast held by electrodes which are electrically independent of each other and a low electric field is applied. The tunnel film is directly connected to a light control device and light produced by the device exchanges a photon for a tunneling electron passing between the electrodes in the bulk of the tunnel film. At this point, a tunneling electron which has absorbed a photon from light increases a tunneling probability exponentially and an increased current is resulted to flow. In such a manner, a quantity of a tunnel current is controlled by light, which can be used as a switching device, a photo-electric conversion device or a super high frequency oscillating device.

If light (a stream of photons $h\omega$ ($h\omega=h\nu$)) passing through the tunnel film, or energy excitation caused by a high frequency vibration of a tunnel barrier itself ($h\omega$: a quantum corresponding to the vibration at a vibration frequency $\omega$) is absorbed by a tunneling electron as a quantum, the tunnel current is increased exponentially. When such a quantum is absorbed, the tunnel current increases by a factor of exp $[2\omega/\omega_o]$ according to the following equation:

$$\omega_O = \sqrt{\frac{2}{m}} \left[ \int_0^{T_{ox}} \frac{dx}{\sqrt{U(x)-E}} \right]^{-1} \quad (1)$$

where m is an effective mass, $T_{ox}$ is a tunnel film thickness, $U(x)$ is a potential of the tunnel film and E is energy which a tunneling electron has at x=0 before it enters the tunnel film.

The above mentioned quantum may be any kind other than light and energy excitation, which have been described above, as far as it can be absorbed by a tunneling electron.

Embodiments of the aspect A of the present invention will be described in reference to the accompanying drawings below.

Figure 1:
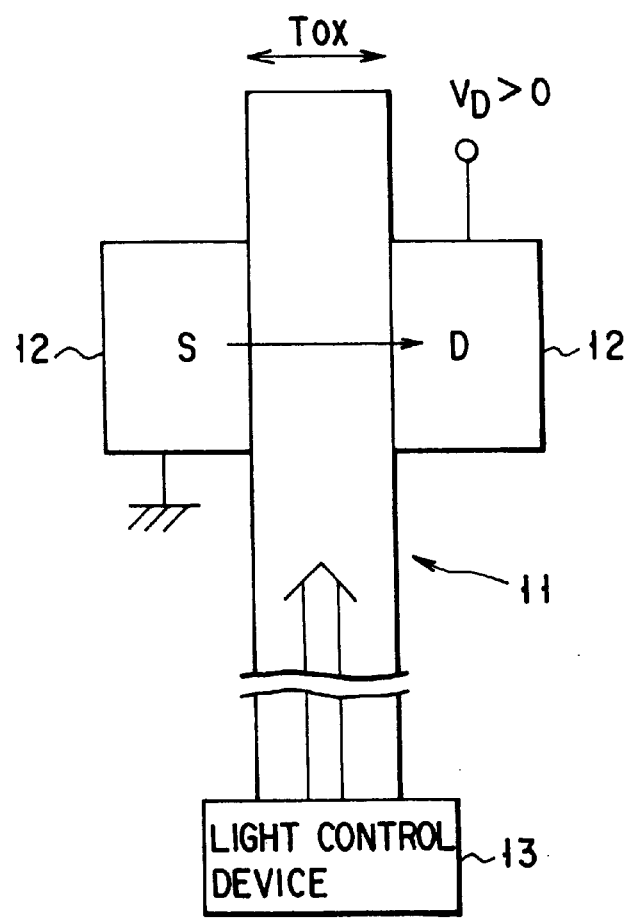
FIG. 1 is a diagram showing a constitution of a light illumination type quantum switching device according to the aspect A of the present invention.
Figure 2:
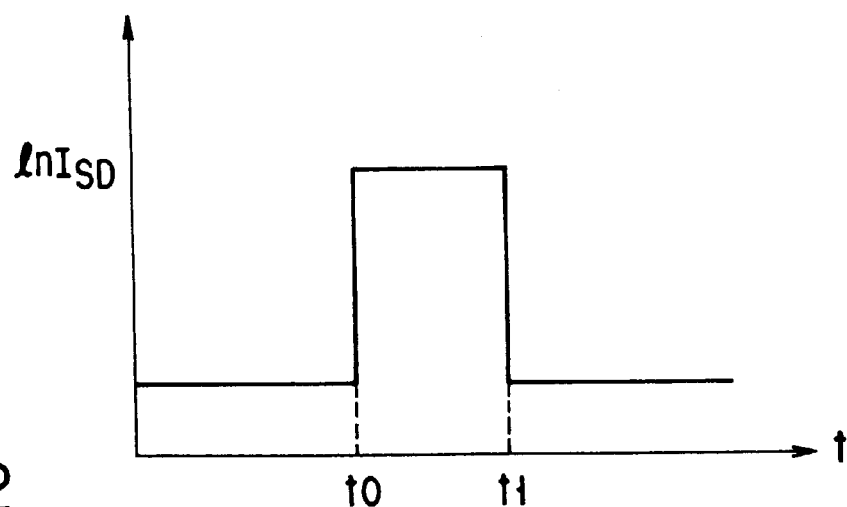
FIG. 2 is a graph showing electric characteristics of a light illumination type quantum switching device according to the aspect A of the present invention.

First, a first embodiment will be described. In FIG. 1, an example in the case where a tunneling electron absorbs a photon is shown. In the example, a thin film 11 (tunnel film) is fast held by two electrodes 12 and fabricated with a material having a high optical transmittance and a high insulating property (quartz glass, soda lime glass, borosilicate glass, flint glass, organic glass and the like) so that a refractive index thereof is smaller on the electrode sides and connected to a light control device 13. A lower voltage (enough at 1V or lower) is applied in advance between the two electrodes 12, which are to be a source and drain (S·D) and when light is irradiated on a tunnel electron from the light control device 13, a tunneling probability is increased exponentially, so that a tunnel current flows between the source and drain. In FIG. 2, a current flowing between a source and drain when light is irradiated from time $t_0$ to $t_1$ is shown.

Figure 3:
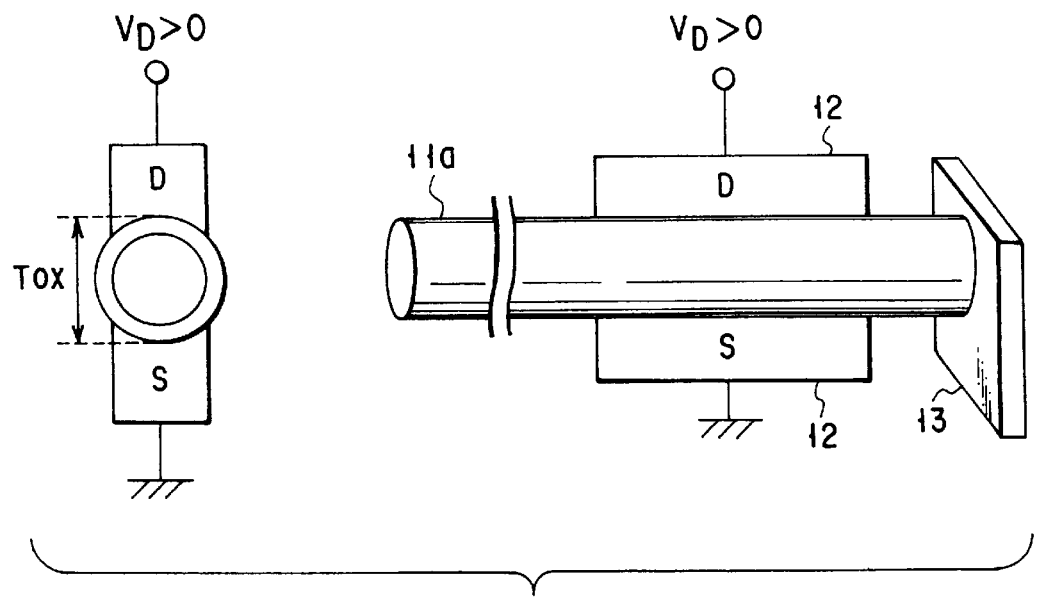
FIG. 3 is a diagram showing a quantum switching device using one optical fiber according to the aspect A of the present invention.
Figure 4:
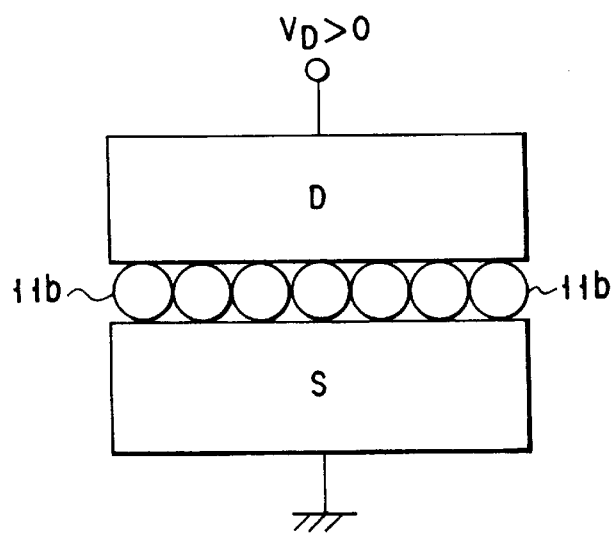
FIG. 4 is a diagram showing a quantum switching device using plural optical fibers according to the aspect A of the present invention.

The second embodiment will be described. In FIGS. 3 and others, examples of structure are shown, and an optical fiber 11a is used instead of the tunnel film which has been shown in the first embodiment. A refractive index in the vicinity of the outer periphery of the optical fiber 11a is designed to be smaller than that in the interior. As shown in FIG. 3, a single optical fiber is enough, but plural optical fibers may be used in a bundled form, as is shown in FIG. 4.

[Embodiment of the Aspect B of the Present Invention]

A fundamental constitution of the aspect B of the present invention will first be described.

The aspect B is directed to a new type of quantum switching element utilizing a BL tunneling to realize a super fine switching element used in a semiconductor device or the like. As element materials, while the element can be constituted by use of compound semiconductor, materials which are currently used in the semiconductor industry are sufficient for production of the element and minimum requirements are a silicon substrate, a silicon oxide film, polysilicon, materials for an electrode, impurities such as arsenic, bromine, phosphorus. An oscillating circuit to produce an input signal is used together in order to directly operate switching. As desired embodiments, the following examples will be shown.

(a) An ordinary capacitor structure is provided and a voltage applied to two terminals is composed of an alternating current component and a direct current component and either of both can freely adjusted as an input and electrons passing through an insulating film of the capacitor by a BL tunnel effect is output as an output current.

(b) Two gates which are covered by an insulating film are provided on a silicon substrate, a total of three terminal are formed in combination of the two gates and the substrate, an input voltage is applied to a gate on the substrate side, an alternating current and direct current components are operated to adjust a current passing through an insulating film caused by a BL tunnel effect and the current is output as an output.

(c) A feature is that a structure similar to an ordinary n MOS transistor is given and especially a high impurity concentration diffused layer is used as a source/drain, and a potential barrier of several hundreds of meV of a channel region is used as a tunnel barrier. A high frequency alternating current voltage is applied to a gate and thereby electrons in the high impurity concentration diffused layer flows through the channel region by a BL tunnel effect and as a result a current is made to flow between the source and drain.

Figure 9:
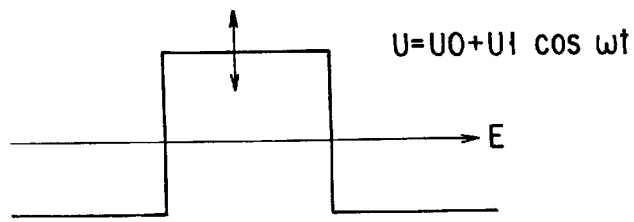
FIG. 9 is a diagram showing a principle of BL tunneling according to the aspect B of the present invention.

A BL tunnel effect arising when a potential barrier of an insulating film is periodically vibrated is utilized and thereby a switching device operable even in a very low electric field is realized. In FIG. 9, a principle of BL tunneling is shown. In the figure, a potential barrier satisfies the following equation:

$$U = U0 + U1 \cos \omega t$$

and periodically vibrates in conditions of a frequency of $(\omega/2\pi)$, and an amplitude of U1. In this case, when the following relation is met, which is:

$$U1 \ll \hbar\omega \ll U0-E$$

the following equation is further established $$I(\omega)/I(\omega=0) \propto \begin{cases} (U_1/2\hbar\omega)^2 e^{2\omega/\omega_O} & \omega > \omega_O > \omega_T \\ \left(\dfrac{U_1/\omega_O}{2\hbar}\right)^2 & \omega < \omega_T < \omega_O \end{cases} \quad (3)$$

and if $\omega$ is larger than a threshold vibration frequency $\omega_T$, a current flows by BL tunneling and if $\omega$ is smaller than the threshold vibration frequency $\omega_T$, the current does not flow.

Figure 10:
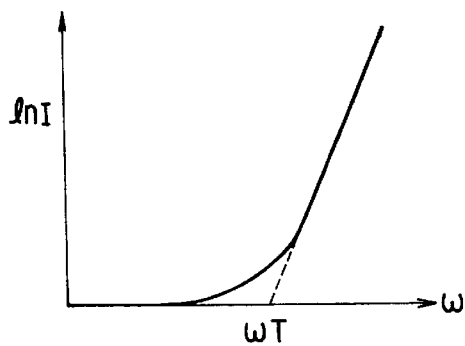
FIG. 10 is a graph showing current vs. ω characteristics of BL tunneling according to the aspect B of the present invention.
Figure 11:
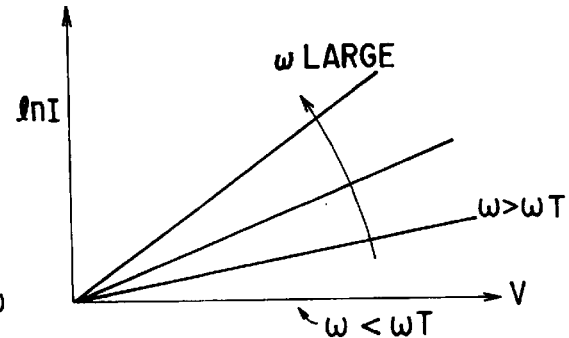
FIG. 11 is a graph showing current vs. voltage characteristics of BL tunneling according to the aspect B of the present invention.
Figure 12:
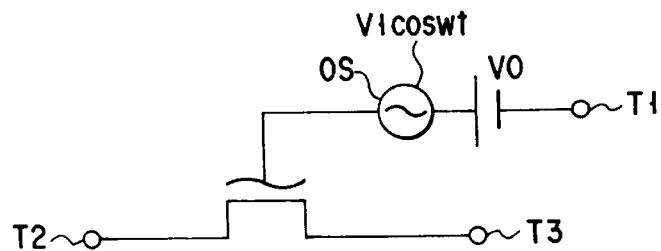
FIG. 12 is an equivalent circuit diagram showing a constitution of a three-terminal BL tunnel element according to the aspect B of the present invention.

Voltage vs. $\omega$ characteristics and current vs. voltage characteristics are respectively shown in FIGS. 10 and 11. In FIG. 10, a gradient is $2/\omega_o$. Circuit diagrams of a vibration frequency threshold type switching element (BL tunnel element) are respectively shown in FIGS. 12 and 13. States in which a BL tunnel element is conductive or not are controlled based on a vibration frequency from an oscillating device OS, wherein a state in which a current flows or the element is conductive is indicated by ON and a state in which a current does not flow or the element is not conductive is indicated by OFF. In either of both circuits, an input is an alternating current voltage, a relation of $\omega > \omega_T$ is used as ON and a relation of $\omega < \omega_T$ is used as OFF with the vibration frequency was a parameter. FIG. 12 corresponds to the case of the three-terminal element and in the case of ON, a current flows if a potential difference between terminals T2 and T3 is present, which assumes "1" but if a potential difference is not present, a current does not flow, which assumes "0." In the case of OFF, no current flows, no matter whether a potential difference is present or not, which assumes "0." FIG. 13 corresponds to the case of a two-terminal element and in the case of ON, a current flows with no reservation, which assumes "1" and in the case of OFF, no current flows, which assumes "0." In FIG. 13, if V is sufficiently small, a current flowing between terminals T1 and T2 is an alternating current with a vibration frequency $\omega$ and to the contrary, if V is large, a current is direct.

Embodiments of the aspect B of the present invention will be described in reference to the accompanying drawings.

A first embodiment (three-terminal NAND type BL tunnel element) will first be described.

Figure 14A:
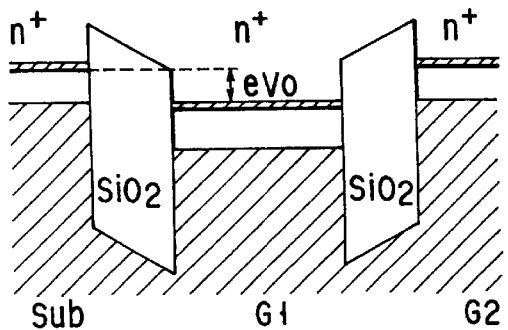
FIGS. 14A to 14C is a band diagram of a three-terminal BL tunnel element according to the aspect B of the present invention.
Figure 14B:
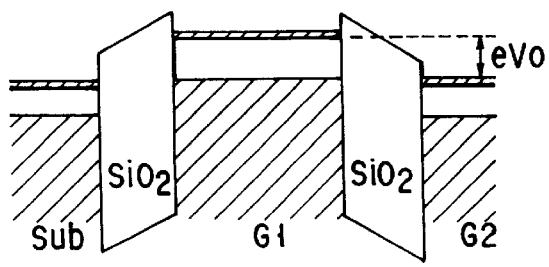
Figure 14C:
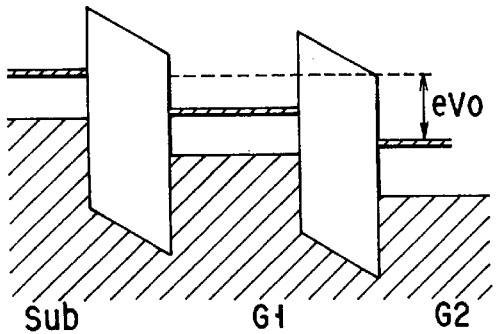
Figure 15:
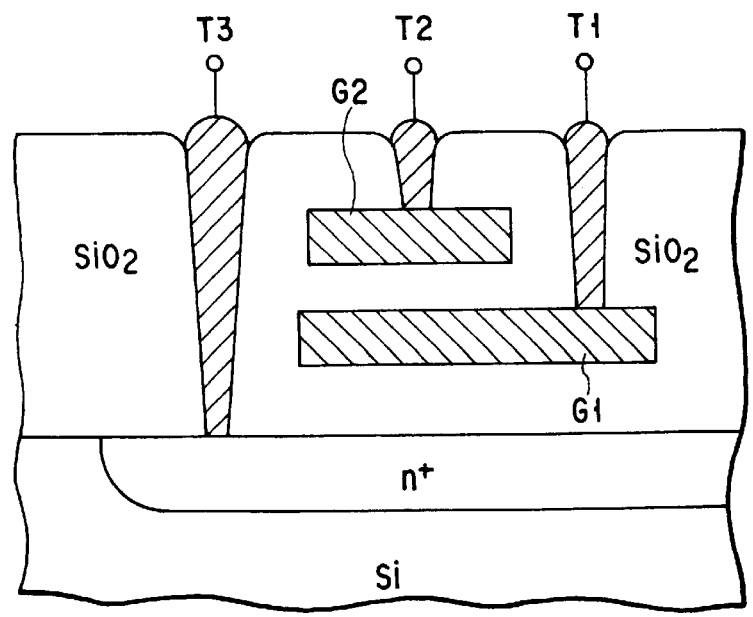
FIG. 15 is a sectional view of a cell of a three-terminal BL tunnel element according to the aspect B of the present invention.
Figure 16:
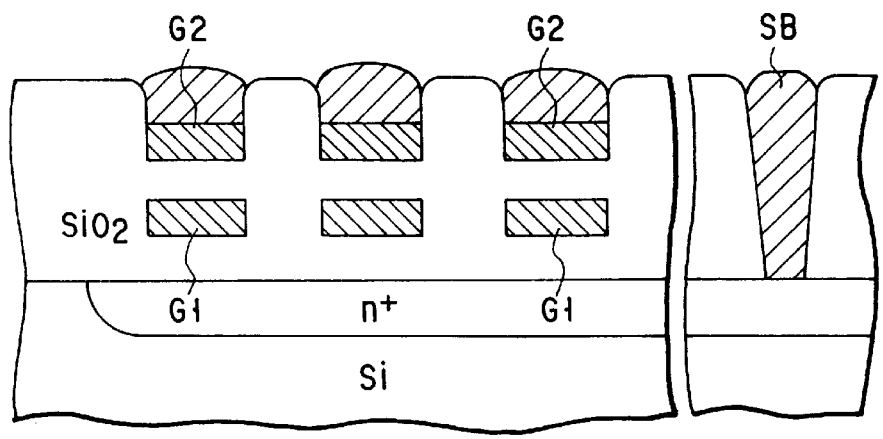
FIG. 16 is a sectional view of a cell of a three-terminal BL tunnel element according to the aspect B of the present invention.

A band structure of a BL tunnel element having three terminals is shown in FIG. 14 and sectional views of the element are shown in FIGS. 15 and 16. In FIGS. 14A to 14C, a gate G1 is selectively applied with a bias V0 in advance. If the gate G1 or a gate G2 is applied with V1 cos $\omega$t, a Fermi surface of the gate G1 vibrates in conditions of a frequency wand an amplitude eV1. The vibration affects a conduction band of an oxide film so as to be periodically shaken, BL tunneling is caused at $\omega > \omega_T$, in the cases of (a) and (b) a current flows between the substrate and the gate G1 or the gates G1 and G2 and in the case of (c) a current flows between the substrate and the gate G2.

In FIG. 15, an example of a cell to realize the band structure is shown. The gates G1 and G2 are independently provided with respective contacts and an alternating current voltage as an input signal is applied to the gate G1, which corresponds to FIGS. 14A and 14B. V0 is applied from T2, which corresponds to FIGS. 14A to 14C.

In FIG. 16, a second example of a cell in which the band structure is realized is shown. In the example, a gate G1 is, in advance, patterned as a fine wire which extends in a direction perpendicular to the sheet surface on which the figure is shown, and the wire is used as an interconnect without any additional processing. A gate G2 is made of polysilicon which is an underlayer of a contact. In this method, an area exclusively occupied by one cell is determined by an area required for the contact and a source and drain are not included, whereby such a structure is suitable for a higher integration. While it is not problematic that a substrate contact SB is fabricated on a upper surface of a substrate as shown in the figure, the contact can be provided on a lower surface thereof.

Figure 17:
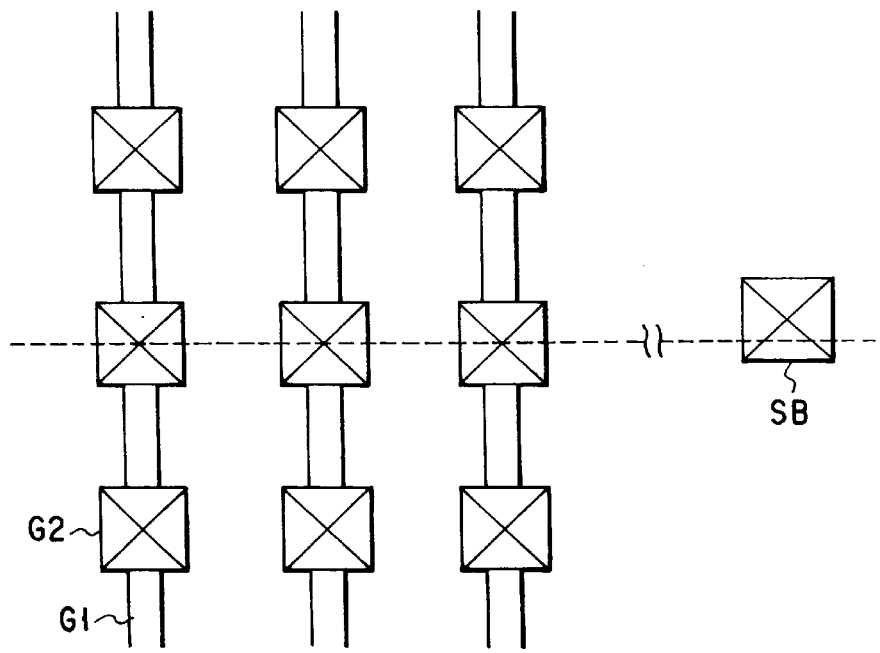
FIG. 17 is a plan view of cells corresponding to a constitution of FIG. 16 according to the aspect B of the present invention.

In FIG. 17, a view of cells as seen from above the cells is shown. The sectional view shown in FIG. 16 is that taken along a dotted line in FIG. 17. It is known that in such a structure, $\omega_T$ is proportional to a reciprocal number of a value of the following expression:

$$\sqrt{\frac{m}{2}} \cdot \int_0^{T_{ox}} \frac{dx}{\sqrt{3.1[eV] - (e|V_0| \pm U_{FB})x/T_{ox}}} \quad (4)$$

$U_{FB}$ is a flat band potential and signs±attached before that is selected so that in the case where V0=0, a plus sign is used if a barrier on the cathode side is higher, whereas a minus sign is used if the barrier is lower. In addition, x is a distance from a boundary on the cathode side, $T_{ox}$ is a thickness of a tunnel insulating film, e is an elementary charge of an electron, m is an effective mass of a tunneling electron. The $\omega_T$ can be adjusted by V0, but it is selectively set in advance by a film thickness, a height of a barrier and a material quality of an insulating film, and among others, kinds of a gate and a substrate, an effective mass of a tunneling electron and the like as well.

A second embodiment (a BL tunnel element having a two terminal structure) will be described.

Figure 13:
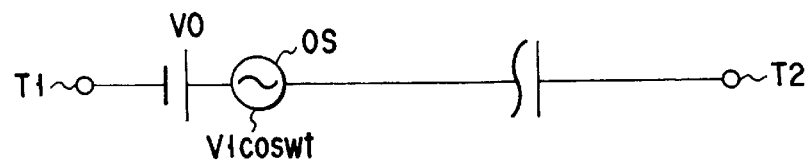
FIG. 13 is an equivalent circuit diagram showing a constitution of a two-terminal BL tunnel element according to the aspect B of the present invention.
Figure 18:
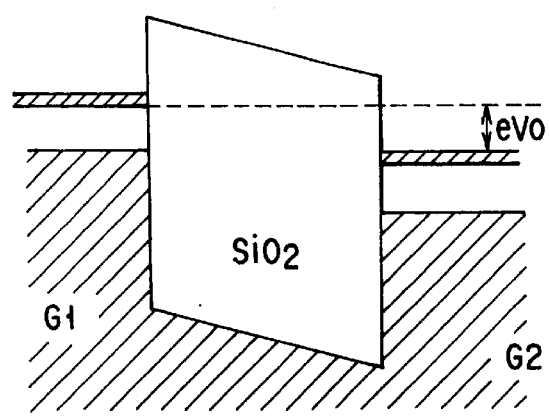
FIG. 18 is a band diagram of a two-terminal BL tunnel element according to the aspect B of the present invention.
Figure 19:
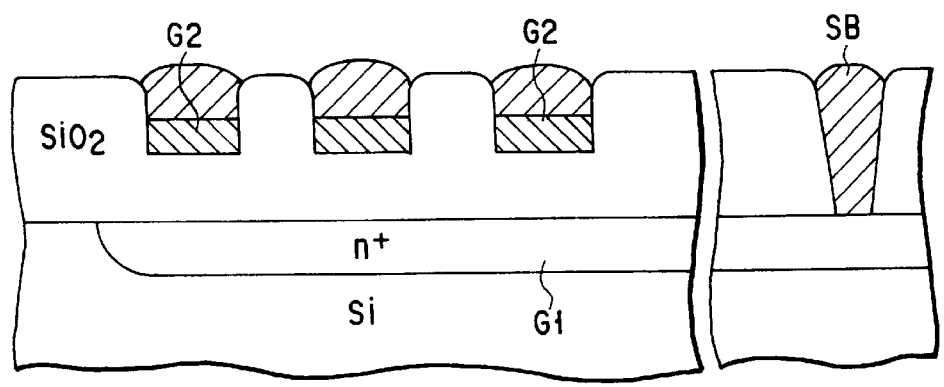
FIG. 19 is a sectional view of a cell of a two-terminal BL tunnel element according to the aspect B of the present invention.
Figure 20:
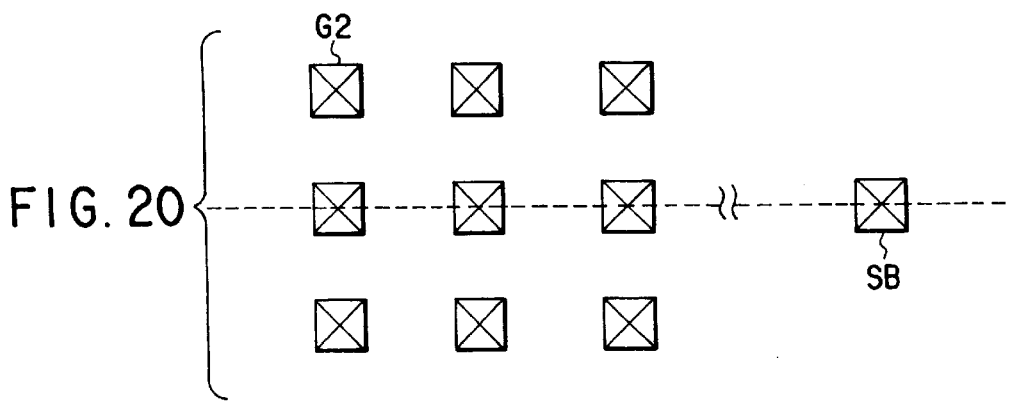
FIG. 20 is a plan view of cells corresponding to a constitution of FIG. 19 according to the aspect B of the present invention.

A band diagram of a BL tunnel element having a two terminal structure is shown in FIG. 18. A voltage V0 is applied in advance and an alternating current voltage V1 cos ωt as shown in FIG. 13 is applied in addition to the voltage V0. Definitions of V0, V1, ω and $\omega_T$ are the same as those as described above (the first embodiment) and an operation is similar to that as described above. A substrate and the like may be used as a gate G1 or a gate G2 and a structure of an element itself is similar to conventional capacitor. In FIG. 19, an example of a sectional view of a cell structure is shown. In the example, an area occupied by one unit cell is determined by that of a gate contact. A substrate contact SB can be provided on a lower surface of a substrate. FIG. 20 is a view of cells each of which corresponds to the sectional view of FIG. 19 as seen from above the cells and a sectional view taken along a dotted line corresponds to that of FIG. 19.

Figure 5:
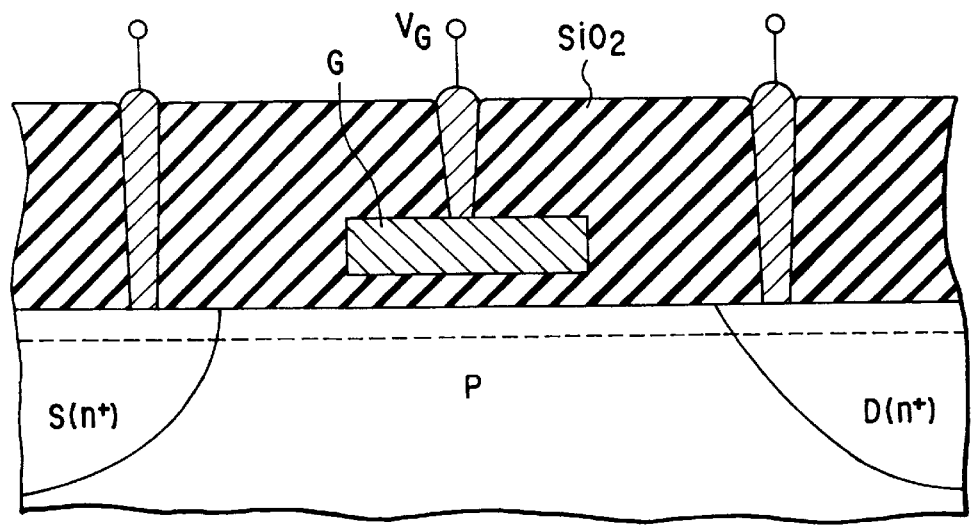
FIG. 5 is a diagram showing a structure in section of a MOS type BL tunnel element according to the aspect B of the present invention.
Figure 6:
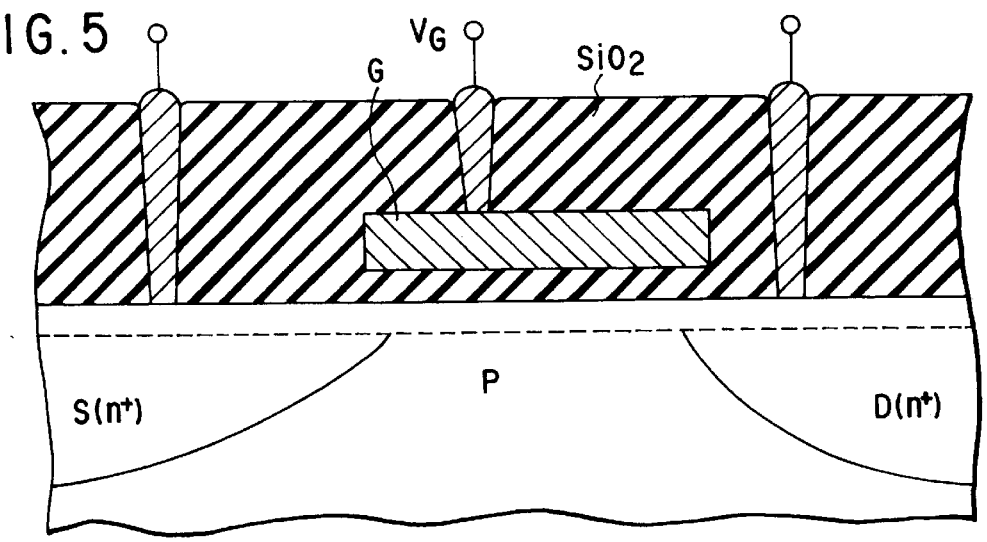
FIG. 6 is a diagram showing a structure in section of a MOS type BL tunnel element according to the aspect B of the present invention.
Figure 7:
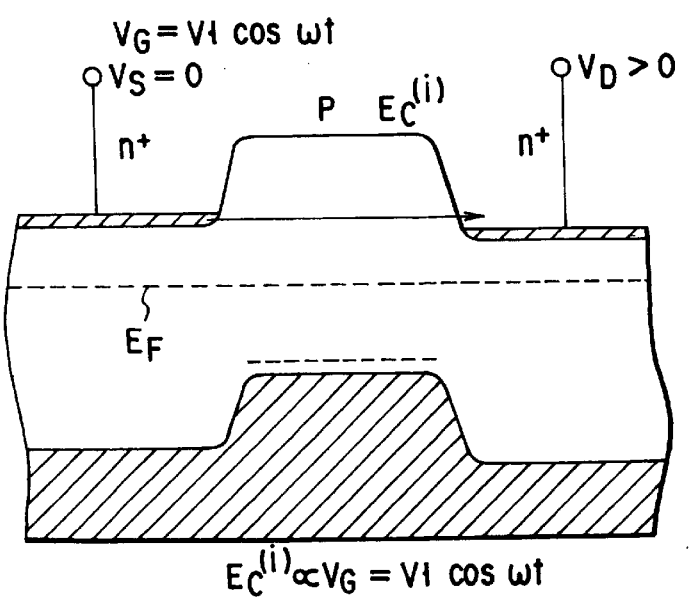
FIG. 7 is a diagram showing an energy band structure of a tunnel barrier according to the aspect B of the present invention.
Figure 8:
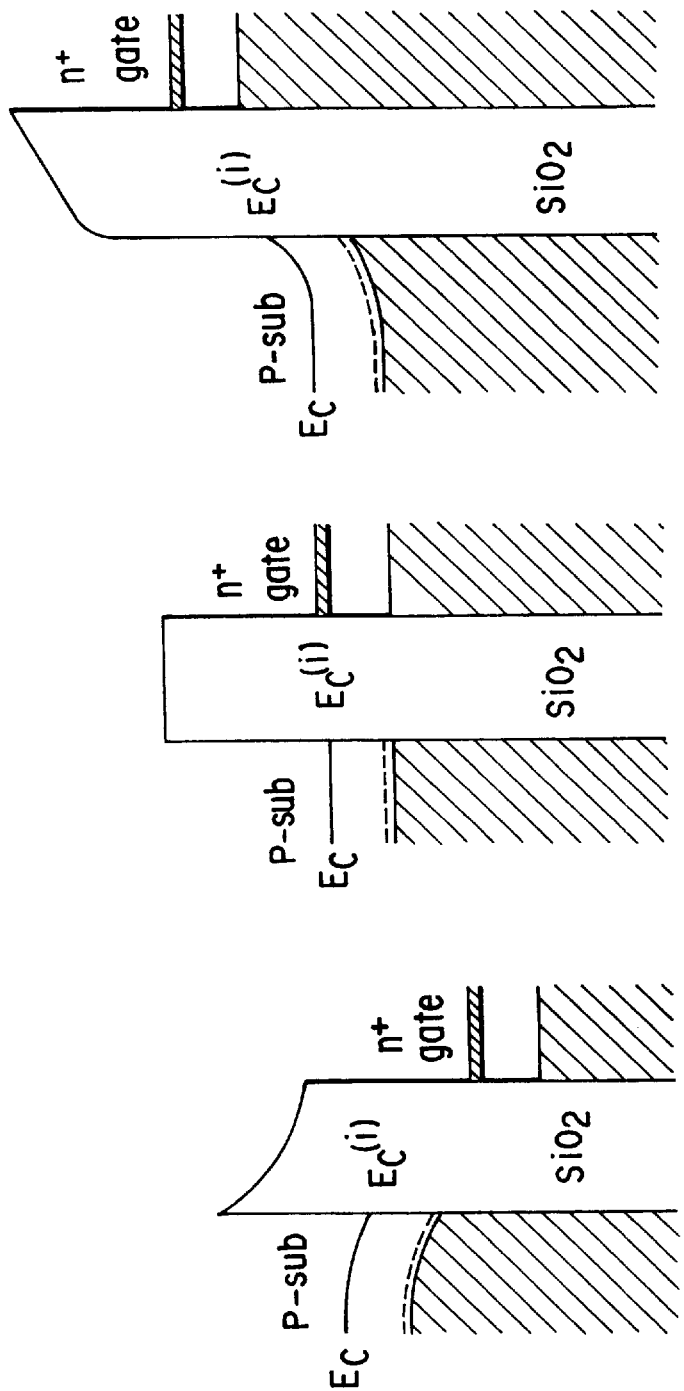
FIGS. 8A to 8C are representations illustrating an oscillating mechanism of a tunnel barrier according to the present invention.

A third embodiment will be described. In FIGS. 5 and 6, sectional views of a MOS type BL tunnel element are shown. A source (S) and drain (D) are doped to be n⁺ (even if p⁺, a principle is held in the same way) and a potential on a dotted line is shown in FIG. 7. It is a feature that the magnitude of a height of a barrier Ec($^i$) is proportional to a voltage $V_G$ of a gate G. If a high frequency alternating current voltage VG=V1 cos ωt is applied to a gate, the barrier height Ec($^i$) oscillates at a high frequency as shown in FIG. 8 and electrons passes through a dotted line portion of FIGS. 5 and 6 by BL tunneling. In this case, |V1| may be as small as an inversion layer is not produced. A gate length may be longer or shorter as compared with a channel length, FIG. 5 corresponds to the case of being shorter and FIG. 6 corresponds to the case of being longer.

[Embodiment of the Aspect C of the Present Invention]

A fundamental constitution of the aspect C of the present invention will first be described.

The aspect C is directed to a new type of a read only memory device using a BL tunnel element which utilizes a BL tunnel effect. As for materials of the element, those described in the aspects A and B of the present invention are applied to the aspect C. An oscillating circuit to produce an input signal is used together in order to directly operate switching. As desired embodiments, the followings are shown.

Two gates covered by an insulating film are provided on a silicon substrate, three terminal are provided in combination of the two gates and the substrate, an input voltage composed of a direct current and an alternating current is applied by use of a gate on the substrate side as a wordline, and a current by electrons which effect BL tunneling of an insulating film is adjusted by operating the alternating current component and the direct current component for an output.

Figure 21:
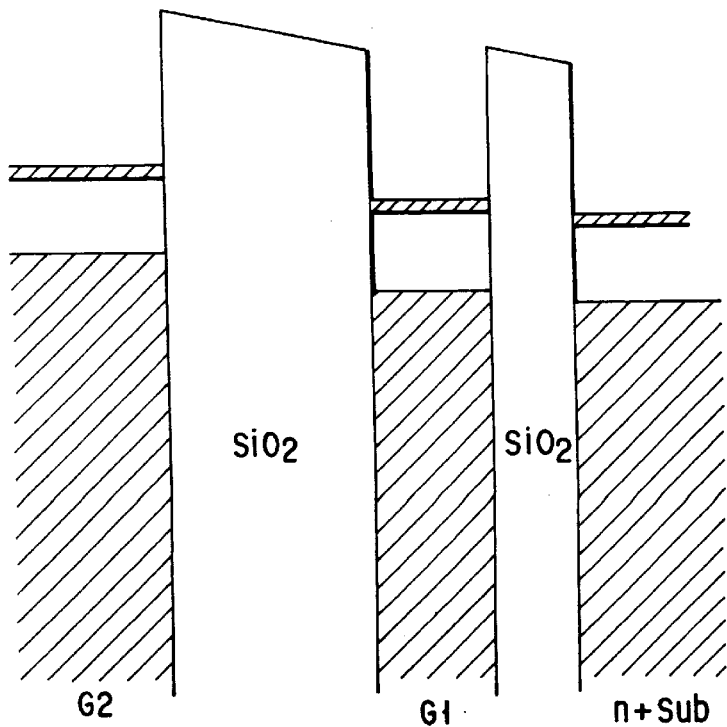
FIG. 21 is a band diagram of a BL tunnel element according to the aspect C of the present invention.

The BL tunnel element of the above constitution has a threshold vibration frequency $\omega_T$. When a vibration frequency ω of an alternating current of an input is larger than the threshold vibration frequency $\omega_T$ (ω>$\omega_T$), a tunneling probability increases exponentially and a tunnel current can be operated by use of this nature. A band diagram based on such a structure is shown in FIG. 21. A potential difference is provided between the gate 2 and substrate and electrons can pass from G2 to the substrate when the vibration frequency of an alternating current applied to a gate G1 is lager (ω>ωT) and electrons do not pass through when the vibration frequency thereof is smaller (ω<ωT). An increment in current between the substrate and gate 2 by the BL tunneling is read by use of a sense amplifier. Since the increment in current can be controlled by use of fator 2ω/$\omega_o$, the element is suitable for a multiple-valued application.

Embodiments of the aspect C of the present invention will below be described in reference to the accompanying drawings.

A first embodiment will first be described.

Figure 22:
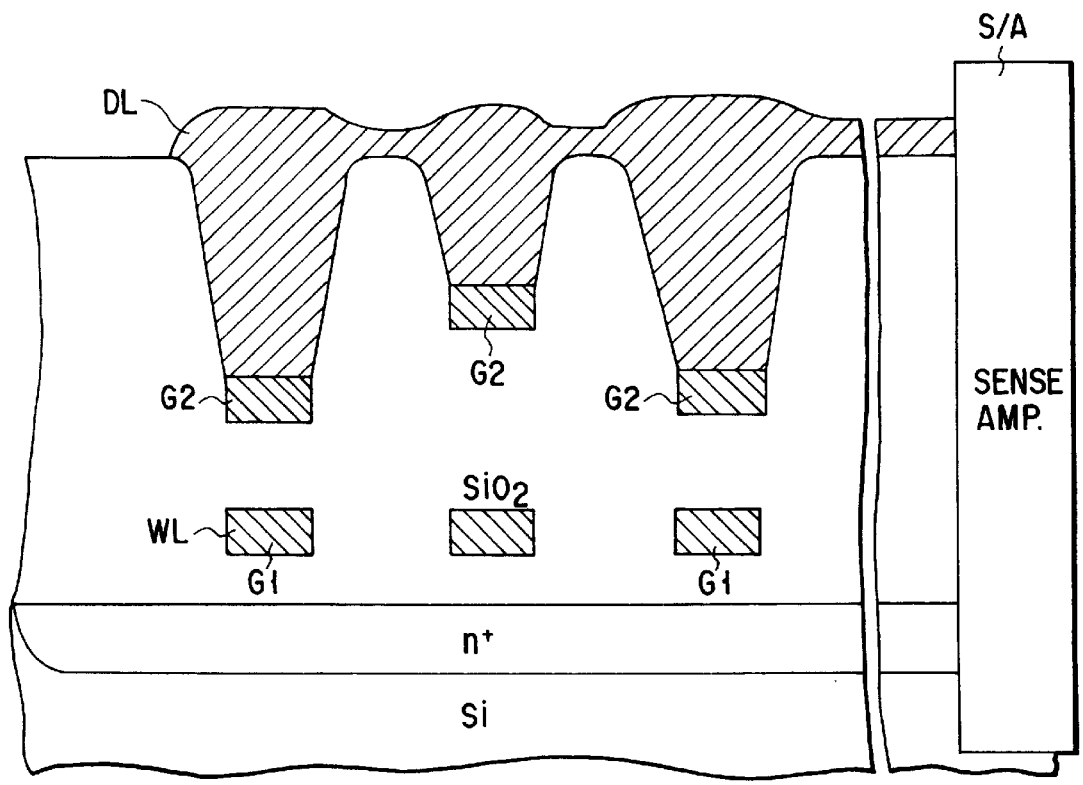
FIG. 22 is a sectional view of a structure of a cell of a first embodiment of a read only memory device according to the aspect C of the present invention.

FIG. 22 is a sectional view of a cell in the case where a BL tunnel element is used in a read only memory device. A gate G1 is a fine wire made of polysilicon, silicon or a metal extending in a direction perpendicular to the sheet surface on which the figure is drawn and an alternating current voltage (V1 cos ωt) is applied to the wire as an input. A potential differential is added between a contact connected to the gate 2 and a contact connected to the Si substrate. A current flows in an insulating film ($SiO_2$) interposing between the gates G1 and G2, and in an insulating film ($SiO_2$) interposing between the gate 1 and substrate by BL tunneling if an input vibration frequency is in excess of a threshold value. In the embodiment, the threshold value can be set in advance in a step of a fabrication process based on the thickness of an insulating film between the gates G1 and G2. In the case where two values of 1 and 0 are used, only two kinds of thickness are used as in the embodiment. In order to simplify a fabrication process, cell thickness between gate 1 and the substrate have a constant value.

A fabrication method for a read only memory device having this cell structure will be described. A thin oxide film is formed by thermally oxidizing a substrate having a n⁺ well fabricated so as to have a large area, a mask is provided on the n⁺ well and a fine wire made of polysilicon, silicon or a metal, which works as a gate G1, is formed. Then a CVD film is formed, a mask is provided thereon and a gate 2 of polysilicon is selectively formed. The gate 2 has the shape of a dot and the area of the dot automatically defines an area occupied by one cell. The size of a dot must be so small that the dot does not bestride a space between fine wires formed as a gate G1. In other words, a distance between adjacent fine wires must be so large that a charge is not exchanged between the adjacent fine wires or between a fine wire and a dot adjacent thereto. A CVD film is again formed, a mask is provided thereon, a cell which has not been selected by the previous mask is selected and polysilicon in the shape of a dot is formed. Thereafter, a CVD film is further again formed, a mask which selects all the cells is provided, gate contacts respectively having two kinds of depths are selectively formed and a dataline DL is formed thereon.

Figure 23:
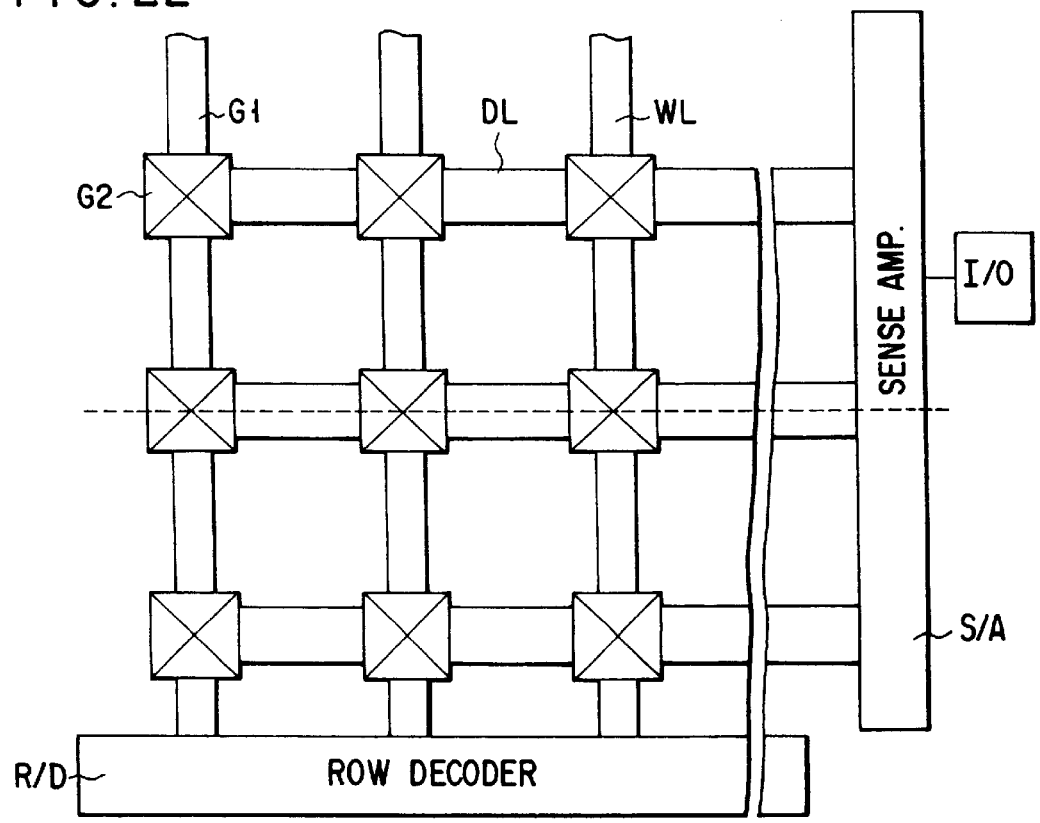
FIG. 23 is a plan view of cells according to a structure of FIG. 22 according to the aspect C of the present invention.

A plan view of a read only memory device fabricated in such a manner as seen from above the device is shown in FIG. 23. A sectional view taken along a dotted line in FIG. 23 corresponds to the sectional view of FIG. 22. In this case, a modification is possible that a p-type substrate is used, the same structure is employed and the type of a gate G1 or a gate G2 is selectively changed to adjust a threshold value. In that case, even when all the cells each have an oxide film of the same thickness, a read only memory device with a similar function can be fabricated. While in the embodiment, there are employed two kinds of thickness of an oxide film between gates G1 and G2, only an oxide film having a smaller thickness is allowed to be thinner than that of a thermal oxide film formed between the substrate and a gate G1. In addition, it is possible that an impurity and a defect can selectively be added to an oxide film to selectively adjust a threshold value. The above mentioned oxide film can be replaced with nitride film or an insulating film of the other kind.

Figure 24:
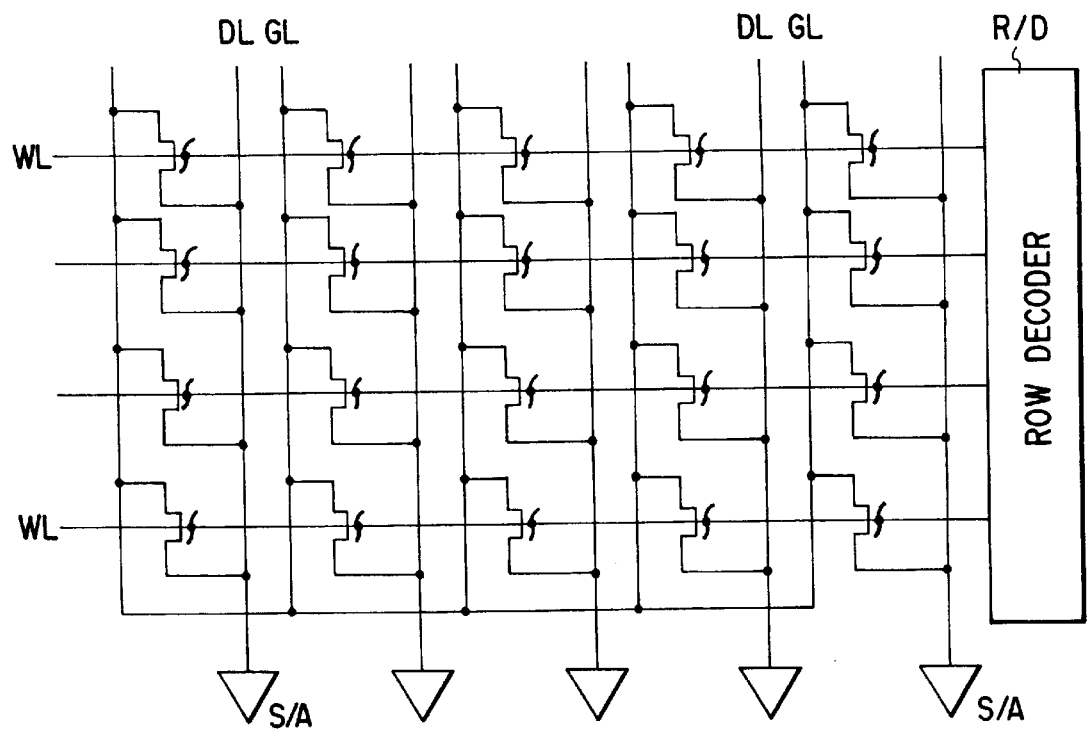
FIG. 24 is a diagram showing a circuit constitution of a read only memory device according to the aspect C of the present invention.

In FIG. 24, a circuit diagram is shown. In an actual operation, if a vibrating voltage is applied only to a wordline selected by a row decoder R/D, a current flows only in a dataline connected to a cell in a conductive condition and the current is read by a sense amplifier S/A.

A second embodiment will be described.

Figure 25:
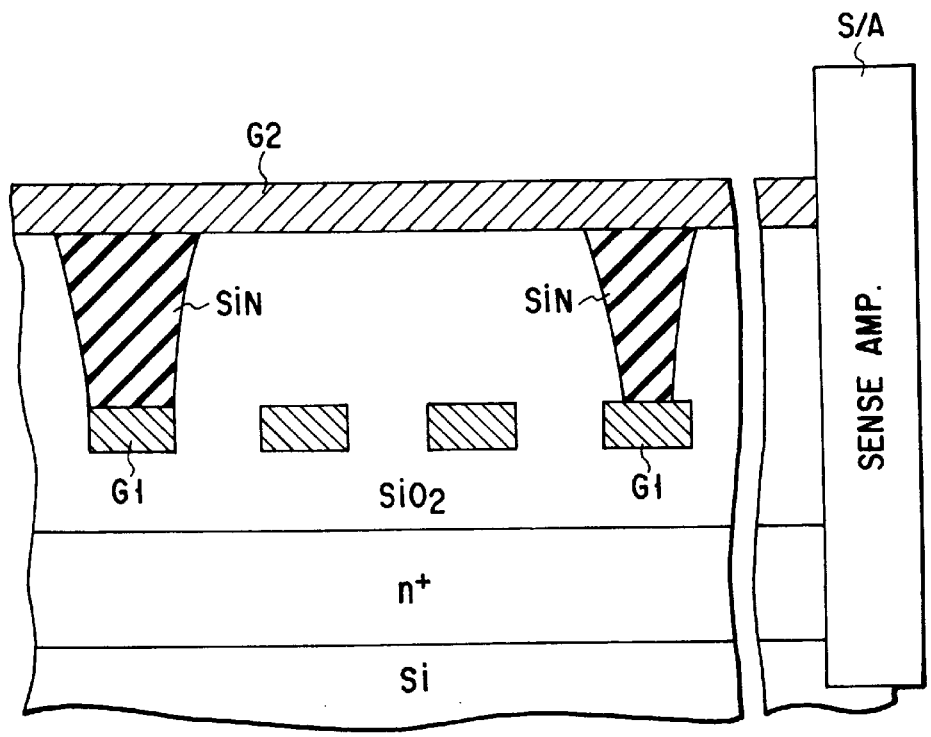
FIG. 25 is a sectional view of a structure of a cell of a second embodiment of a read only memory device according to the aspect C of the present invention.

A sectional view of a cell of the second embodiment is shown in FIG. 25. A gate G1 is a fine wire made of polysilicon, silicon or a metal extending in a direction perpendicular to the surface of the sheet on which the figure is shown and an alternating voltage (V1 cos$\omega$t) as an input. N potential difference is given between a contact connected to a gate 2 and a contact connected to an Si substrate. A current flows in both an insulating film (SiN) lying between gates G1 and G2 and an insulating film (SiO$_2$) lying between a gate 1 and a substrate by BL tunneling if an input vibration frequency is increased beyond a threshold value. In the embodiment, a threshold value can be set in advance in a step of a fabrication process according to a kind of an insulating film between gates G1 and G2. In the case where a two value 0/1 system is employed, the number of kinds of insulating film is limited to two as in this embodiment.

A fabrication method for a read only memory device having this cell structure will be described. A thin oxide film is formed by thermally oxidizing a substrate having a n$^+$ well fabricated so as to have a large area, a mask is provided on the n$^+$ well and a fine wire made of polysilicon, silicon or a metal, which works as a gate G1, is formed. Then a CVD film is formed, a mask is provided thereon and a hole is selectively formed above polysilicon. This hole is formed so as to be located on the fine wire already Fabricated. A nitride film in the shape of a dot is deposited in the hole. The size of the dot automatically determines an area occupied by one cell. The size of the dot must be so small that the dot does not bestride a space between fine wires formed as a gate G1. In other words, a distance between adjacent fine wires must be so large that a charge is not exchanged between the adjacent fine wires or between a fine wire and a dot adjacent thereto. Parallel fine wires made of polysilicon, silicon or a metal are formed as gates G2 in such a manner that the parallel fine wires orthogonally intersect a fine wire of a gate G1. At this time, the parallel fine wires are arranged so that each dot already formed is partly enclosed by two orthogonal fine wires, of one of the parallel fine wires and one of fine wires of gate G1. In fabrication of dots, an oxide film between a not-selected gate G1 and a gate G2 works as a tunnel insulating film and a tunnel insulating film between a selected gate G1 and a gate G2 is made of a nitride film. In the final step, a CVD film is formed on a gate G2. In such a manner, a threshold value can selectively be set according to a kind of insulating film.

Figure 26:
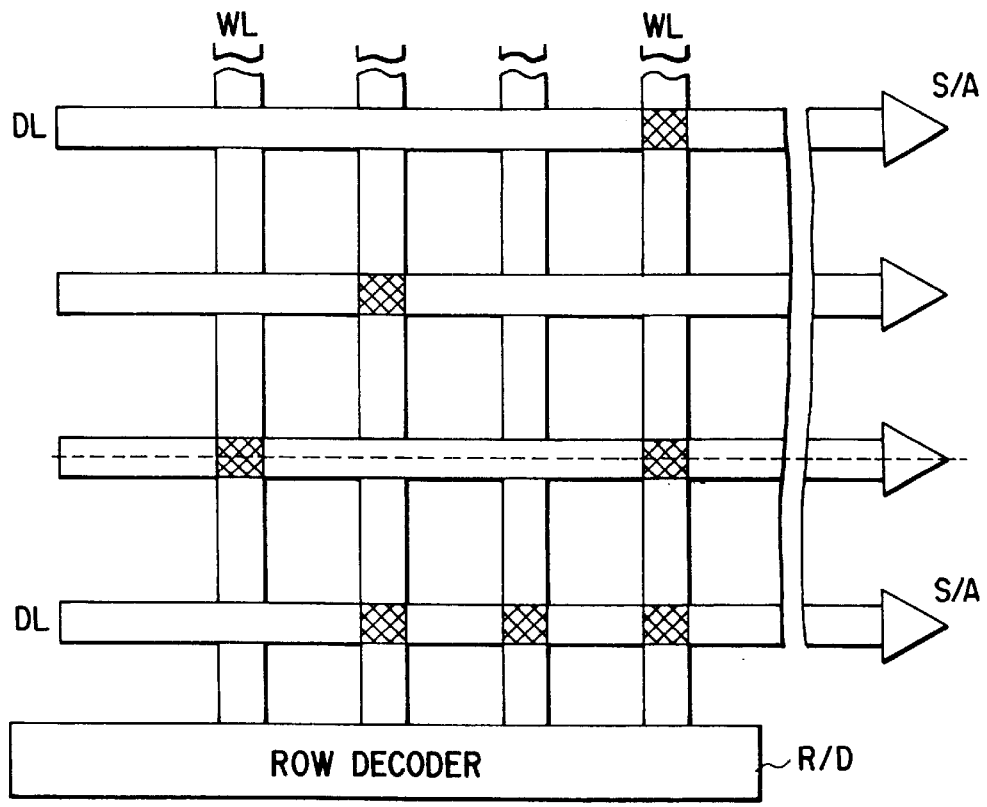
FIG. 26 is a plan view of cells according to a structure of FIG. 25 according to the aspect C of the present invention.

In FIG. 26, a view of the cells as seen from above the cells is shown. A sectional view taken along a dotted line in the figure is FIG. 25. A cell is fabricated at an intersection of a dataline DL and a wordline WL and a cell indicated by a mesh is one in which a nitride film is used.

A circuit diagram is similar to that of FIG. 24 and if a vibrating voltage is applied only to a wordline selected by a row decoder, a current flows only in a dataline DL connected to a cell in a conductive condition and the current is read by a sense amplifier S/A.

A third embodiment will be described.

Figure 27:
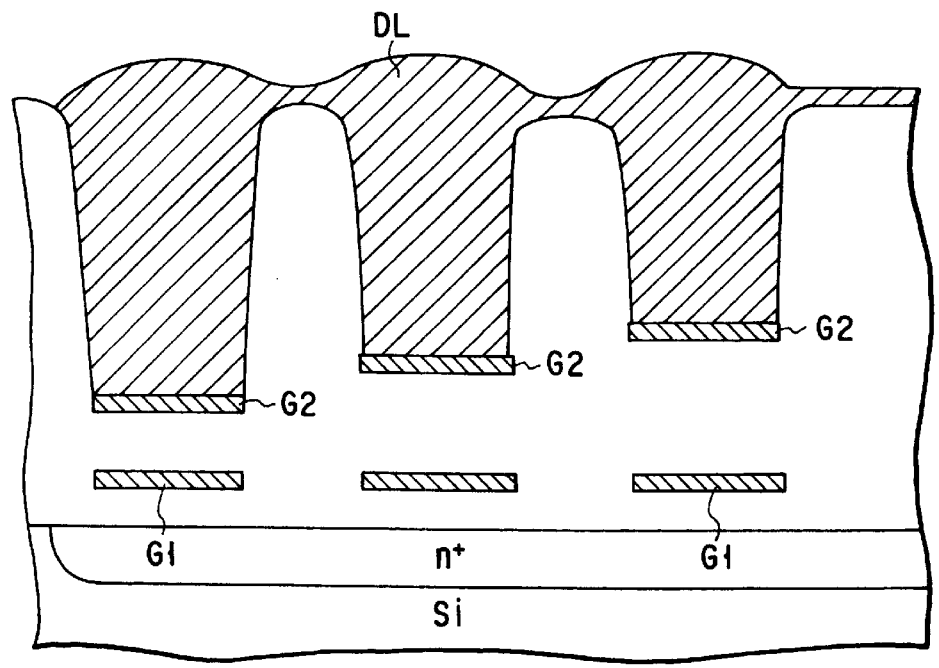
FIG. 27 is a sectional view of a structure of a cell of a third embodiment of a read only memory device according to the aspect C of the present invention.

A sectional view of a cell of this embodiment (a multiple-valued read only memory) is shown in FIG. 27. A gate G1 is a fine wire made of polysilicon, silicon or a metal extending in a direction perpendicular to the surface of the sheet on which the figure is shown and an alternating voltage (V1cos $\omega$t) as an input is applied to the fine wire. A potential difference is given between a contact connected to a gate G2 and a contact connected to a substrate. A current flows both in an insulating film lying between gates G1 and G2 and in an insulating film lying between a gate G1 and a substrate by BL tunneling if an input vibration frequency is increased beyond a threshold value. In the embodiment, a threshold value can be set in advance in a step of a fabrication process according to a thickness of an insulating film between gates G1 and G2. In the case where a three value 0/1/2 system is employed, the number of kinds of insulating film is limited to three as in this embodiment. In the case of an N-value system, the number of kinds of thickness are only required to expand to N. The cells each have the same thickness between a gate G1 and the substrate.

A fabrication process for a read only memory device having this cell structure will be described. The following description is an expansion of the description of the first embodiment so as to be adaptive to a three-value system. In the case of an N-value system, a description of a fabrication process of a read only memory device can be formulated by expanding the description of the first embodiment in a similar way to this case. A thin oxide film is formed by thermally oxidizing a substrate having a n$^+$well fabricated so as to have a large area, a mask is provided on the n$^+$well and a fine wire made of polysilicon, silicon or a metal, which works as a gate G1 is formed. Then a CVD film is formed, a mask is provided thereon and a gate G2 of polysilicon is selectively formed. A gate G2 has the shape of a dot. A size of the dot must be so small that the dot does not bestride a space between fine wires formed as a gate. In other words, a distance between adjacent fine wires must be so large that a charge is not exchanged between the adjacent fine wires or between a fine wire and a dot adjacent thereto. A CVD film is again formed, a mask is provided thereon, a cell is selected among cells which have not selected by a previous mask, polysilicon in the shape of a dot is formed. Thereafter a CVD film is again formed thereon, a mask which selects all the cells which have not been selected is provided and polysilicon in the shape of a dot is formed. In such a manner, gate contacts respectively having three kinds of depth are electively formed and a dataline DL is formed thereon.

A plan view of a read only memory device fabricated in such a manner as seen from above the device is shown in FIG. 23 in a similar way to the case of a binary system (the first embodiment). A sectional view taken along a dotted line in FIG. 23 corresponds to the sectional view of FIG. 27. In this case, a modification is possible in a manner such that a p-type substrate is used, that the same structure is employed, and that a type of a gate G1 or a gate G2 is selectively changed to adjust a threshold value. Furthermore, even when all the cells each have an oxide film of the same thickness or they have oxide films of two different thickness, a read only memory device with a similar function can be fabricated. While in the embodiment, there are employed three kinds of thickness of an oxide film between gates G1 and G2, only an oxide film having the smallest thickness is allowed to be thinner than that of a thermal oxide film formed between the substrate and a gate G1. In addition, it is possible that an impurity and a defect can selectively be added to an oxide film to selectively adjust a threshold value.

A circuit diagram is shown in FIG. 24. If a vibrating voltage is given only to a wordline selected by a row decoder, a current flows only to a dataline connected to a cell in a conductive condition and the current is read by a sense amplifier S/A. In the case where a system is operated with three or more values, as in the case of the embodiment, a current quantity is used as a memory.

A fourth embodiment will be described.

A sectional view of a cell of this embodiment is shown in FIG. 28. A gate G1 is a fine wire made of polysilicon, silicon or a metal extending in a direction perpendicular to the surface of the sheet on which the figure is shown and an alternating current voltage (V1cos $\omega t$) as an input. A potential difference is given between a contact connected to a gate G2 and a contact connected to a Si substrate. A current flows in both an insulating film lying between gates G1 and G2 and an insulating film lying between a gate G1 and a substrate by BL tunneling if an input vibration frequency is increased beyond a threshold value. In the embodiment, a threshold value can be set in advance in a step of a fabrication process according to a kind of insulating film and a thickness of an insulating film between gates G1 and G2. In the embodiment, three values consisting of 0/1/2 can be adopted by a combination of a nitride film and oxide films having two kinds of thickness.

A fabrication process for a read only memory device having this cell structure will be described. A thin oxide film is formed by thermally oxidizing a substrate having a $n^+$well fabricated so as to have a large area, a mask is provided on the $n^+$well and a fine wire made of polysilicon, silicon or a metal, which works as a gate G1, is formed. Then a CVD film is formed, a mask is provided thereon and a hole is selectively formed in polysilicon. This hole is formed so as to be located above the fine wire already fabricated. A nitride film in the shape of a dot is deposited in the hole. The size of the dot must be so small that the dot does not bestride a space between fine wires formed as a gate. In other words, a distance between adjacent fine wires must be so large that a charge is not exchanged between the adjacent fine wires or between a fine wire and a dot adjacent thereto. A mask is provided on the film and polysilicon corresponding to a gate G2 is formed. A gate G2 is further selectively formed among cells which have not been selected in this step. A CVD film is further again formed, a mask is provided and a gate G2 is formed in the cells which have so far been left without being selected. In the final step, parallel fine wires made of polysilicon, silicon or a metal are formed in such a manner that the parallel fine wires orthogonally intersect a fine wire of a gate G1. At this time, the parallel fine wires are arranged so that dots already formed are respectively partly enclosed by two orthogonal fine wires, of one of the parallel fine wires and one of fine wires of gate G1. In fabrication of dots for the first time, oxide films of two kinds different in thickness each between a not-selected gate G1 and a gate G2 work as a tunnel insulating film. A tunnel insulating film between a selected gate G1 and a gate G2 is made of a thin nitride film. In such a manner, a threshold value can selectively be set according to a combination of a kind and thickness of insulating film. A four or more valued read only memory device can be fabricated in a similar way.

A circuit diagram is the same as that of FIG. 24. If a vibrating voltage is given only on a wordline WL selected by a row decoder, a current flows only in a dataline connected to a cell in a conductive condition and the current is read by a sense amplifier. In the case where a three or more valued device is operated as in the embodiment, a current quantity is used as a memory.

[Embodiment of the Aspect D of the Present Invention]

A fundamental constitution of the aspect D of the present invention will first be described.

The aspect D is directed to a new type of a dynamical random access memory device using a BL tunnel element which utilizes a BL tunnel effect. As for materials of the element, those described in the aspects A and B of the present invention are applied to the aspect D. An oscillating circuit to produce an input signal is used together in order to directly operate switching. As desired embodiments, the followings are shown.

(a) One two terminal BL tunnel element and one three terminal BL tunnel element are used in each cell and wordlines are divided into two kinds. A floating gate is formed under each of the wordlines with a tunnel film and an insulating film interposing therebetween. Besides, the floating gate forms a capacitor between the gate and a plate electrode. Furthermore, a dataline is formed under the floating gate with a tunnel film interposing therebetween.

(b) Only a three terminal BL tunnel element is used and a nitride film as a tunnel film is formed in the vicinity of an intersection of a wordline and a dataline and a gate capacitor is formed on the film.

A BL tunnel element constitutes a part of the above mentioned structure has a threshold vibration frequency $\omega_T$ which can be adjusted based on a structure of an insulating film. If a vibration frequency $\omega$ of an alternating current as an input is larger than the threshold value ($\omega > \omega_T$), a tunneling probability is increased exponentially, while if the vibration frequency of an alternating current is smaller than the threshold value, the tunneling probability is kept to be small. A connection between a dataline and a capacitor, and a charge exchange between a wordline and the capacitor are controlled by use of this nature.

As for a BL tunnel element, there are a two-terminal element and a three-terminal element. In FIG. 29, a band diagram of a two-terminal BL tunnel element is shown and in FIG. 30, a diagram showing a two-terminal BL tunnel element as a circuit is shown. A voltage V0+V1cos$\omega t$ is applied between terminals T1 and T2 and a current is made to flow (the ON state) or not to flow (the OFF state) between both electrodes according to whether $\omega$ is larger or smaller than $\omega_T$. The direction of a current flow is controlled by a sign of V0.

FIG. 31 shows a band diagram of a three-terminal-NAND type BL tunnel element and FIG. 32 shows a diagram showing a three-terminal BL tunnel element as a circuit. There are provided two kinds of insulating films, which are different in height of a barrier. An insulating film with a lower barrier is used as a tunnel film and sandwiched by terminals T1 and T2, while the other insulating film with a higher barrier is sandwiched by terminals T2 and T3. A voltage V1 cos ωt is applied to the terminal T3 and controls ON/OFF of the terminals T1 and T2 by operating a magnitude of ω. Besides, V0 is applied one of the three terminals and the direction of a current which flows between the terminals T1 and T2 in the ON condition is controlled by the sign of V0.

Figure 33:
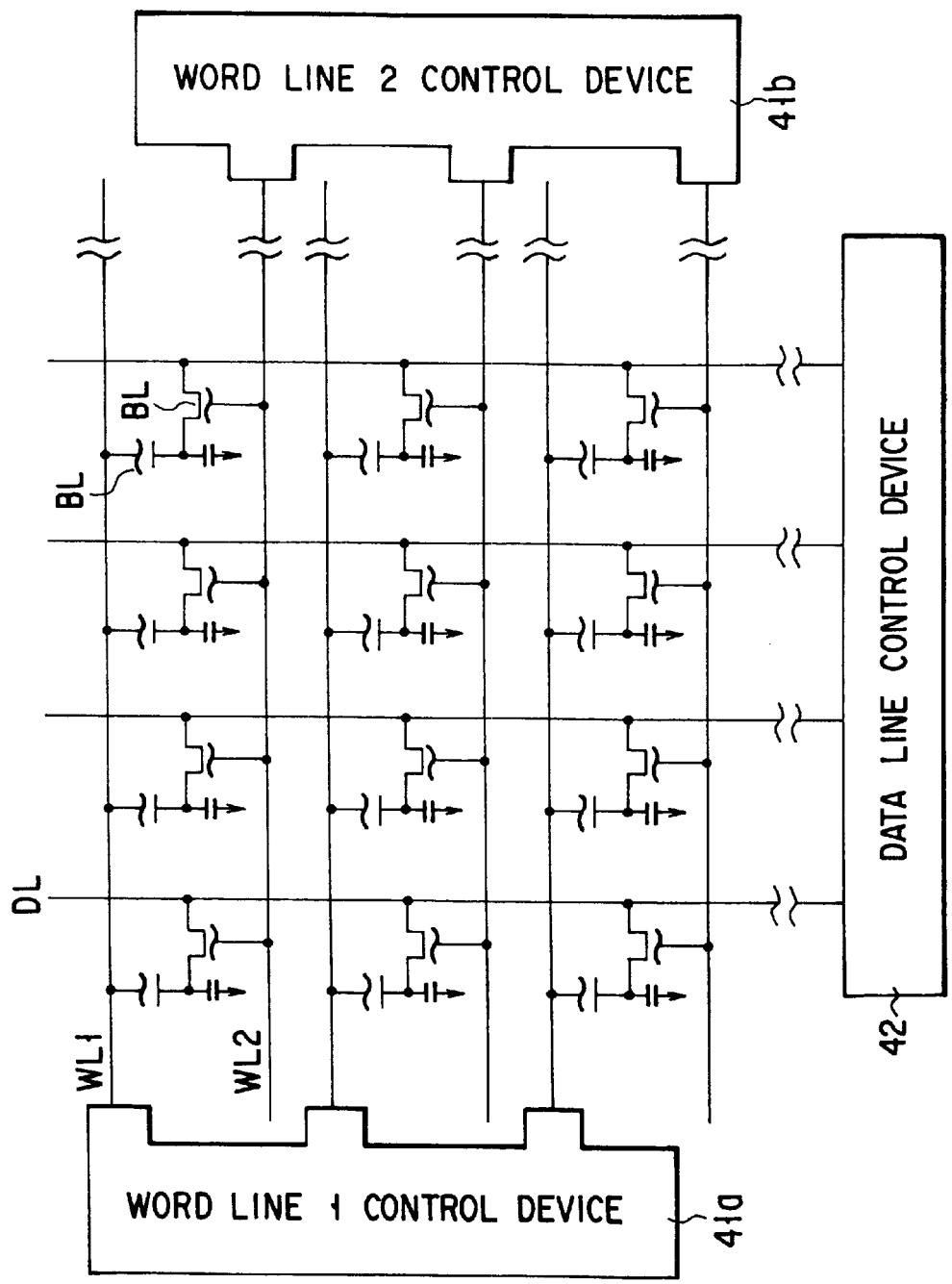
FIG. 33 is a diagram of a circuit constitution of a dynamical random access memory according to the aspect D of the present invention.

FIG. 33 shows a circuit diagram of a dynamical random access memory using a BL tunnel element. A two-terminal BL tunnel element is provided between a wordline WL1 and a capacitor and an electrode connecting the capacitor and a terminal of the BL tunnel element is a floating gate FG. The floating gate FG and a dataline DL are respectively connected to the terminals T1 and T2 of the three-terminal BL tunnel element. The remaining terminal T3 is connected to a wordline WL2.

A high frequency is first applied to the wordline WL1, a two terminal BL tunnel element is made to be in the ON state and a charge is injected to the capacitor. Whether positive or negative is controlled by the sign of V0, and write/erase operations are conducted by this operation. Then application of the high frequency to the wordline is ceased and the two terminal BL tunnel element is made to be in the OFF state. A high frequency is applied to the wordline WL2 and the three terminal BL tunnel element is made to assume the ON state between the terminals T1 and T2 thereof. At this time, the potential of the wordline DL is changed by a charge of the capacitor. The change is only required to be read by a sense amplifier.

Figure 38:
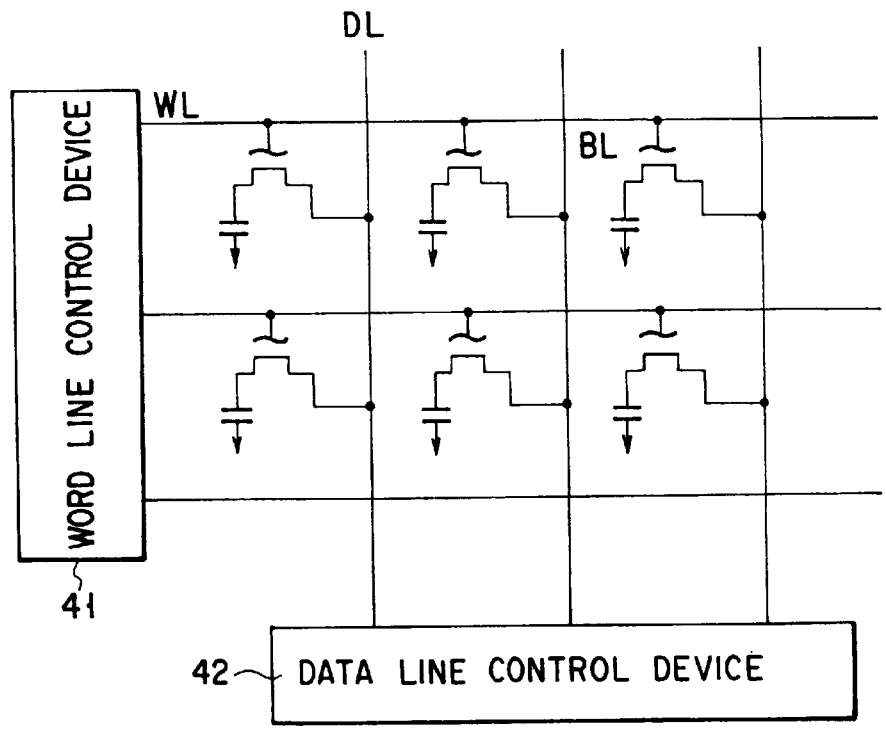
FIG. 38 is a diagram of a circuit constitution of a dynamical random access memory comprising three-terminal BL tunnel elements only according to the aspect D of the present invention.

Even when only a three-terminal BL tunnel element is used, a dynamical random access memory device can be constituted and a circuit in the case is shown in FIG. 38. Switching by a BL tunnel element between a dataline DL and a capacitor is controlled by a wordline WL and a charge quantity stored in the capacitor is controlled or read by use of a dataline control device in the state of ON.

Embodiments of the aspect D of the present invention will be described below.

Figure 34:
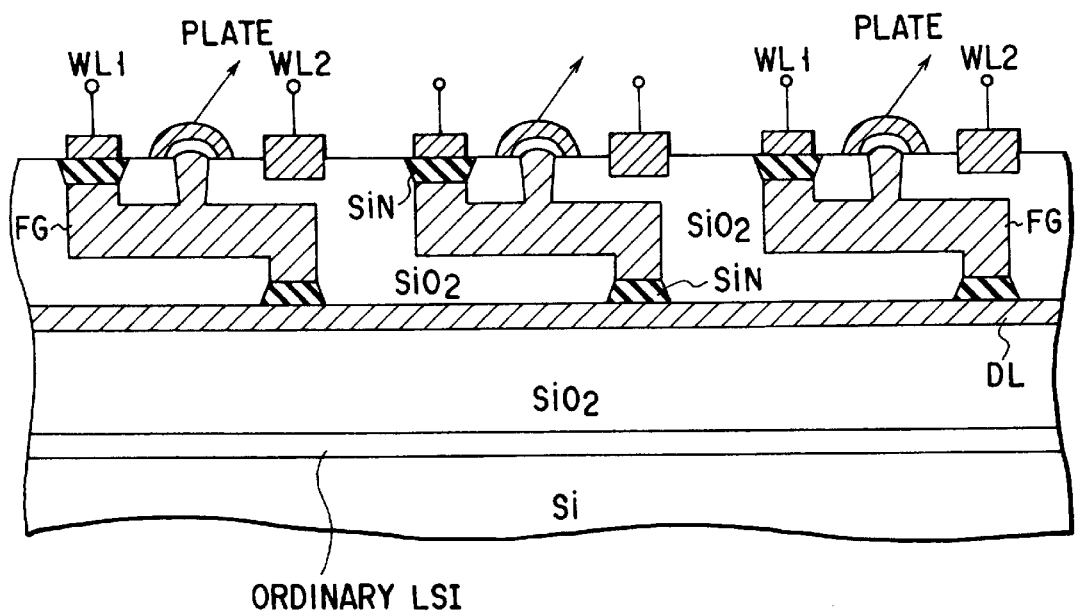
FIG. 34 is a sectional view of a structure of a dynamical random access memory device according to the aspect D of the present invention.
Figure 35:
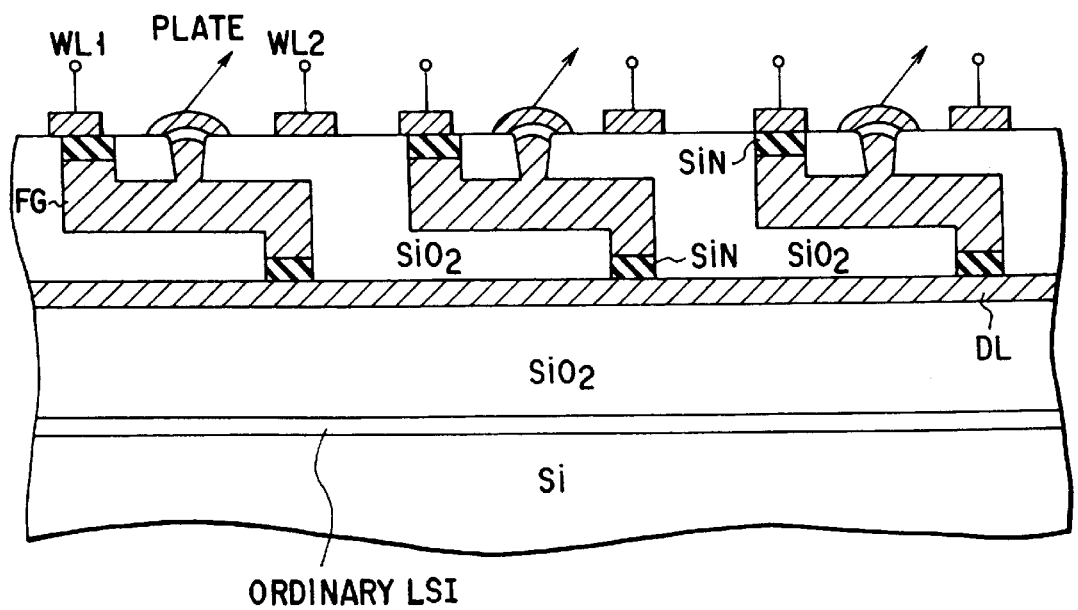
FIG. 35 is a sectional view of a structure of a dynamical random access memory device according to the aspect D of the present invention.
Figure 36:
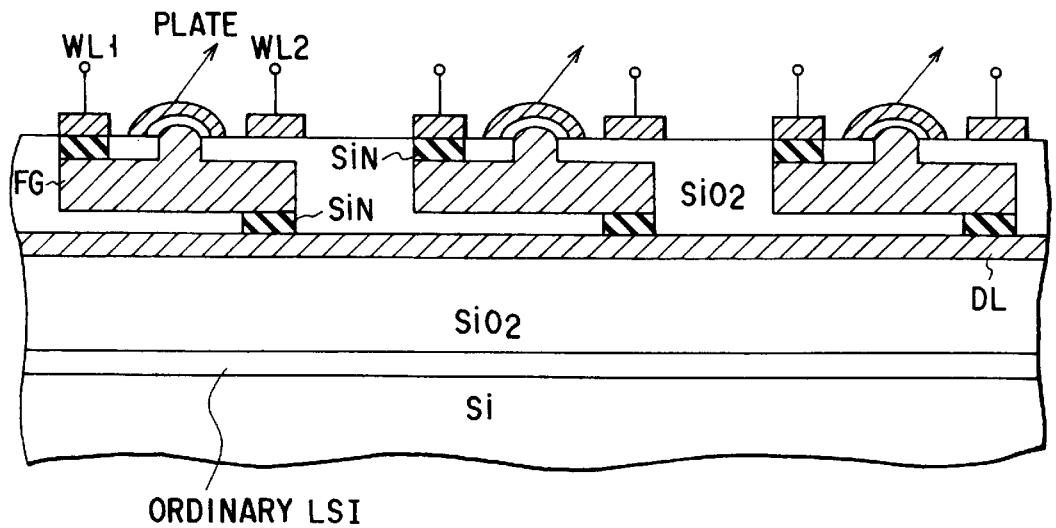
FIG. 36 is a sectional view of a structure of a dynamical random access memory device according to the aspect D of the present invention.

A first embodiment will first be described. FIGS. 34 to 36 show sectional views of the embodiment. In the embodiment, a tunnel film using a nitride film is sandwiched between a wordline WL1 and a floating gate FG to form a two-terminal BL tunnel element. An oxide film is inserted between a wordline WL2 and the floating gate FG for insulation and a tunnel film using a nitride film is sandwiched by the dataline DL and the floating gate FG. That is, a three-terminal NAND type BL tunnel element is constructed in a stacking structure with the dataline DL, a nitride film, a floating gate FL, an insulating oxide film, a wordline WL2. A contact is formed on the floating gate and a capacitor is formed between a plate electrode and the gate. An integrated circuit is already fabricated on a silicon substrate and a dynamical random access memory device can also be fabricated on an oxide film which is used as a coating formed on the integrated circuit.

Figure 37:
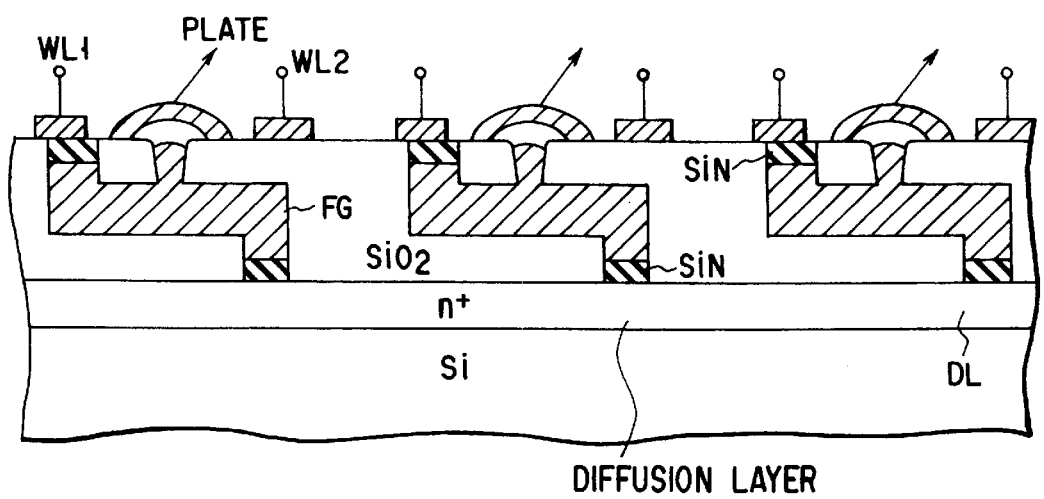
FIG. 37 is a sectional view of a structure of a dynamical random access memory device according to the aspect D of the present invention.

A second embodiment will be described. In FIG. 37, a sectional view of the embodiment is shown. In the embodiment, a tunnel film using a nitride film is sandwiched by a wordline WL1 and a floating gate FG to form a two-terminal BL tunnel element. An oxide film is inserted between a wordline WL2 and the floating gate FG for insulation and a tunnel film using a nitride film is sandwiched by a dataline DL fabricated as a narrow, long diffused layer in a silicon substrate and the floating gate FG. That is, a three-terminal NAND type BL tunnel element is formed in a stacking structure with a dataline DL, a nitride film, a floating gate FG, an insulating oxide film and a wordline WL2. A contact is formed on the floating gate and a capacitor is formed between a plate electrode and the gate.

Figure 39:
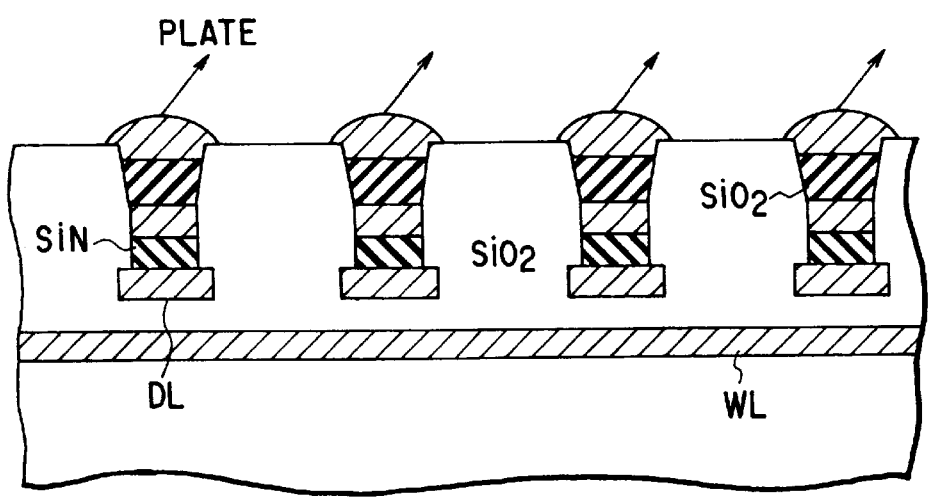
FIG. 39 is a sectional view of a structure of a dynamical random access memory comprising three-terminal NAND type BL tunnel elements only according to the aspect D of the present invention.

A third embodiment will be described. A sectional view of the embodiment is shown in FIG. 39. In the embodiment, since only a three-terminal BL tunnel element is used, wordlines WL are those of one kind. A dataline DL is formed above a wordline WL formed in or on a substrate with an oxide film as an insulating film interposing therebetween in a manner such that the dataline intersects the wordline orthogonally. A nitride film (SiN) as a tunnel film is formed on the dataline, and gates like a matrix are formed on the nitride film. A plate is further formed on the gates with an insulating film ($SiO_2$) inserted in order to stack a capacitor.

[Embodiment of the Aspect E of the Present Invention]

A fundamental constitution of the aspect E of the present invention will first be described.

The aspect E is directed to a new type of a non-volatile semiconductor memory device, which utilizes a BL tunnel effect, and which has a low electric field injection as an operational principle. As for materials of the element, those described in the aspects A and B of the present invention are applied to the aspect E. An oscillating circuit to produce an input signal is used together in order to directly operate switching. As desired embodiments, the followings are shown.

(a) A structure is provided that a floating gate is provided above a silicon substrate with an insulating film interposing therebetween and a control gate is formed above the floating gate with an oxide film interposing therebetween. The floating gate has a feature that it exchanges a charge with a diffusion layer in the substrate by BL tunneling, and BL tunneling is controlled by a voltage applied to the control gate or the substrate. A nitride film is used as a BL tunnel film between the diffused layer and the floating gate.

(b) A structure is provided that a floating gate is provided above a silicon substrate with an insulating film interposing therebetween and a control gate is formed above the floating gate with an oxide film interposing therebetween. The floating gate has a feature that it exchanges a charge with a channel region in the substrate by BL tunneling and BL tunneling is controlled by a voltage applied to the control gate or the substrate. A nitride film is used as a BL tunnel film between the channel region and the floating gate.

(c) A structure is provided that a floating gate is provided above a silicon substrate with an insulating film and a control gate is formed above the floating gate with an oxide film interposing therebetween. The floating gate has a feature that it exchanges a charge with a control gate by BL tunneling. BL tunneling is controlled by a voltage applied to the control gate or the substrate. A nitride film is used as a BL tunnel film between the control gate and the floating gate.

Figure 40:
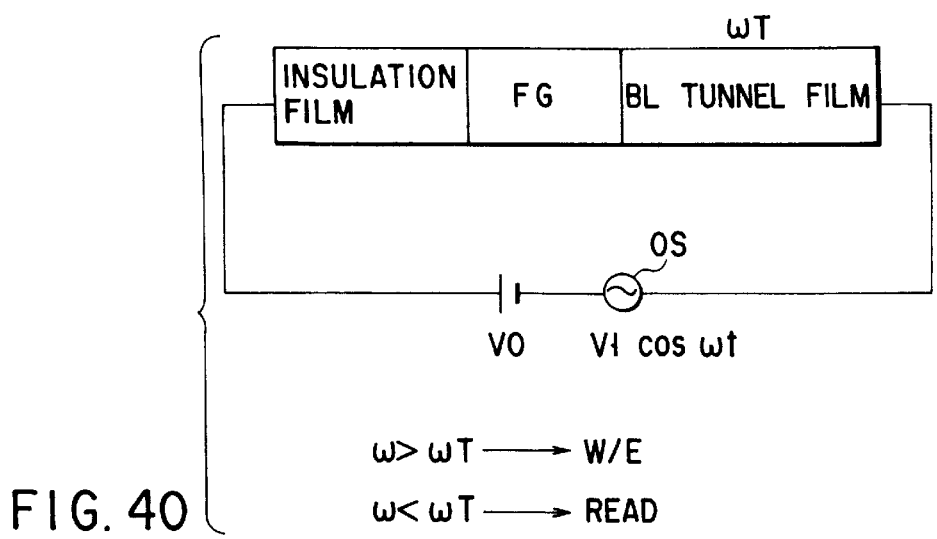
FIG. 40 is a representation illustrating a principle of a non-volatile memory device by BL tunneling according to the aspect E of the present invention.

The above mentioned structure has a threshold vibration frequency $\omega_T$ which is adjustable based on a kind of a BL tunnel element shown in FIG. 40 and if a vibration frequency ω of an alternating current voltage (V0+V1cosωt) applied to a substrate or a control gate is larger than the threshold value ($\omega > \omega_T$), a tunneling probability is increased exponentially, and to the contrary, if the vibration frequency of an alternating current voltage is smaller than the threshold value, the tunneling probability is kept small without any change. By use of the nature, the floating gate exchanges a charge with the substrate or the control gate when $\omega > \omega_T$, while the floating gate does not exchange it when $\omega < \omega_T$. What is especially remarkable is that even when the maximum value of a potential difference applied between both ends of a BL tunnel film by an alternating voltage is lower than 0.1V, an exchange of a charge is possible as far as $\omega > \omega_T$. For this reason, a BL tunnel film gives birth to neither breakdown nor stress leakage and therefore, a problem relating to reliability of an insulating film can basically be avoided.

Embodiments of the aspect E of the present invention will be described.

Figure 41:
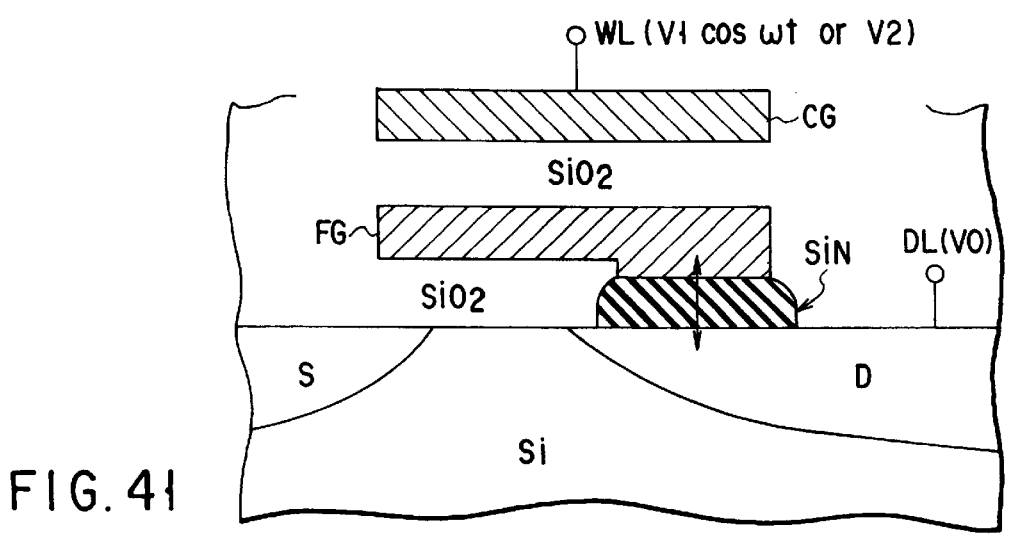
FIG. 41 is a sectional view of a structure of a cell of a first embodiment according to the aspect E of the present invention.
Figure 43:
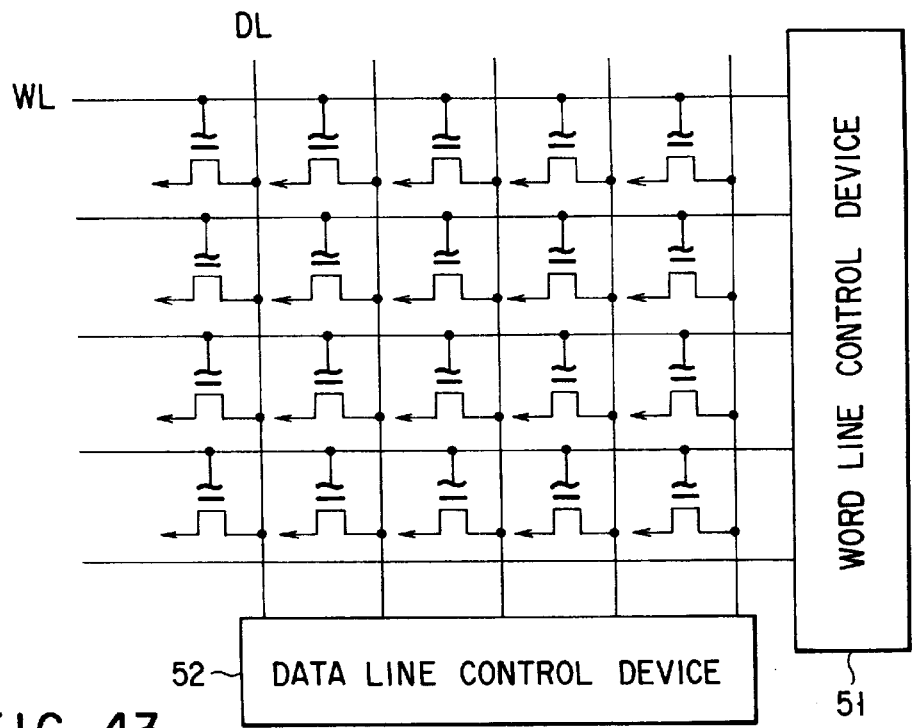
FIG. 43 is a diagram of a circuit constitution of the first and second embodiments according to the aspect E of the present invention.

A first embodiment will first be described. A sectional view of a cell in the case where a BL tunnel element is used as a non-volatile semiconductor memory device is shown in FIG. 41. In the embodiment, a nitride film as a BL tunnel film is used between a drain and a floating gate FG. A control gate CG is connected to a wordline WL and the drain is connected to a dataline DL. In utilization for write, a vibration frequency of an alternating voltage applied to the wordline is set in a relation of $\omega > \omega_T$, a negative direct current voltage (V0<0) is given to the dataline and electrons are injected to the floating gate from a drain region. In utilization for erase, electrons are drawn out from the floating gate to the drain in condition of $\omega > \omega_T$ and V0>0. In such a manner as mentioned above, the quantity of charges in the floating gate is controlled and a threshold voltage for a current flowing between a source and a drain is controlled. In utilization for read, a direct current voltage V2 is applied to the wordline and it is discriminated by a sense amplifier in a dataline control device whether or not a current flows between the source and drain. At this point, if V2 is larger than the threshold voltage, a current flows between the source and drain and if V2 is smaller, the current does not flow. A circuit constitution of the embodiment is shown in FIG. 43.

Figure 42:
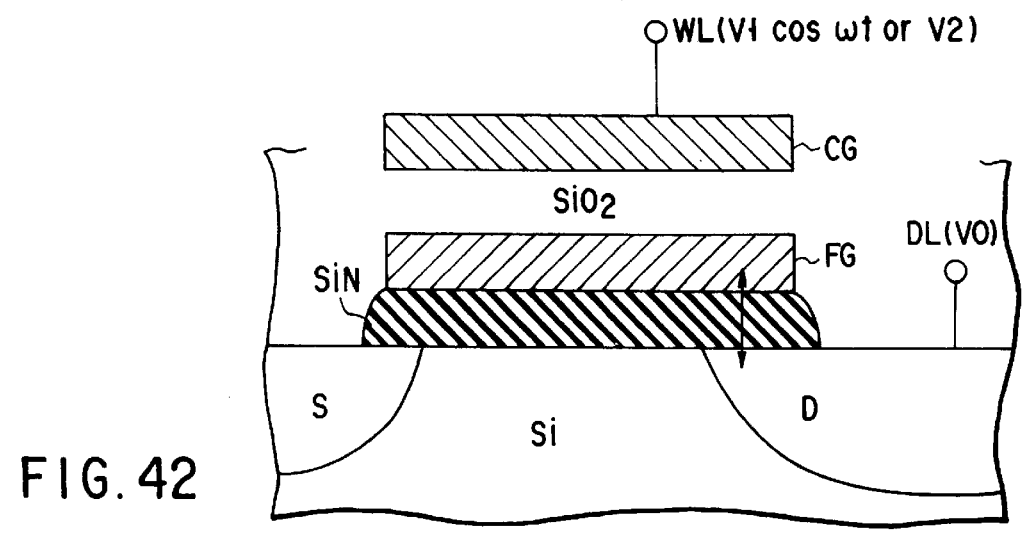
FIG. 42 is a sectional view of a structure of a cell of a second embodiment according to the aspect E of the present invention.

A second embodiment will be described. A sectional view of a cell in the embodiment is shown in FIG. 42. In the embodiment, while a nitride film as a BL tunnel film is formed across a channel region so as to cover part of diffused layers, an operation similar to the first embodiment can be obtained by connecting a dataline to a drain.

Figure 45:
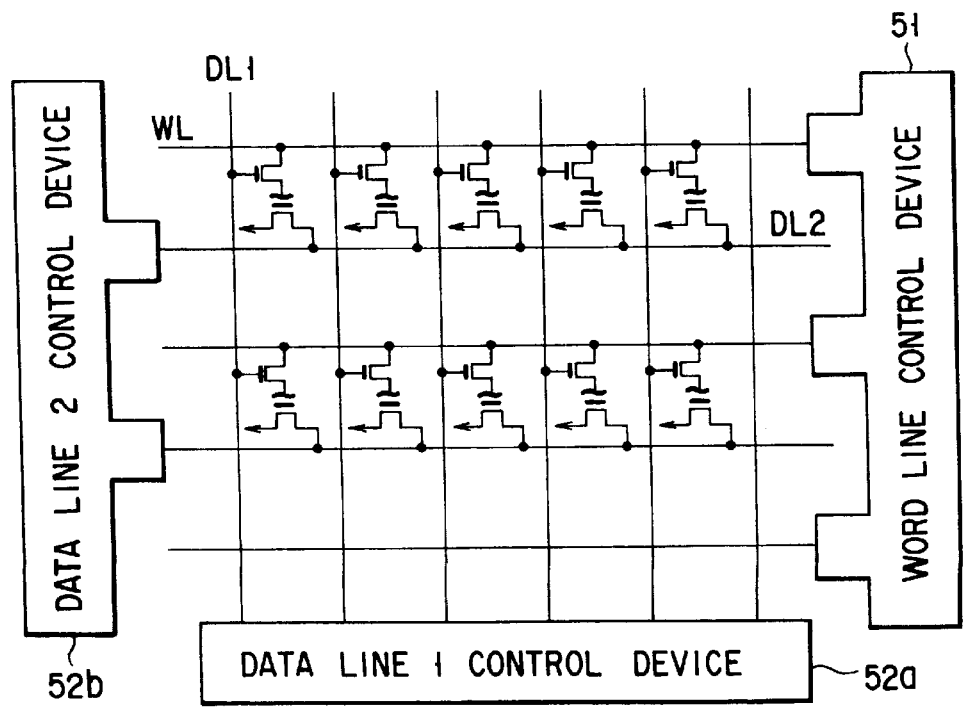
FIG. 45 is a diagram of a circuit constitution of the third to sixth embodiments according to the aspect E of the present invention.
Figure 44A:
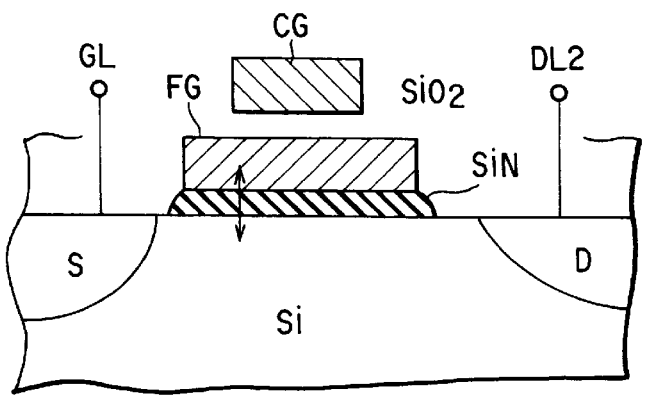
FIGS. 44A and 44B are sectional views of a structure of a cell of a third embodiment according to the aspect E of the present invention.
Figure 44B:
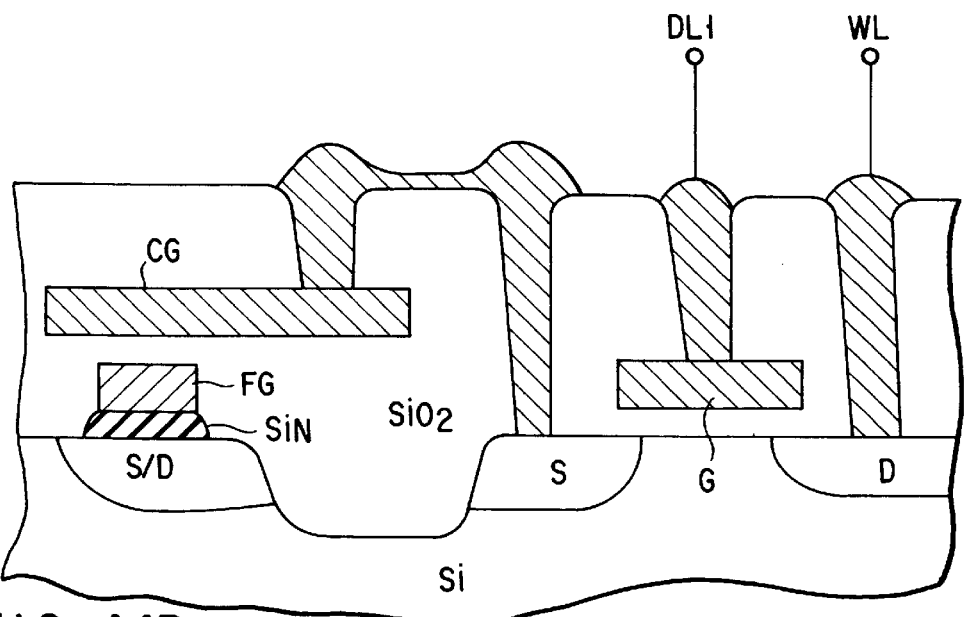
Figure 46:
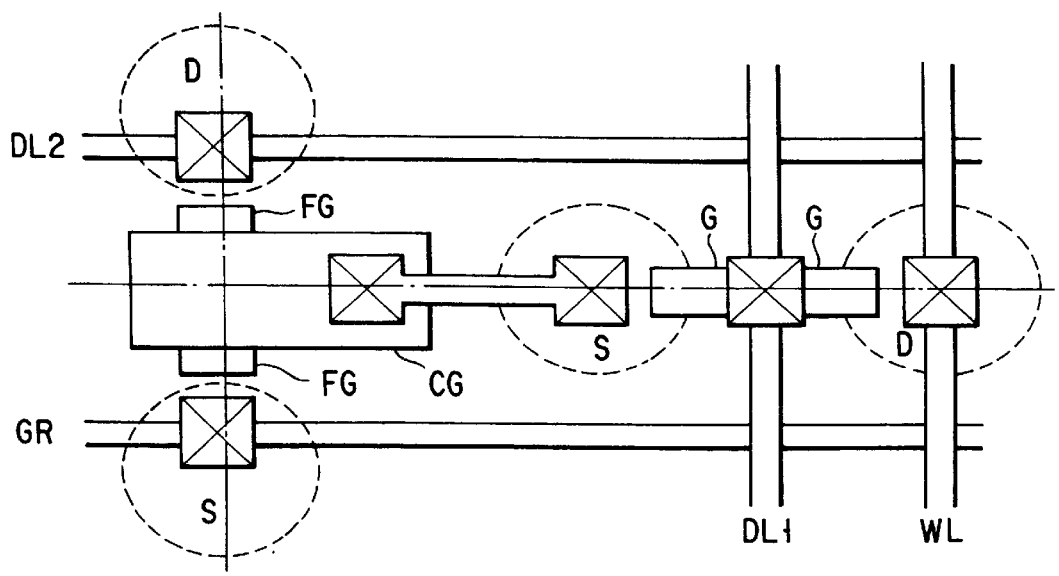
FIG. 46 is a plan view of cells according to a structure of the third and fourth embodiments according to the aspect E of the present invention.

A third embodiment will be described. In FIG. 44A, a sectional view of a cell is shown. A nitride film as a BL tunnel film is formed on a channel region of a substrate and a charge is exchanged between a floating gate and the channel region by BL tunneling to control a threshold voltage. In the embodiment, it is necessary that a MOS transistor connecting the wordline is used together, and two kinds of wordline (DL1, DL2) are necessary as is shown in FIG. 44B. The wordline WL and the dataline DL1 are respectively connected to the drain and gate of the MOS transistor. The source of the MOS transistor is connected to a control gate CG and when a voltage applied to the dataline DL1 is larger than a threshold voltage of the MOS transistor, an alternating current voltage (V0+V1cos $\omega$t) applied to the wordline WLO is applied to the control gate CG. To the contrary, when the voltage applied to the dataline DL1 is smaller than the threshold voltage, the control gate CG and the wordline WL are cut off. When a vibration frequency of an alternating voltage is larger than a threshold vibration frequency ($\omega > \omega_T$) and V0>0, electrons are injected from the channel region to the floating gate FG by EL tunneling and a write state is assumed. To the contrary, if V0<0, an erase state is assumed. The source and drain of FIG. 44A are respectively connected to a ground line GL and the dataline DL2. A read state is realized in such a manner that a voltage higher than a threshold voltage of the MOS transistor is applied on the dataline DL and a proper direct current voltage is applied on the wordline WL and it is read by a sense amplifier in a dataline 2 control (see FIG. 45) whether or not a current flows in the dataline DL2. In FIG. 46, a view of the structure of FIGS. 44A and 44B as seen from thereabove is shown. A sectional view taken along a broken line corresponds to FIGS. 44A and 44B. FIG. 45 is a view showing a circuit constitution corresponding to the embodiment.

Figure 47A:
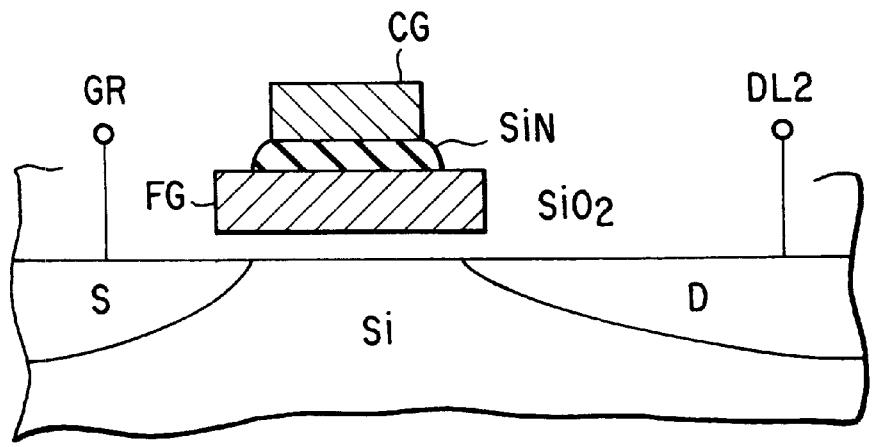
FIGS. 47A and 47B are sectional views of a structure of a cell of the fourth embodiment according to the aspect E of the present invention.
Figure 47B:
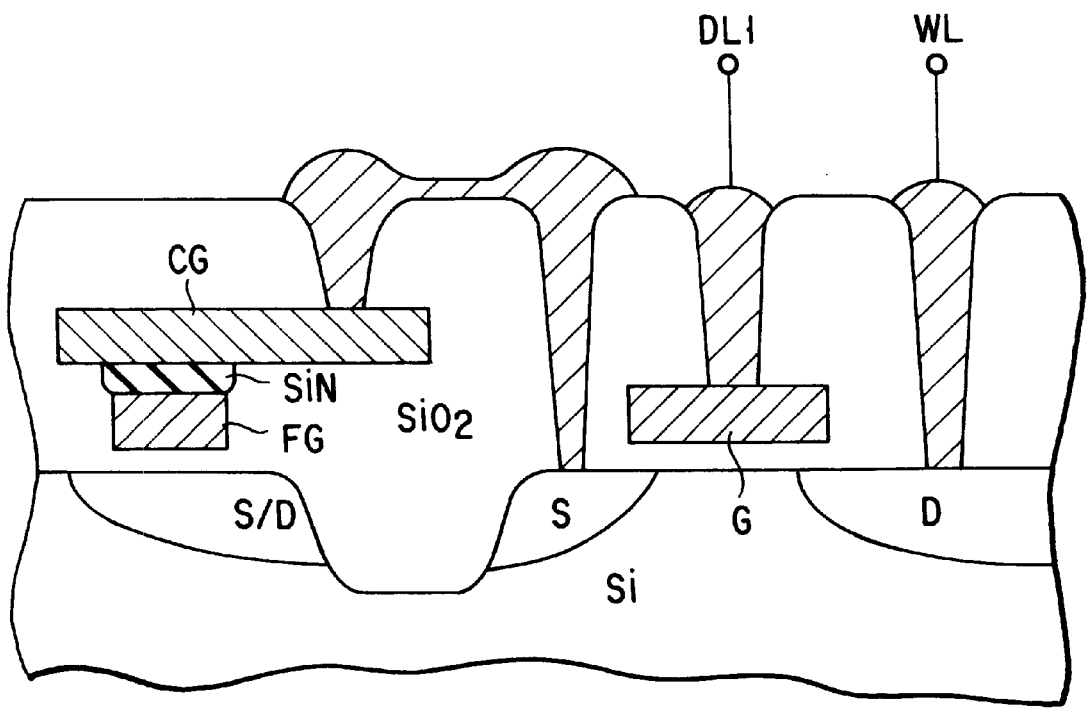

A fourth embodiment will be described. FIGS. 47A and 47B show sectional views of a cell. A nitride film as a BL tunnel film is fabricated between a control gate CG and a floating gate FG as is in the embodiment and a charge is exchanged between both gates by BL tunneling and thereby a non-volatile memory device having a similar function to the third embodiment can be realized.

Figure 48A:
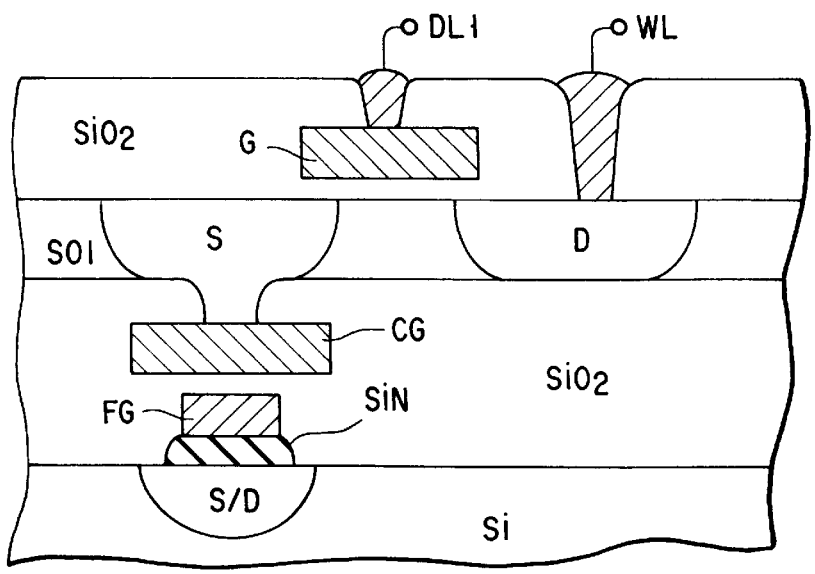
FIGS. 48A and 48B are sectional views of a structure of a cell of a fifth embodiment according to the aspect E of the present invention.
Figure 48B:
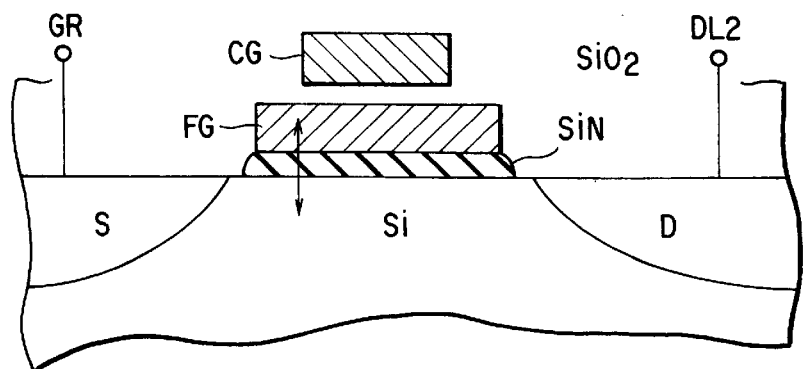
Figure 49:
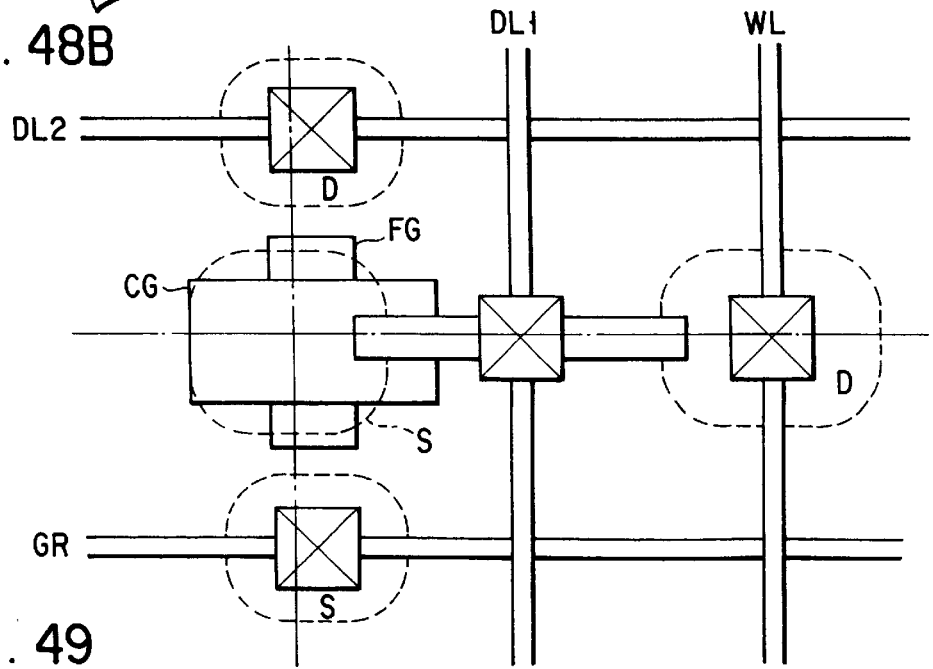
FIG. 49 is a plan view of a structure of the fifth and sixth embodiments according to the aspect E of the present invention.

A fifth embodiment will be described. The MOS transistor used in the third embodiment can be transformed so as to have a stacking structure by use of an SOI technique. A sectional view of a cell of the embodiment is shown in FIGS. 48A and 48B. FIG. 49 is a view of the structure of FIGS. 48A and 48B as seen from thereabove and a sectional view taken along a broken line corresponds to FIGS. 48A and 48B. A circuit constitution is similar to that of FIG. 45.

Figure 50A:
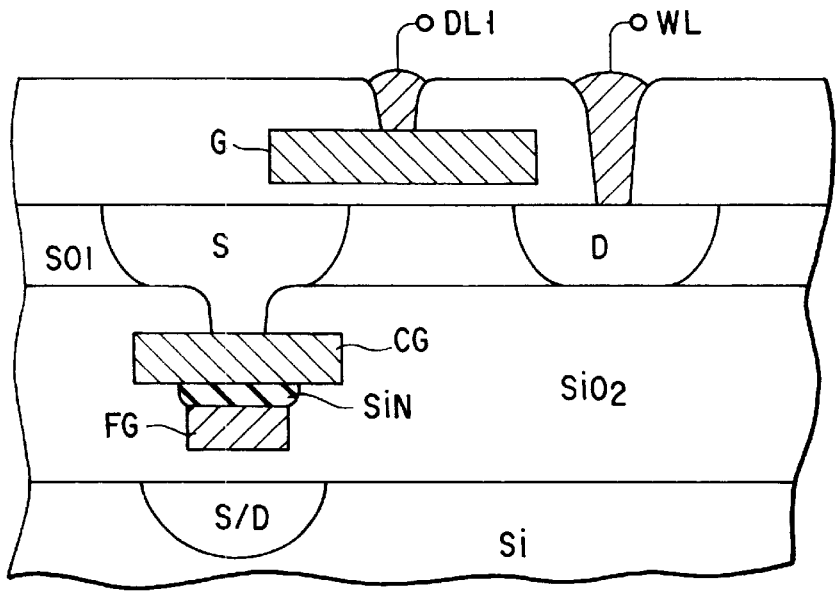
FIGS. 50A and 50B are sectional views of a structure of a cell of the sixth embodiment according to the aspect E of the present invention.
Figure 50B:
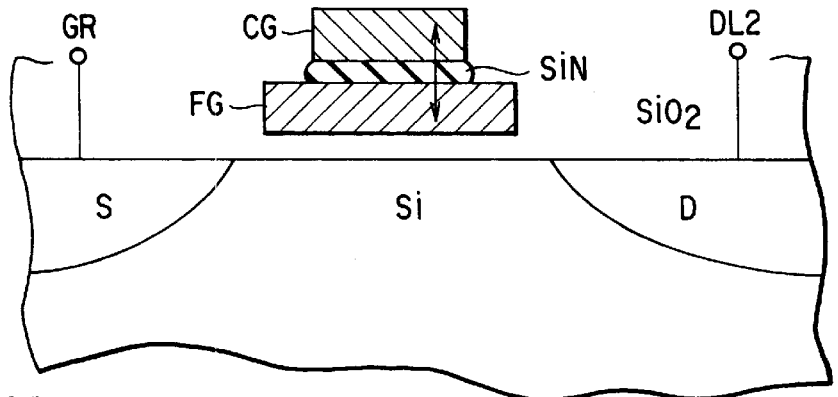

A sixth embodiment will be described. A MOS transistor used in the fourth embodiment can be transformed so as to have a stacking structure by use of the SOI technique. A sectional view of a cell is shown in FIGS. 50A and 50B. FIG. 49 is a view of the structure of FIGS. 50A and 50B as seen from thereabove and a sectional view taken along a broken line corresponds to that of FIGS. 50A and 50B. A circuit constitution is similar to that of FIG. 45.

[Embodiment of the Aspect F of the Present Invention]

A fundamental constitution of the aspect F of the present invention will first be described.

The aspect F is directed to a new type of a semiconductor analogue/digital conversion device, which comprises plural switching devices using BL tunneling as an operational principle, and which has a feature that plural switching devices are used for one word. As materials of the element, those described in the aspects A and B of the present invention are applied to the aspect F. As desired embodiments, the followings are shown.

Figure 51:
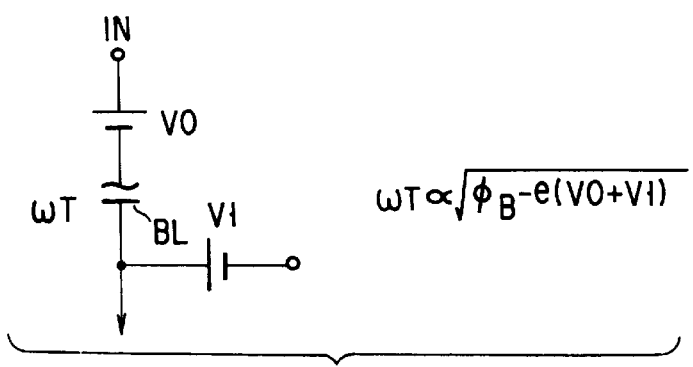
FIG. 51 is a representation showing a principle of a BL tunnel element used in an analogue/digital conversion device according to the aspect F of the present invention.

In FIG. 51, an operational principle of a BL tunnel element is shown. The BL tunnel element has a threshold vibration frequency $\omega_T$ as a threshold value for an alternating current input. When an alternating current voltage with a vibration frequency $\omega$ as an input is applied, a direct current is made to flow if $\omega > \omega_T$ ("1", or a state that an alternating current is not made to flow) and a direct current is not made to flow if $\omega < \omega_T$ ("0", or a state that an alternating current is made to flow). As shown in FIG. 51, when a voltages V0, V1 are applied, a threshold vibration frequency $\omega_T$ is controlled so that the frequency is proportional to a value obtained by the following expression:

$$[\phi_B - e(V0 + V1]^{1/2}$$

where $\Phi_B$ is a height of a potential barrier of a tunnel film present in the BL tunnel element.

Figure 52:
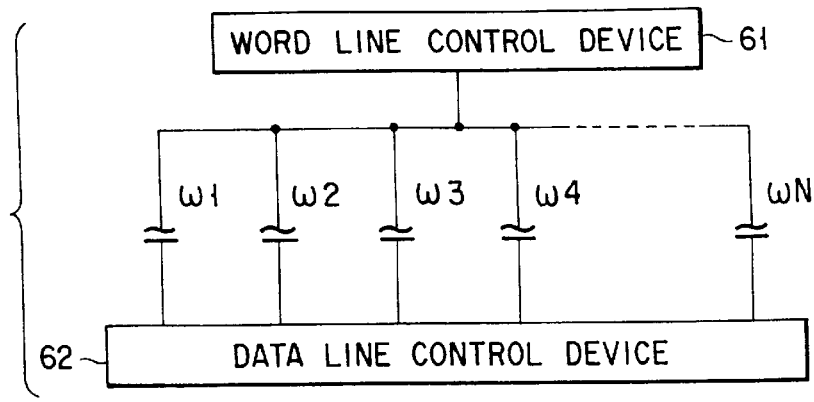
FIG. 52 is a representation showing a principle of an analogue/digital conversion device using a BL tunnel element according to the aspect F of the present invention.

In FIG. 52, an analogue/digital conversion device constructed with the BL tunnel elements which are in parallel connected is shown. A BL tunnel element which is used herein may be either of a two terminal type and a three terminal type. The BL tunnel elements respectively have threshold vibration frequencies $\omega_1, \omega_2, \omega_3, \omega_4, \ldots, \omega_N$ and threshold vibration frequencies can independently be controlled by adjusting V1 of FIG. 51 by use of a dataline control device 62.

The case where N=2 will be considered. When $\omega_1<\omega_2$, an input signal $\omega$ satisfies one of conditions of $\omega<\omega_1$, $\omega_1<\omega<\omega_2$, $\omega_2<\omega$. In this case, an output is (00) if $\omega<\omega_1$, an output is (10) if $\omega_1<\omega<\omega_2$, and an output is (11) if $\omega_2<\omega$. When $\omega_1>\omega_2$ an output is (01) if $\omega_1>\omega>\omega_2$. In such a manner, converted digital information pieces of (00), (01), (10), (11) can be obtained by use of the analogue/digital conversion device. In general, a combination of N analogue quantities ($\omega$ and (N−1) V1s) is converted to $2^N$ digital information pieces (0/1 sequence).

Embodiments of the aspect of F of the present invention will be described.

Figure 53:
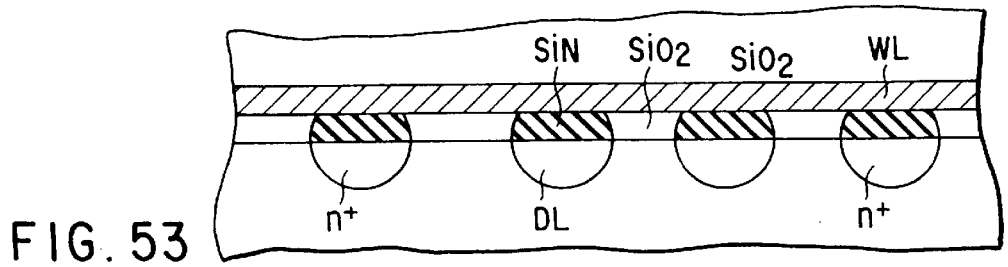
FIG. 53 is a sectional view of a structure of an element of a first embodiment according to the aspect F of the present invention.

A first embodiment will first be described. A sectional view illustrating the embodiment is shown in FIG. 53. Narrow, long diffused layers are formed in a substrate to provide parallel fine wires as datalines DL are fabricated. An oxide film as an insulating film is formed on the fine wires and a wordline WL is formed so that it intersects the parallel fine wires orthogonally. A nitride film as a tunnel film is formed at a point where a wordline WL and a dataline DL intersect in a vertically spaced manner.

Figure 54:
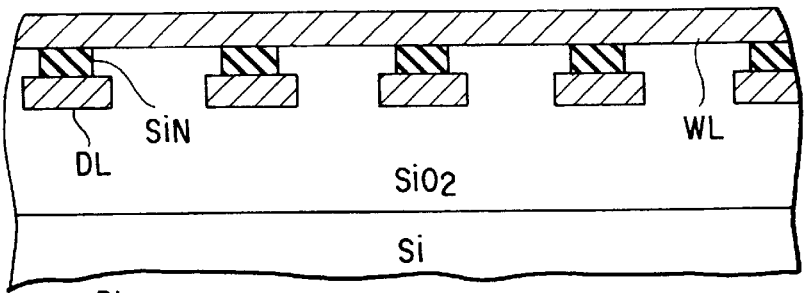
FIG. 54 is a sectional view of a structure of an element of a second embodiment according to the aspect F of the present invention.

A second embodiment will be described. A sectional view illustrating the embodiment is shown in FIG. 54. Parallel fine wires as datalines DL are formed in an oxide film and a wordline WL is formed so as to intersect the parallel fine lines orthogonally. A nitride film as a tunnel film is formed at a point where a dataline DL and a wordline WL intersect in a vertically spaced manner. In the embodiment, it is shown that a D/A conversion device can be formed on an oxide film which is fabricated for coating an integrated circuit formed on a silicon substrate.

Figure 55:
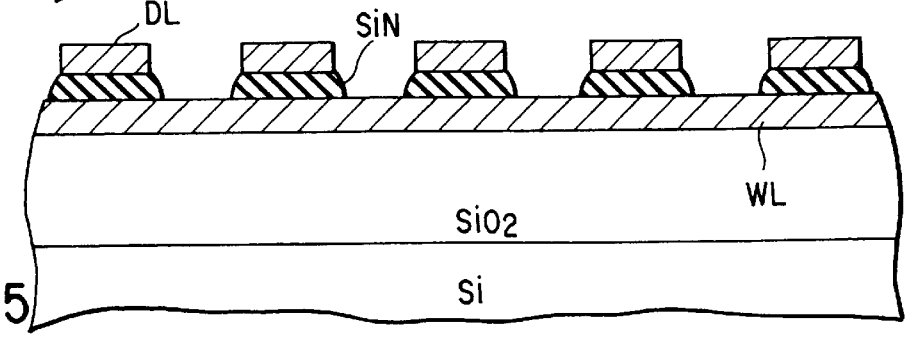
FIG. 55 is a sectional view of a structure of an element of a third embodiment according to the aspect F of the present invention.

A third embodiment will be described. A sectional view illustrating the embodiment is shown in FIG. 55. A wordline WL is formed in an oxide film and parallel fine wires as datalines DL are formed so as to intersect the wordline WL orthogonally. A nitride film as a tunnel film is formed at a point where a dataline DL and a wordline WL intersect in a vertically spaced manner. In the embodiment, it is shown that a D/A conversion device can be formed on an oxide film which is fabricated for coating an integrated circuit formed on a silicon substrate.

Figure 56:
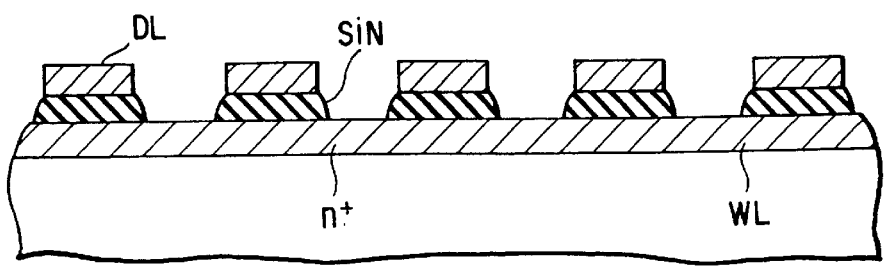
FIG. 56 is a sectional view of a structure of an element of a fourth embodiment according to the aspect F of the present invention.

A fourth embodiment will be described. A sectional view illustrating the embodiment is shown in FIG. 56. A narrow, long diffused layer is formed as a wordline WL in a substrate. An oxide film as insulating film is formed on the wordline and parallel fine lines as a dataline DL are formed thereon. A nitride film as a tunnel film is formed at a point where a dataline DL and a wordline WL intersect in a vertically spaced manner.

A fabrication process for the nitride film is similar to that described in the aspect C of the present invention and thus description thereon is omitted.

[Embodiment of the Aspect G of the Present Invention]

A fundamental constitution of the aspect G of the present invention will first be described.

The aspect G is directed to a new type of a semiconductor frequency counter device having a feature to use plural switching devices using BL tunneling as an operational principle. As materials of the element, those described in the aspects A and B of the present invention are applied to the aspect G. As desired embodiments, the followings are shown.

Figure 57:
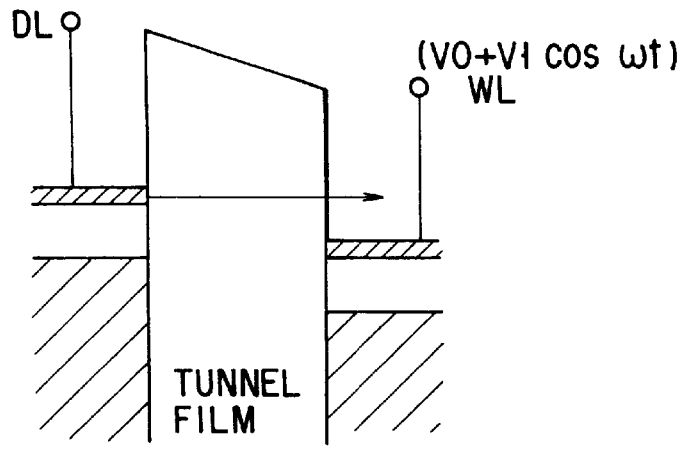
FIG. 57 is a band diagram of a two-terminal BL tunnel element used in a frequency counter device according to the aspect G of the present invention.

(a) A high frequency voltage is applied to gates provided at both ends of a tunnel film. A wordline and a dataline are respectively connected to the gates which are located on both side of the tunnel film. A corresponding band diagram is shown FIG. 57, a two-terminal BL tunnel element thus realized is shown in FIG. 58 and a frequency counter device using this BL tunnel element is shown in FIGS. 5–9.

Figure 60:
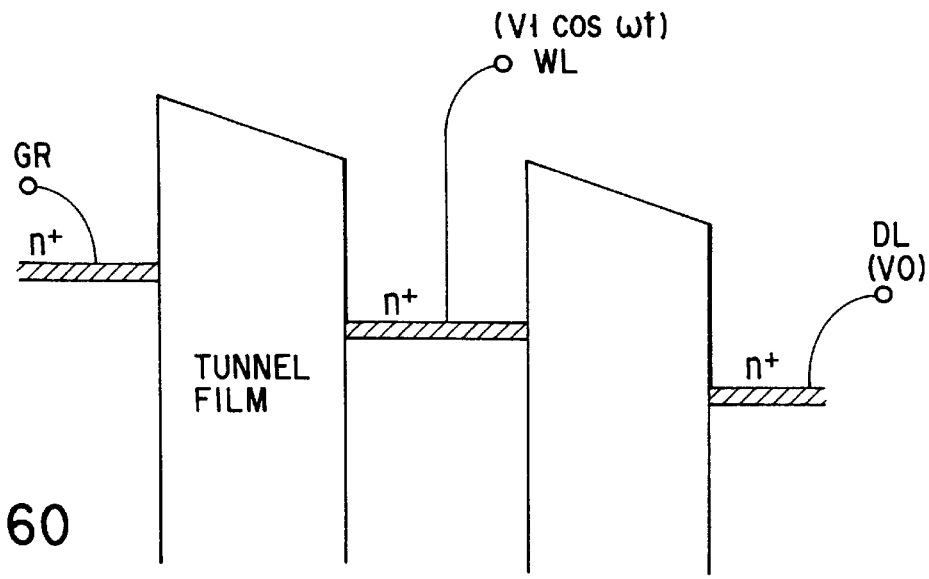
FIG. 60 is a band diagram of a three-terminal BL tunnel element used in a frequency counter device according to the aspect G of the present invention.

(b) A sandwich structure is provided in which two tunnel films, three gate electrodes are stacked, a wordline is connected to a central gate, and a dataline and a ground line are respectively connected to the outer two electrodes. A corresponding band diagram is shown in FIG. 60, a circuit diagram of a three terminal BL tunnel element realized by the structure is shown in FIG. 61 and a frequency counter device using the BL tunnel element is shown in FIG. 62.

A BL tunnel element has a threshold value $\omega_T$ which can be adjusted based on a kind of BL tunnel element and if a vibration frequency $\omega$ of an alternating voltage (V1cos$\omega$t) of an input applied on a wordline is larger than the threshold value $\omega_T$ ($\omega>\omega_T$) a tunneling probability is increased exponentially and to the contrary, if the vibration frequency $\omega$ of an alternating current voltage is smaller, a tunneling probability is kept small without any change.

Figure 58:
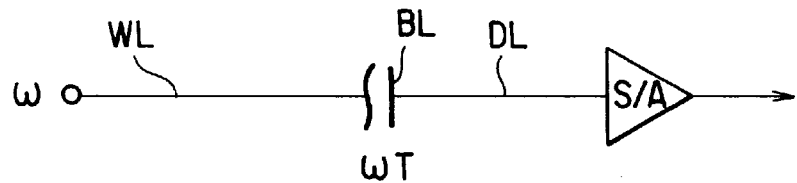
FIG. 58 is an equivalent circuit diagram of a two-terminal BL tunnel element used in a frequency counter device according to the aspect G of the present invention.
Figure 61:
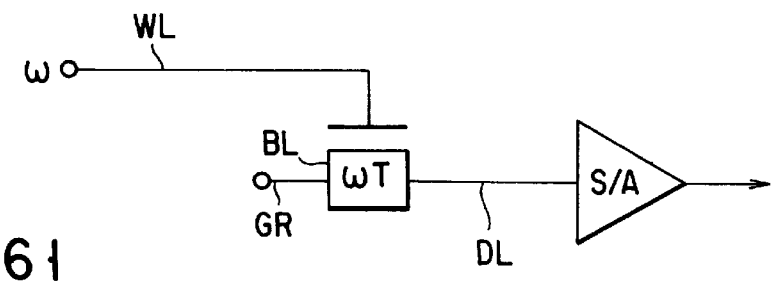
FIG. 61 is an equivalent circuit diagram of a three-terminal BL tunnel element used in a frequency counter device according to the aspect G of the present invention.

A high pass filter can be realized by use of only a single BL tunnel element as shown in FIGS. 58, 61. That is, a direct current flows in the tunnel film if $\omega>\omega_T$ and a direct current does; not flow in the tunnel film if $\omega<\omega_T$. The direct current is detected by a sense amplifier and "1" is given when a direct current flows and "0" is given when a direct current does not flow.

Figure 59:
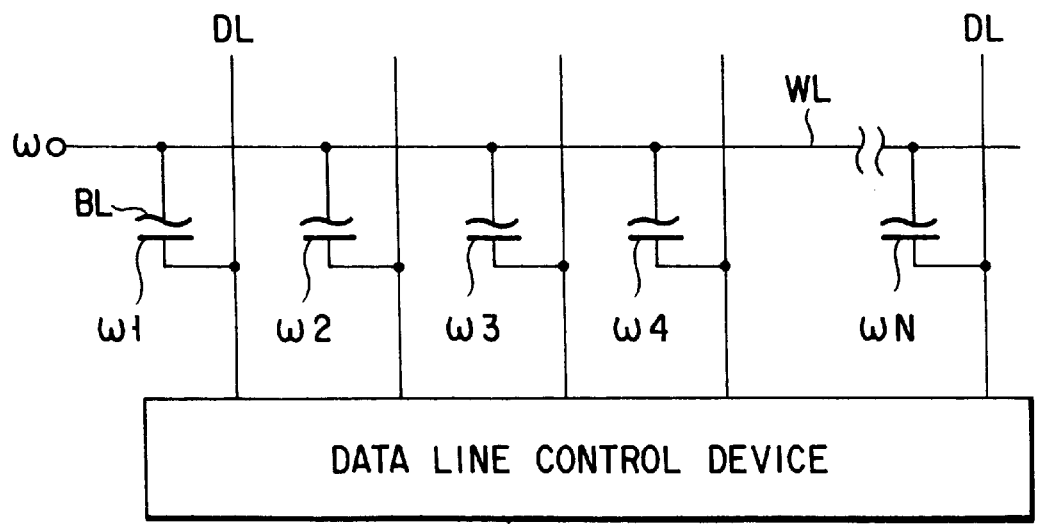
FIG. 59 is a diagram of a circuit constitution of a frequency counter device using a two-terminal BL tunnel element according to the aspect G of the present invention.
Figure 62:
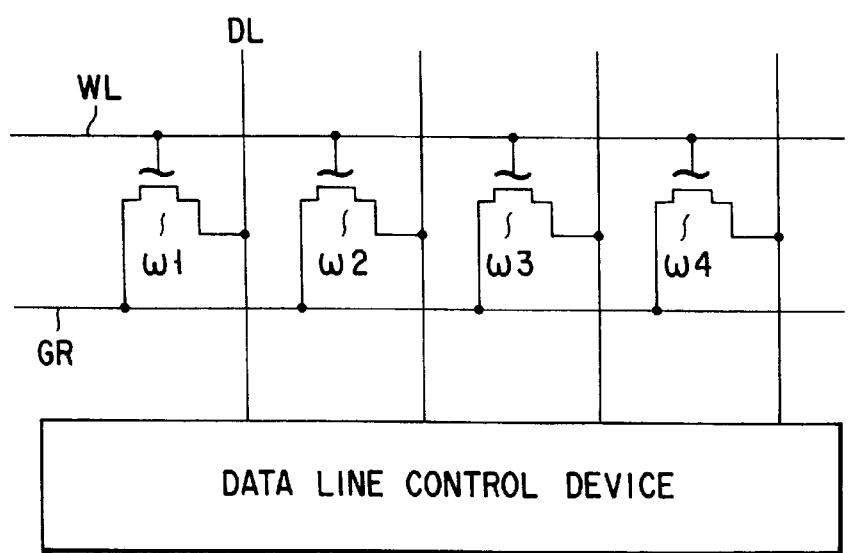
FIG. 62 is a diagram showing a constitution of a frequency counter device using EL three-terminal BL tunnel element according to the aspect G of the present invention.

As shown in FIGS. 59 and 62, N BL tunnel elements which respectively have different threshold values ($\omega_1<\omega_2<\omega_3<\omega_4<\ldots<\omega_N$) are arranged in order and connected to wordlines WL. Herein, if an input satisfies the relation $\omega_n<\omega<\omega_{n+1}$, an output comprises a sequence in which the left first to the left nth digits assume "1" only and the left n+1th digit and therefrom through the right end digit assume only "0", that is, a sequence of (111 ... 1000 ... 0) is obtained. If the number of BL tunnel elements is sufficiently increased and the difference between $\omega_n$ and $\omega_{n+1}$ is reduced, a frequency can be counted with good accuracy.

Embodiments of the aspect of G of the present invention will be described.

Figure 63:
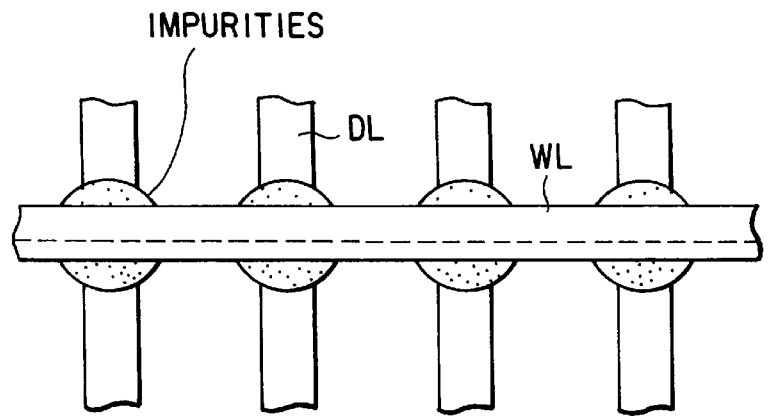
FIG. 63 is a plan view of constitution of an element of a first embodiments according to the aspect G of the present invention.
Figure 64:
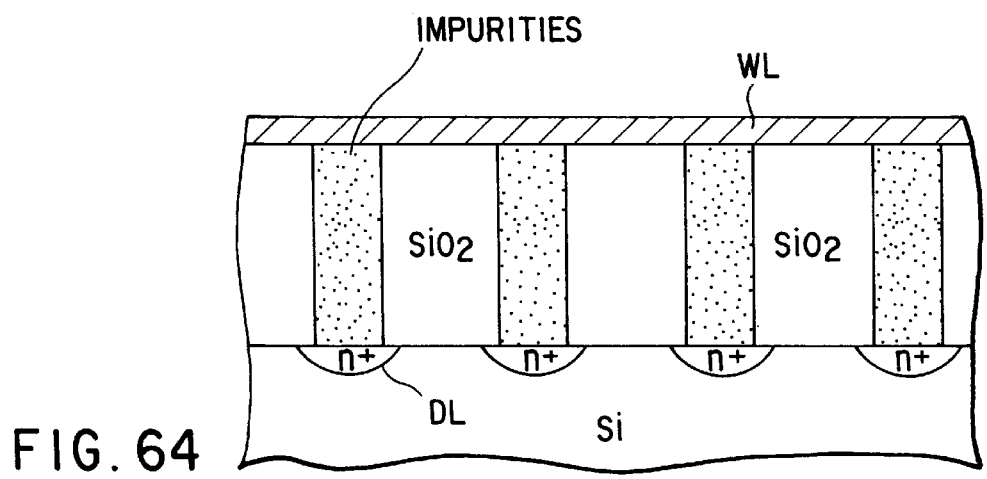
FIG. 64 is a sectional view of a structure of an element of the first embodiment according to the aspect G of the present invention.

A first embodiment will first be described. FIG. 63 is a view of a frequency counter device as seen from thereabove, and a sectional view taken along a dotted line of FIG. 63 is FIG. 64. Two-terminal BL tunnel elements are respectively formed in correspondence to tunnel films including an impurity each provided at an intersection of a wordline and a dataline, one element on one tunnel film. Threshold values are individually adjusted : nor each element by changing a quantity of an impurity and a kind thereof.

Figure 65:
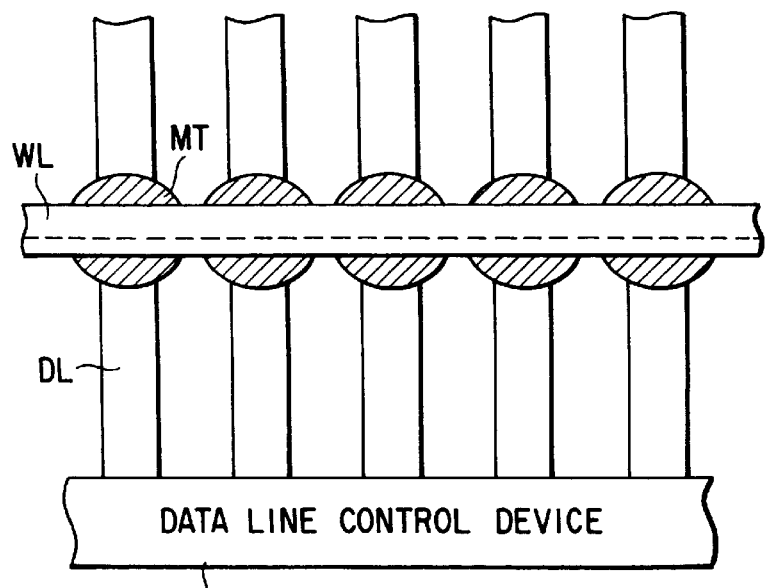
FIG. 65 is a plan view of constitution of an element of a second embodiment according to the aspect G of the present invention.
Figure 66:
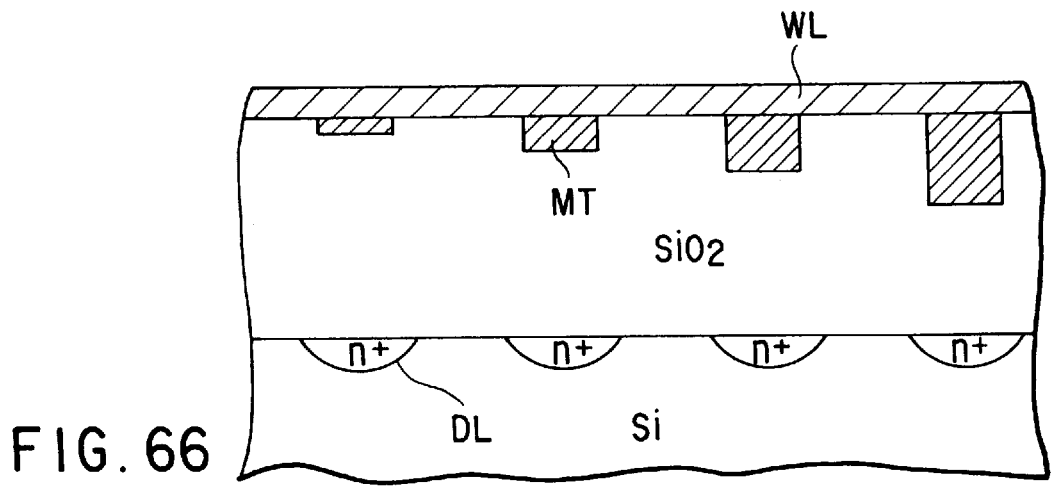
FIG. 66 is a sectional view of a structure of an element of the second embodiment according to the aspect G of the present invention.
Figure 67:
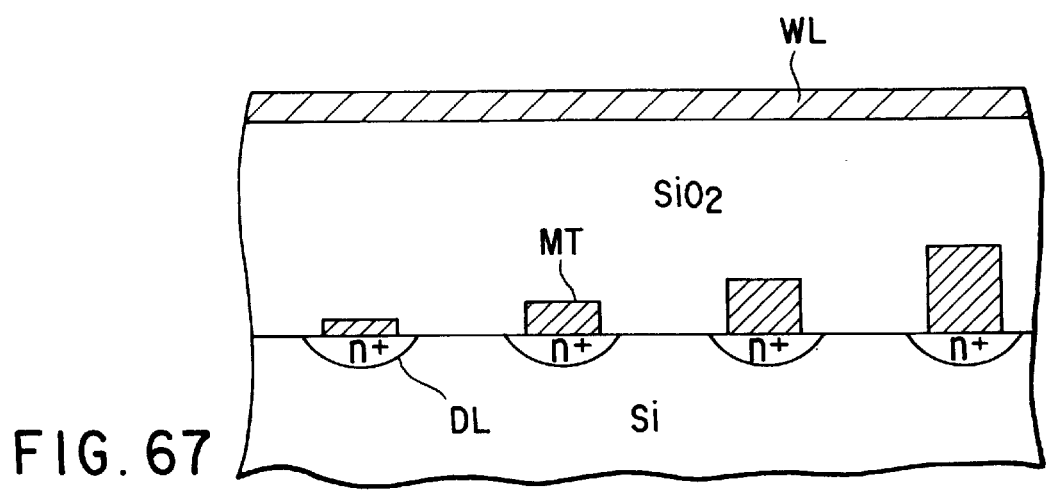
FIG. 67 is a sectional view of a structure of an element of the second embodiment according to the aspect G of the present invention.

A second embodiment will be described. FIG. 65 is a view of a frequency counter device as see from thereabove and a sectional views taken along a dotted line of FIG. 65 are FIGS. 66 and 67. A narrow, long diffused layer is formed in a substrate as a dataline DL and wordlines WL are formed on the diffused layer in such a manner that a tunnel film and an electrode MT like a matrix are sandwiched by a wordline WL and a dataline DL, so that two-terminal BL tunnel elements are fabricated in respective cells, one element in one cell. An oxide film is used as a tunnel film and a thickness of the oxide film is changed by utilizing the electrodes like a matrix to adjust a threshold.

Figure 68:
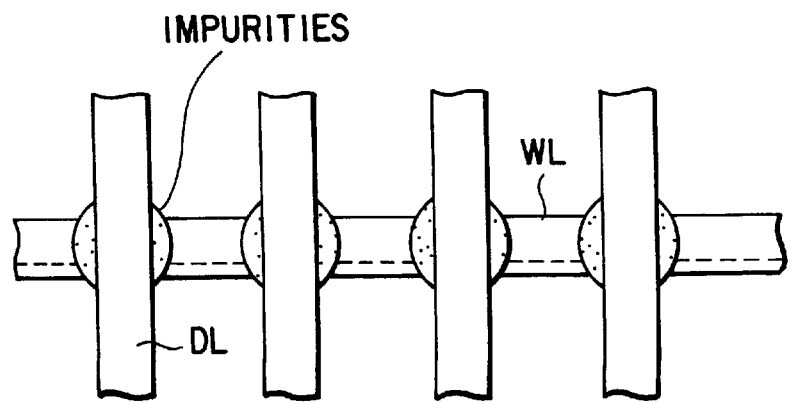
FIG. 68 is a plan view of constitution of an element of a third embodiment according to the aspect G of the present invention.
Figure 69:
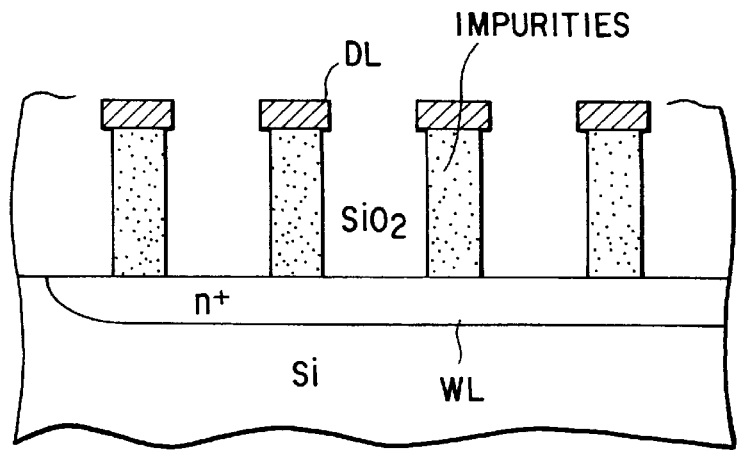
FIG. 69 is a sectional view of a structure of an element of the third embodiment according to the aspect G of the present invention.

A third embodiment will be described. FIG. 68 is a view of a frequency counter device as seen from thereabove and a sectional view taken along a dotted line is FIG. 69. Two-terminal BL tunnel elements are respectively formed corresponding to tunnel films including an impurity provided at intersections of wordlines WL and datalines DL, one element on one nitride film. Threshold values of respective elements are adjusted by changing a quantity and kind of an impurity for the elements.

Figure 70:
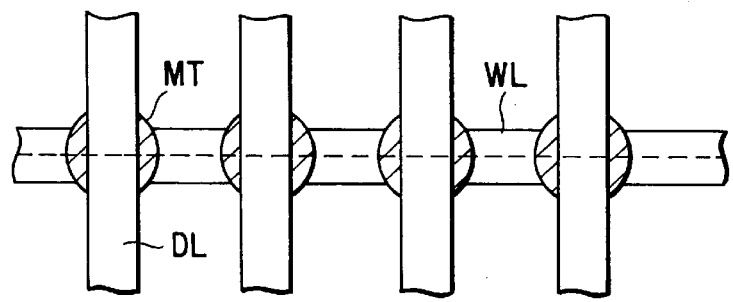
FIG. 70 is a plan view showing constitution of an element of a fourth embodiment according to the aspect G of the present invention.
Figure 71:
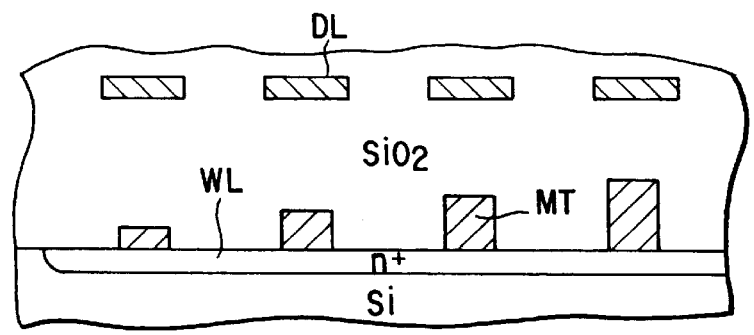
FIG. 71 is a sectional view of a structure of an element of the fourth embodiment according to the aspect G of the present invention.
Figure 72:
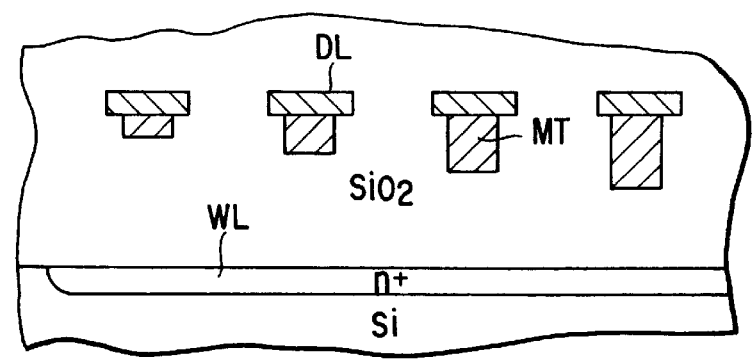
FIG. 72 is a sectional view of a structure of an element of the fourth embodiment according to the aspect G of the present invention.

A fourth embodiment will be described. FIG. 70 is a view of a frequency counter device as seen from thereabove and a sectional view taken along a dotted line is FIGS. 71 and 72. A narrow, long diffused layer is formed in a substrate as a wordline WL and a dataline is formed on the diffused layer in such a manner that a tunnel film and electrodes MT are sandwiched by a dataline DL and a wordline WL and two terminal BL tunnel elements each are formed in respective cells, one element in one cell. An oxide film is used as a tunnel film and a thickness of the oxide film is changed by an electrode MT like a matrix to adjust a threshold value.

Figure 73:
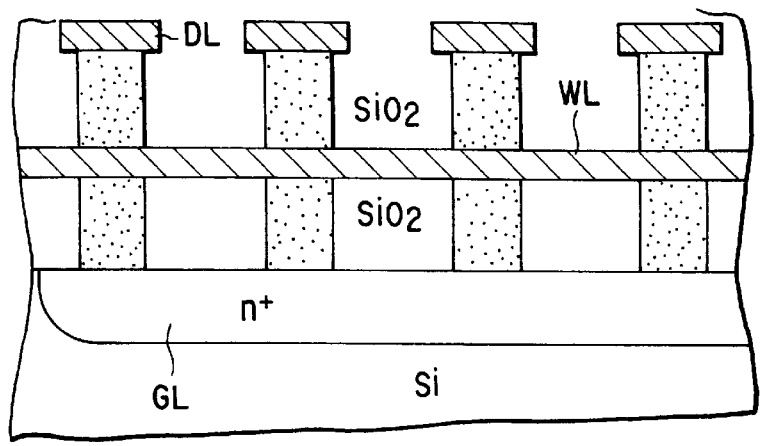
FIG. 73 is a sectional view of a structure of an element of a fifth embodiment according to the aspect G of the present invention.

A fifth embodiment will be described. A sectional view of a frequency counter device is shown in FIG. 73. A diffused layer is formed as a ground line GR in a substrate and a stacking structure composing of a tunnel film, a wordline WL, a tunnel film and a dataline DL is formed on the diffused layer. In such a manner, a three-terminal BL tunnel element is formed and a threshold value is adjusted by changing a quantity or kind of an impurity in a tunnel film.

Figure 74:
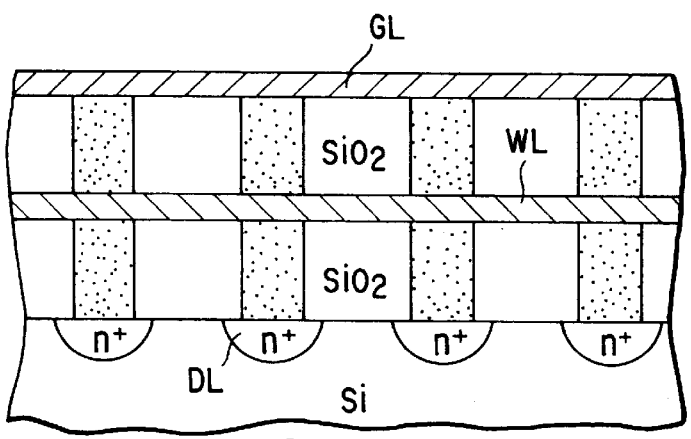
FIG. 74 is a sectional view of a structure of an element of a sixth embodiment according to the aspect G of the present invention.

A sixth embodiment will be described. A sectional view of a frequency counter device is shown in FIG. 74. A narrow, long diffused layer is formed in a substrate as a dataline DL and a stacking structure composed of a tunnel film, a wordline WL, a tunnel film and a ground line GL is formed on the dataline DL. In such a manner, three-terminal BL tunnel elements are formed in respective cells and a threshold value is adjusted by changing a quantity or kind of an impurity in a tunnel film.

Figure 75:
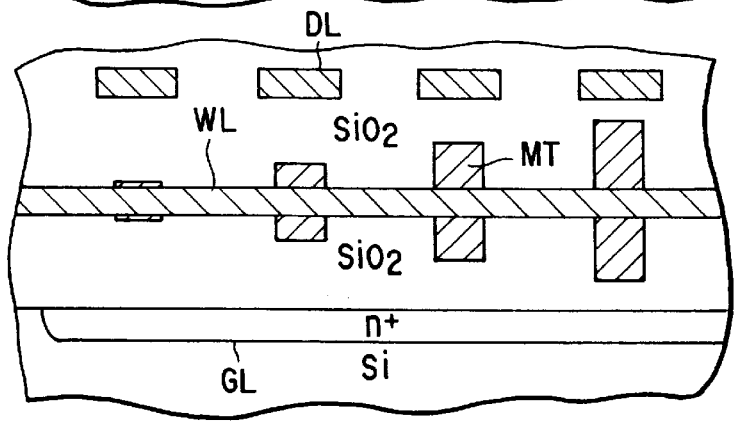
FIG. 75 is a sectional view of a structure of an element of a seventh embodiment according to the aspect G of the present invention.

A seventh embodiment will be described. A sectional view of a frequency counter device is shown in FIG. 75. A narrow, long diffused layer is formed in a substrate as a ground line GL and a stacking structure constructed with a tunnel film, a wordline WL, a tunnel film and a dataline DL is formed on the ground line GL. In such a manner, three-terminal BL tunnel elements are formed in respective cells and a threshold value is adjusted by changing a thickness of a tunnel film by an electrode like a matrix.

Figure 76:
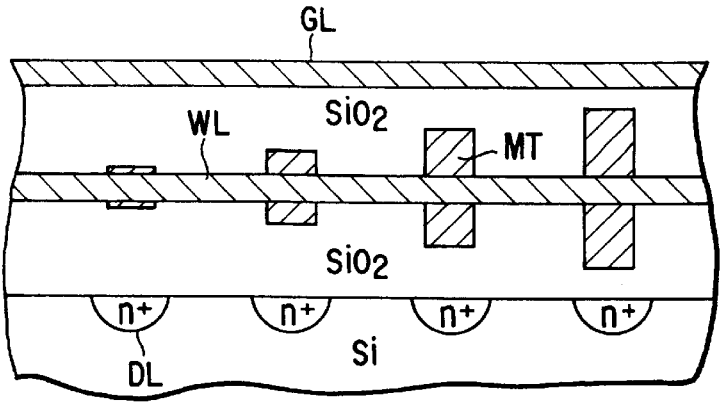
FIG. 76 is a sectional view of a structure of an element of an eighth embodiment according to the aspect G of the present invention.

A eighth embodiment will be described. A sectional view of a frequency counter device is shown in FIG. 76. A narrow, long diffused layer is formed in a substrate as a dataline DL and a stacking structure constructed with a tunnel film, a wordline WL, a tunnel film and a ground line GL is formed on the dataline DL. In such a manner, three-terminal BL tunnel elements are formed in respective cells and a threshold value is adjusted by changing a thickness of a tunnel film by an electrode like a matrix.

In applications of the aspects C to G of the present invention, since a semiconductor substrate is not necessarily required, the devices in the aspects have a feature that the devices can be formed in a film covering an ordinary integrated circuit formed on a substrate.

[Embodiment of the Aspect H of the Present Invention]

A fundamental constitution of the aspect H of the present invention will first be described.

The aspect H is directed to a new type of a read only memory device using a MOS type BL tunnel element, which utilizes BL tunneling. As materials of the element, those described in the aspects A and B of the present invention are applied to the aspect H. An oscillating circuit to produce an input signal is used together in order to directly operate switching. As desired embodiments, the followings are shown.

In a substrate, n +diffused layers corresponding to a source and drain are formed in silicon substrate and a thin insulating film is formed on a channel region between the source and drain and a gate electrode is formed thereon. Therefore, the structure has three terminals of a source, drain, gate and the terminals are respectively connected to a ground line (GL), a dataline (DL), a wordline (WL). Needless to say that GL and WL can be exchanged therebetween. A gate length may be longer or shorter as compared with a channel length. A high frequency alternating voltage is applied on the wordline WL and a current, which flows in the channel region, and which is caused by electrons of a BL tunnel effect, is adjusted by operating a vibration frequency of a direct current component of the alternating current voltage.

A MOS type BL tunnel element has a threshold vibration frequency wt predetermined by a structure of the element and a potential of the channel region can periodically be vibrated by an alternating current voltage ($V_G$=V1cos $\omega$t) applied to a gate. If a vibration frequency $\omega$ of an alternating current as an input is larger than the threshold vibration frequency $\omega_T$ ($\omega > \omega_T$), a tunneling probability is increased exponentially and a BL tunnel current can be operated by use of this nature.

Figure 77:
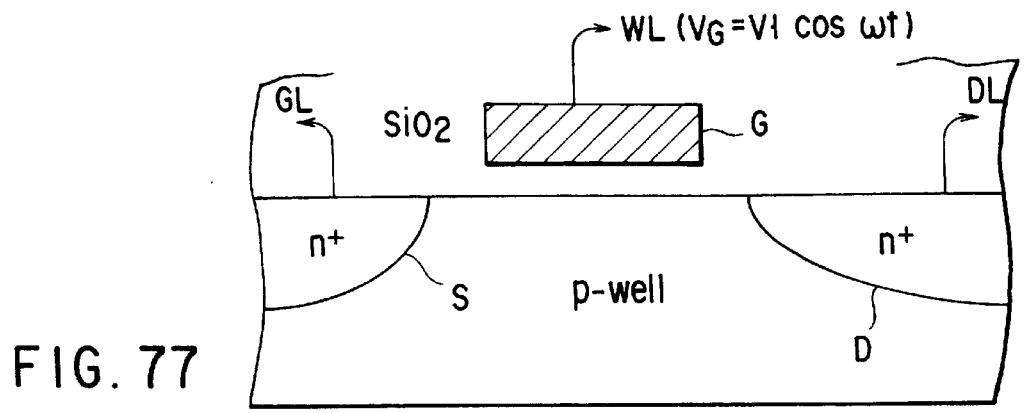
FIG. 77 is a sectional view of a structure of a cell of a MOS type BL tunnel element used in a read only memory device according to the aspect H of the present invention.

A sectional view of an element based on the structure is shown in FIG. 77. When a potential difference is given between the source and drain, wherein a higher potential is on the drain side, and a vibration frequency w of an alternating current applied to the gate is larger the threshold value ($\omega > \omega_T$) conduction electrons in the n⁺source region pass through a potential barrier of several hundreds meV created in the channel region and into a conduction band of the n⁺drain region by a BL tunnel effect and thus a BL tunnel current flows. To the contrary, in the conditions set above, if the vibration frequency a is smaller ($\omega < \omega_T$), the conduction electrons do not pass through and thus the current does not flow. An increment of a current between the source and drain by the BL tunneling is read by a sense amplifier. Since the current increment can be controlled exponentially by using factor $2\omega/\omega_o$, the element is suitable for development to a multiple value system.

The $\omega_T$ can be adjusted in advance according to a gate length or a channel length, a substrate, kinds of a gate and an insulating film and the like. Since a magnitude V1 of an alternating voltage applied can be suppressed to a small value such that an inversion layer is not produced in a channel region, a margin in reliability of an insulating film can be obtained.

Embodiments of the aspect H of the present invention will be described.

Figure 78:
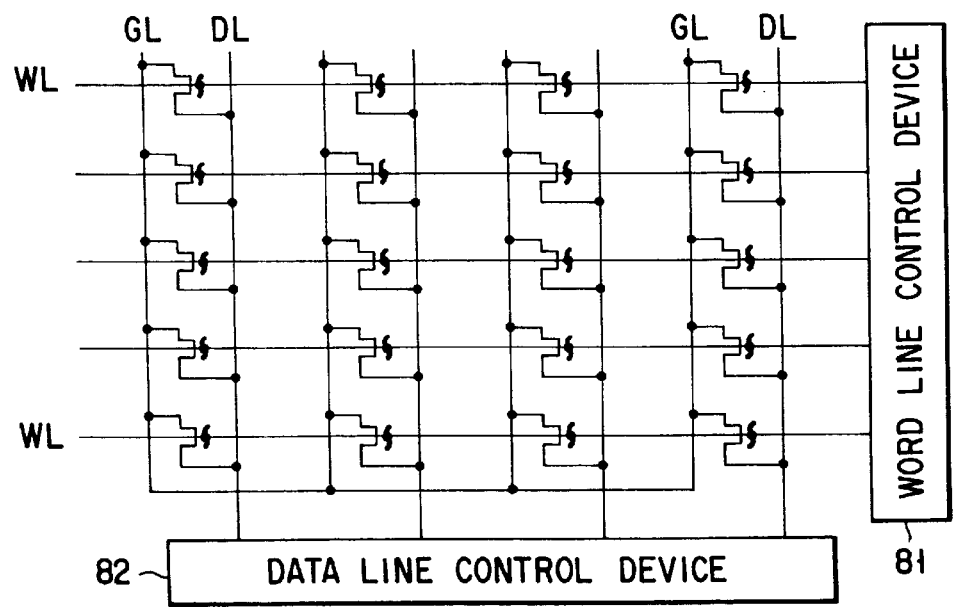
FIG. 78 is a diagram of a circuit constitution of a read only memory device using a MOS type BL tunnel element according to the aspect H of the present invention.

In FIG. 78, there is shown a circuit diagram of a read only memory device which utilizes a MOS type BL tunnel element having a sectional view of a cell shown in FIG. 77 as a switching device. If an input vibration frequency of a wordline WL is in excess of a threshold value, a BL tunnel current flows between the source and drain. In the embodiment, a threshold value can be set in advance in a step of a fabrication process according to a gate length or a channel length, an insulating film, kinds of a gate and a substrate and the like.

Figure 79:
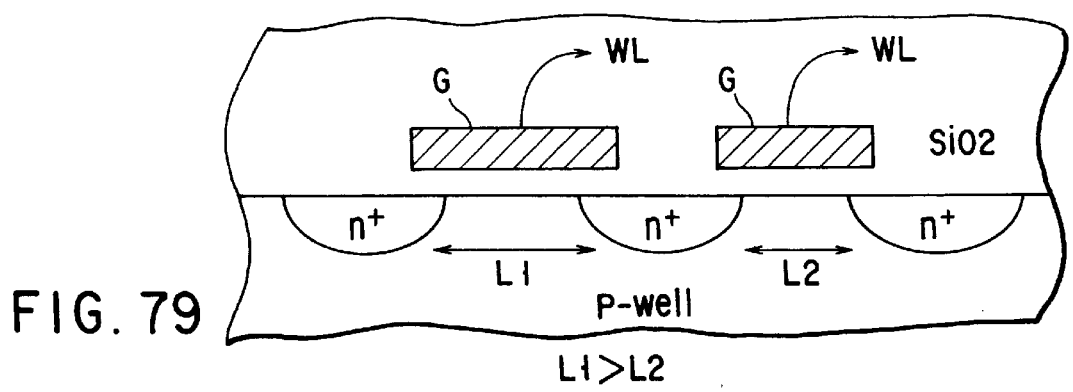
FIG. 79 is a view showing an example of structure in the case of a binary read only memory device using a MOS type BL tunnel element used according to the aspect H of the present invention.

In FIG. 79, the case where two values of 0/1 are used is shown. In the embodiment, two kinds of length (L1, L2 ) of a superposed portion between a gate and channel are set and thereby two threshold vibration frequencies are employed.

In an actual operation, when a vibrating voltage is applied only on a wordline WL selected by a wordline control device 81, a current flows only in a dataline DL connected to a cell in a conductive condition. The current is read by a sense amplifier in a dataline control device 82.

Since a quantity of a BL tunnel current changes exponentially if a threshold vibration frequency is changed, the device is suitable for development to a multiple value system.

[Embodiment of the Aspect I of the Present Invention]

A fundamental constitution of the aspect I of the present invention will first be described.

The aspect I is directed to a new type of a dynamical random access memory device using a MOS type BL tunnel element which utilizes BL tunneling. As materials of the element, those described in the aspects A and B of the present invention are applied to the aspect I. An oscillating circuit to produce an input signal is used together in order to directly operate switching. As desired embodiments, the followings are shown.

One three-terminal MOS type BL tunnel element is used in each cell and a high frequency alternating current voltage is applied to a gate electrode connected to a wordline. Two n+diffused layers are formed in a cell substrate, one of the diffused layers is connected to a ground line with a capacitor interposing therebetween and the other is connected to a dataline. The wordline is controlled by a wordline control device and a dataline is controlled by a dataline control device.

A MOS type BL tunnel element which constitutes part of the structure has a threshold vibration frequency $\omega_T$ which is be controllable by adjusting an insulating film, a substrate, a gate structure, a gate length and a channel length, and a potential of the channel region can periodically be vibrated by an alternating voltage (VG=V1cos $\omega$t) applied to a gate. If a vibration frequency c o of an alternating current as an input is larger than the threshold vibration frequency $\omega_T$ ($\omega>\omega_T$), a tunneling probability is increased exponentially and thus a BL tunnel current flows, and if the vibration frequency $\omega$ of an alternating current is smaller, the BL tunnel current does not flow. The dataline and the capacitor are connected and the quantity of charges is adjusted by use of this nature. Since an inversion layer is not required to be formed in the channel region, no problem arises even if a magnitude of an alternating current voltage |V1| applied to a gate is small. Therefore, a margin in reliability of an insulating film is obtainable.

Embodiments of the aspect I will be described.

Figure 80:
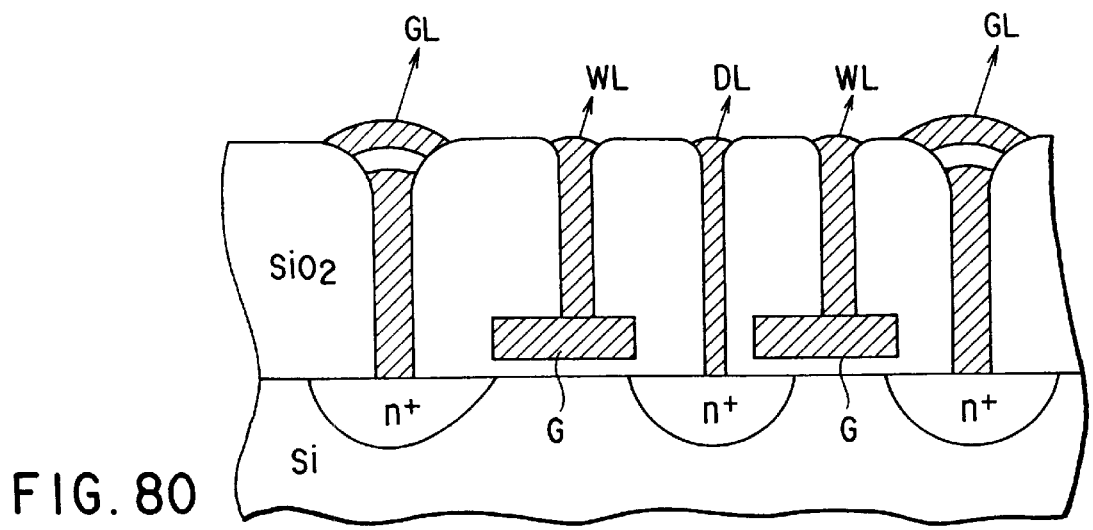
FIG. 80 is a sectional view showing a structure of a dynamical random access memory device using a MOS type BL tunnel element according to the aspect I of the present invention.
Figure 81:
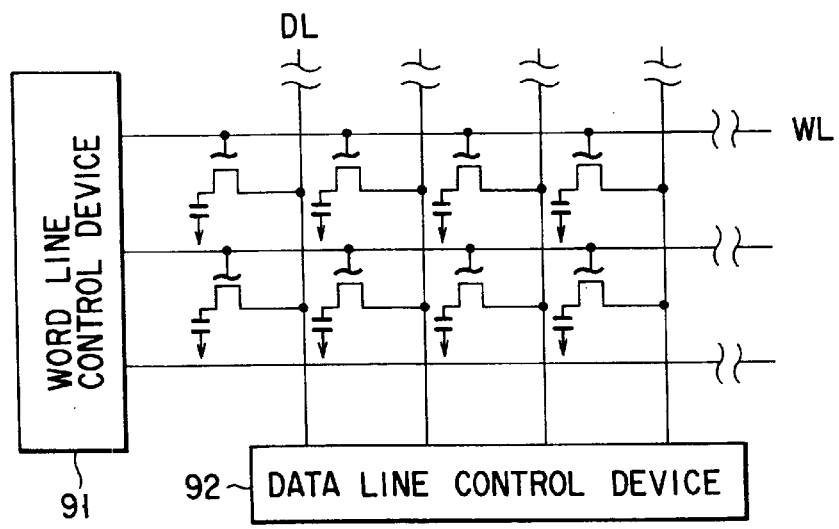
FIG. 81 is a diagram of a circuit constitution of a dynamical random access memory device using a MOS type BL tunnel element according to the aspect I of the present invention.

A sectional view of a dynamical random access memory device using a MOS type BL tunnel element is shown in FIG. 80. In the embodiment, BL tunneling is produced by periodically vibrating a potential of a channel region between n+diffused layers by an alternating voltage applied to a gate G from a wordline WL, and a dataline and a capacitor, which is connected to a ground line, are conductive therebetween without use of an inversion layer. A circuit diagram corresponding to the embodiment is shown in FIG. 81. The dataline DL is controlled by a dataline control device 92 and the wordline WL is controlled by a wordline control device 91.

[Embodiment of the Aspect J of the Present Invention]

A fundamental constitution of the aspect J of the present invention will first be described.

The aspect J is directed to a new type of an analogue/digital conversion device using plural MOS type BL tunnel elements for one word, which element utilizes a BL tunnel effect. As materials of the element, those described in the aspects A and B of the present invention are applied to the aspect J. As desired embodiments, the followings are shown.

Figure 82:
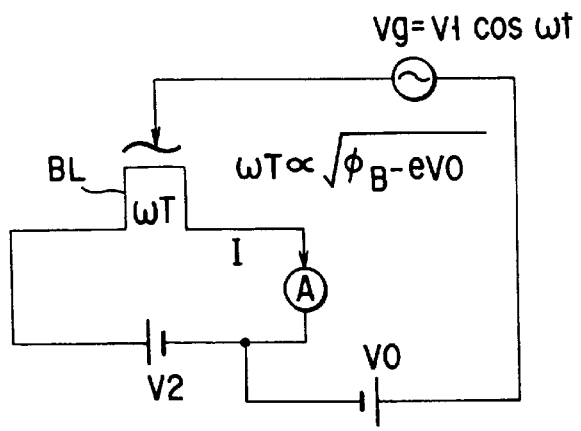
FIG. 82 is a diagram of a circuit constitution of a MOS type BL tunnel element used in an analogue/digital conversion device according to the aspect J of the present invention.

An operational principle of the MOS type BL tunnel element is shown in FIG. 82. The BL tunnel element has a threshold vibration frequency $\omega_T$ as a threshold value for an alternating input. When an alternating voltage with a vibration frequency $\omega$ is applied to a gate as an input, a direct current is made to flow ("1" is given) if $\omega>\omega_T$ while a direct current is not made to flow if $\omega<\omega_T$ ("0" is given). As shown in FIG. 82, when a voltages V0 is applied, the threshold vibration frequency $\omega_t$ can be controlled so that the frequency is proportional to a value obtained by the following expression:

$$(\phi_B - eV0)^{1/2}$$

where $\phi_B$ is a remainder when an energy level of the bottom of the conduction band is subtracted by an energy of a conduction electron in an n+diffused layer.

Figure 83:
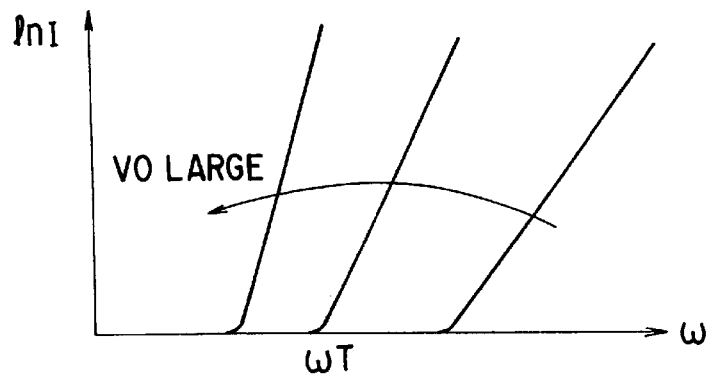
FIG. 83 is a graph showing electric characteristics of a MOS type BL tunnel element according to the aspect J of the present invention.
Figure 84:
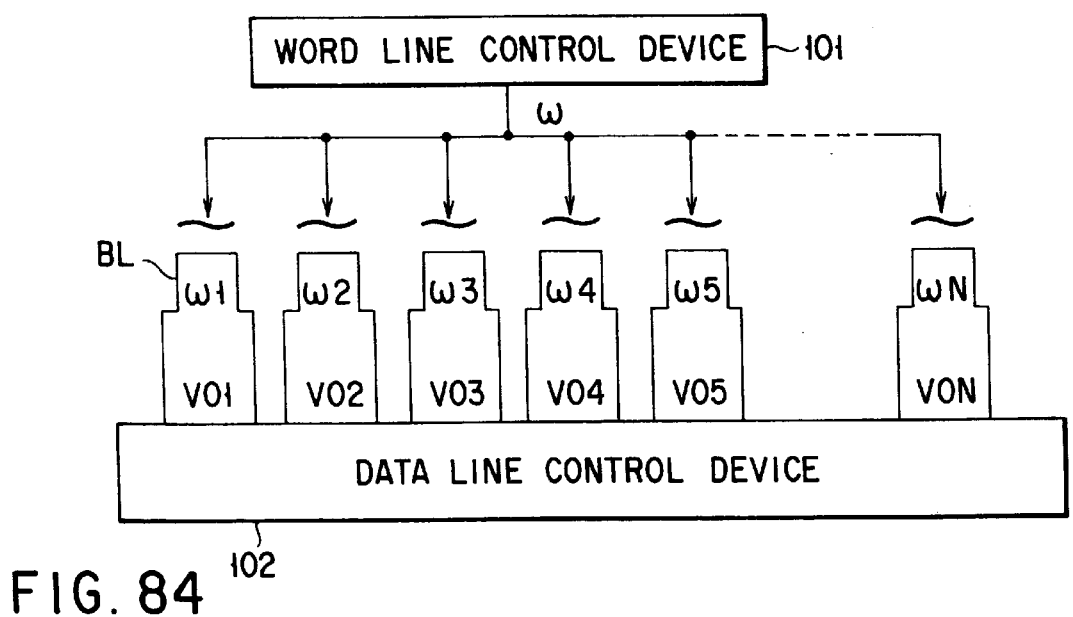
FIG. 84 is a diagram of a circuit constitution of an analogue/digital conversion device using a MOS type BL tunnel element according to the aspect J of the present invention.

FIG. 83 shows electric characteristics of a circuit shown in FIG. 82. There is shown in the graph a relation in which if V0 increases, a threshold vibration frequency $\omega_T$ decreases. In FIG. 84, there is shown an analogue/digital conversion device constructed by connecting the BL tunnel elements in parallel. The BL tunnel elements respectively have threshold vibration frequencies $\omega_1, \omega_2, \omega_3, \omega_4, \ldots \omega_N$ and the threshold vibration frequencies each are independently controlled by adjusting V0 of FIG. 82 by use of a dataline control device 102.

First of all, the case where N=2 is considered. If $\omega_1<\omega_2$ an input signal $\omega$ satisfies one of the following conditions: $\omega<\omega_1$, $\omega_1<\omega<\omega_2$, $\omega_2<\omega$. An output is given as (00) if $\omega<\omega_1$ an output is given as (10) if $\omega_1<\omega<\omega_2$ and an output is given as (11) if $\omega_2<\omega$. When $\omega_1>\omega_2$ by adjusting V0, an output is given as (01) if $\omega_1>\omega>\omega_2$. In such a manner, conversions to digital information pieces of (00), (01), (10) and (11) are achieved by use of the analogue/digital conversion device. In general, N combinations of analogue quantities ($\omega$ and N−1 V0s) are converted to $2^N$ digital information pieces (0/1 sequence). One of $V0_1$ to $V0_N$ can be grounded.

Embodiments of the aspect J of the present invention will be described.

Figure 85:
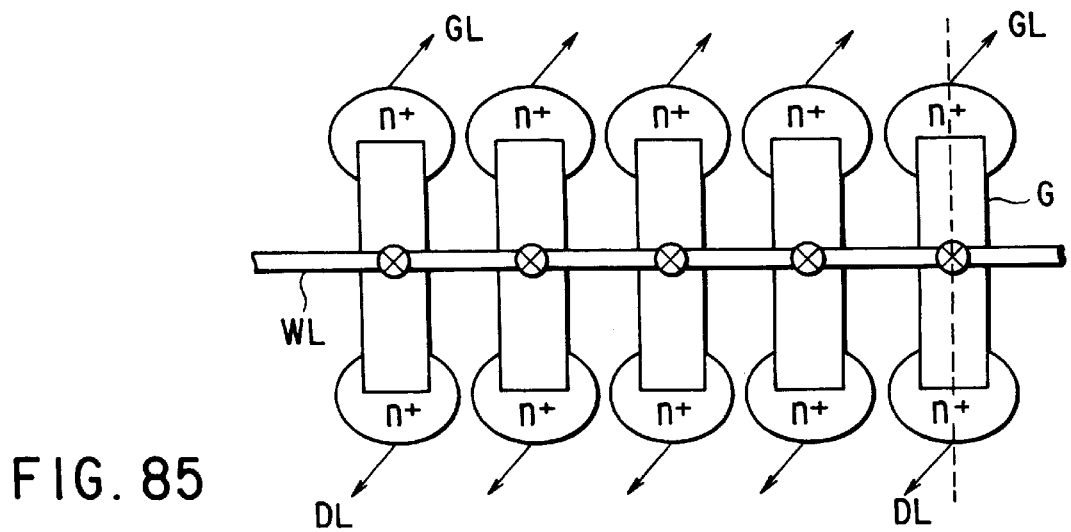
FIG. 85 is a plan view showing a structure of an analogue/digital conversion device using a MOS type BL tunnel element according to the aspect J of the present invention.
Figure 86:
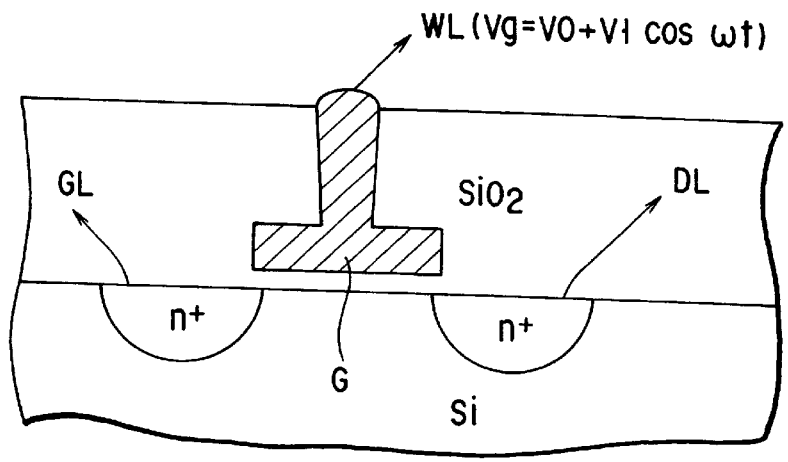
FIG. 86 is a sectional view showing a structure of an analogue/digital conversion device using a MOS type BL tunnel element according to the aspect J of the present invention.

Element structures of the embodiment are shown in FIGS. 85 and 86. FIG. 86 is a sectional view corresponding to a dotted line of FIG. 85. Not only is a wordline WL connected to a gate G, but one of n+diffused layers in each cell is connected to a ground line GL and the other is connected to a dataline DL. An alternating current voltage is applied on the wordline WL as part of an input from a wordline control device. A direct current voltage is applied on the dataline as part of an input from a dataline control device. A current flows ("1") if a cell is in the state of switch ON and a current does not flow ("0") if a cell is in the state of switch OFF.

[Embodiment of the Aspect K of the Present Invention]

A fundamental constitution of the aspect K of the present invention will first be described.

The aspect K is directed to a new type of a frequency counter device using plural MOS type BL tunnel elements, which element utilizes a BL tunnel effect. As materials of the element, those described in the aspects A and B of the present invention are applied to the aspect K. As desired embodiments, the followings are shown.

A wordline is connected to a gate of a MOS type BL tunnel element having n+diffused layers and an input voltage of an alternating current is applied on the wordline from a wordline control device. Gates of the MOS type BL tunnel elements are in parallel connected by the wordline. One of the n+diffused layers is connected to a ground line, the other is connected to the dataline and a magnitude of a current flowing in each cell is measured by a galvanometer in a dataline control device.

The above mentioned structure is constituted by providing plural MOS type tunnel elements in parallel, each of which elements has a threshold value $\omega_T$ adjustable based on an internal variable. If a vibration frequency $\omega$ of an alternating current voltage (V1cos$\omega$t) as an input applied on the wordline is larger than $\omega_T$ ($\omega>\omega_T$), a tunneling probability is increased exponentially, so that a BL tunnel current flows in a channel region. In the above case, to the contrary if the vibration frequency $\omega$ of an alternating current voltage is smaller, a BL tunnel current does not flow since a tunneling probability is kept small without any change. A high pass filter can be realized by a single BL tunnel element only by use of this nature. That is, a direct current flows if $\omega>\omega_T$ but a direct current does not flow if $\omega<\omega_T$. The direct current is detected by a sense amplifier, and "1" is given when the current flows and "0" is given when the current does not flow.

Then N BL tunnel elements respectively having different threshold values ($\omega_1<\omega_2<\omega_3<\ldots<\omega_N$ are in parallel connected to a wordline. Herein, if an input satisfies an relation of $\omega_n<\omega<\omega_{n+1}$, an output comprises a sequence in which the left first to the left nth digits assume "1" only and the left n+1th digit and therefrom through the right end digit assume only "0", that is, a sequence of (111 . . . 1000 . . . 0) is obtained. If the number of BL tunnel elements is sufficiently increased and a difference between $\omega_n$ and $\omega_{n+1}$ is reduced, a frequency can be counted with good accuracy.

Embodiments of the aspect K of the present invention will be described.

Figure 87:
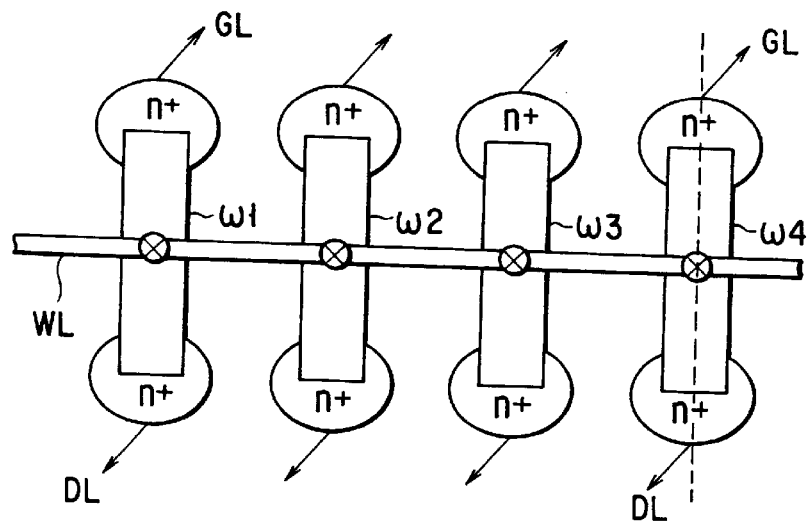
FIG. 87 is a plan view showing a structure of a frequency counter device using a MOS type BL tunnel element according to the aspect K of the present invention.
Figure 88:
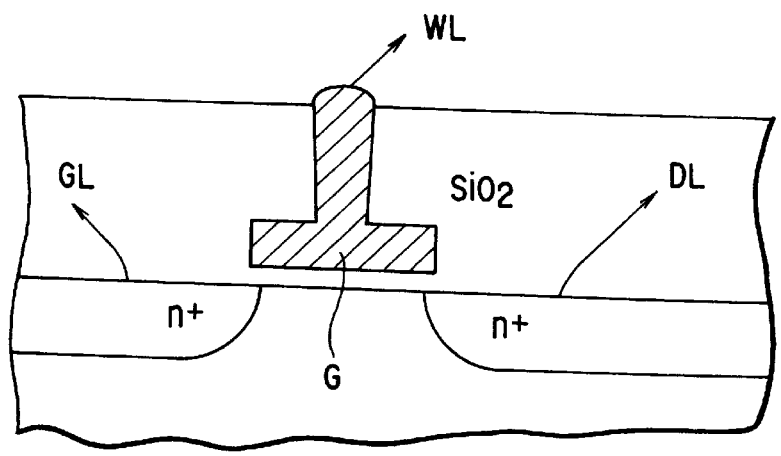
FIG. 88 is a sectional view showing a structure of a frequency counter device using a MOS type BL tunnel element according to the aspect K of the present invention.
Figure 89:
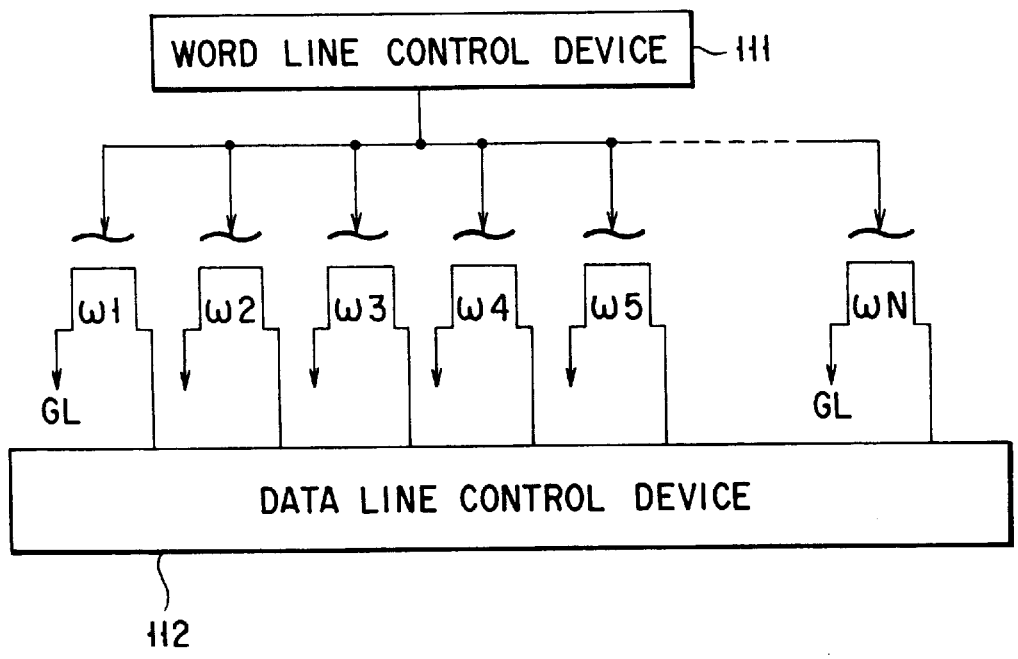
FIG. 89 is a diagram of a circuit constitution of a frequency counter device using a MOS type BL tunnel element according to the aspect K of the present invention.

FIG. 87 is a view of a frequency counter device as seen from thereabove and a sectional view taken along on a dotted line in the figure is FIG. 88. A circuit diagram is shown in FIG. 89. A wordline WL is connected to a wordline control device 111 and a dataline DL is connected to a dataline control device 112.

[Embodiment of the Aspect L of the Present Invention]

A fundamental constitution of the aspect L of the present invention will first be described.

The aspect L has a feature that a light emitting device, an optical waveguide and plural photon type quantum exchange switching devices are combined. It is a feature that inputs of the plural photon type quantum exchange switching devices are light, which is produced by the light emitting device and passes through the optical waveguide, and a very small direct tunnel current flowing in a photon type quantum exchange switching device corresponding to each cell is increased exponentially by the light. As desired embodiments, the followings are shown.

(a) Plural photon type quantum exchange switching devices are in parallel connected to a sense amplifier and an output from each cell flows into the sense amplifier. When light passes through a cell, an energy quantum corresponding to one photon is transferred to an tunneling electron and a tunnel current increases only for the instant of the transfer of a photon exponentially. In this case, an interval between peaks in output current can freely changed by adjusting a distance between cells. A super high frequency oscillating device can be realized by use of such a feature.

(b) If two light pulses are projected at a interval in a continuous manner, an output current to the sense amplifier has a wave form including two peaks of two kinds in magnitude. If the number of larger peaks is indicated as m and the number of smaller peaks is indicated as n, the number of cells is n+2 m. If the interval of light projection is adjusted, m can freely adjusted as well. When the number of light projections is three or more, a sequence of light emission time intervals can be obtained as an optical signal and thus the sequence can be converted to an electric signal (the wave form of an output current) by simple expansion of the case where two pulses are projected. In such a manner, an optical signal/electric signal conversion device is realized.

Figure 90:
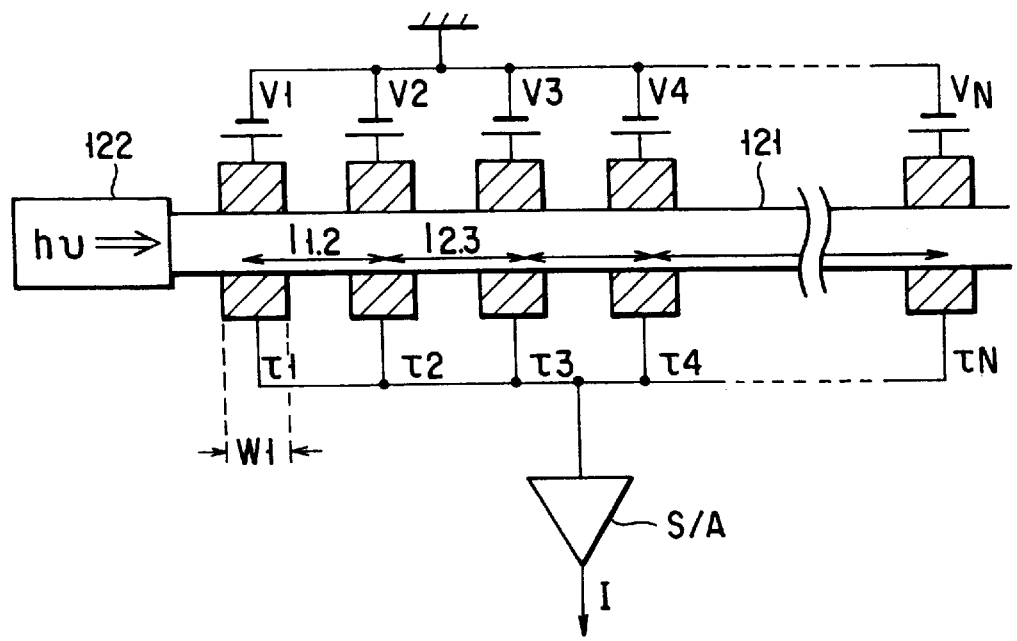
FIG. 90 is a diagram showing a constitution of an optical signal/electric signal conversion device and a super high frequency oscillating device according to the aspect L of the present invention.

A constitution illustrating EL principle of the device is shown in FIG. 90. An optical waveguide 121 is directly connected to a light emitting device 122 and the optical waveguide is sandwiched by plural pair of electrodes. Low voltages $V_m$ (m=1, 2, . . . , N) are respectively applied to pairs of electrodes and an electron in one electrode passes through the optical waveguide and flows into the other electrode of a pair by tunneling effect, so that a very small current flows. When light is projected from the light emitting device 122 to a pair of electrodes through the optical waveguide 122, a tunnel electron absorbs one photon and thereby a tunnel current flowing through between the pair of electrodes is increased exponentially, wherein a scattering process in absorption of two photons is neglected since occurrence of the scattering is very low in terms of probability.

Figure 91:
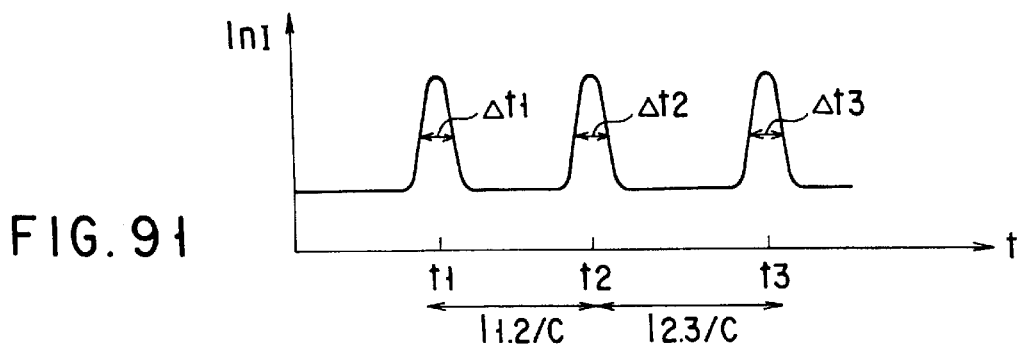
FIG. 91 is a diagram showing a wave form showing an output according to the aspect L of the present invention.

A light propagation distance between a cell m and a cell m+1 is indicated by $l_{m,m+1}$. When a light pulse passes a region (W1) of the optical waveguide, which a cell 1 occupies, in a time length $\Delta t$ at time $t_1$, an output current receives an increment from the cell 1 at an exponential rate, so that a peak as shown at the left end of FIG. 91 appears. Thereafter, when the light pulse passes through a cell 2, a photon is absorbed by a tunneling electron and thus the left second peak in FIG. 91 appears. In a similar manner as these, each time when a light pulse passes cells, a peak of an output current appears. Herein, $\Delta t_m$ is a time length to pass a region $W_m$ of a optical waveguide occupied by a cell, m and $t_m$ is a time point when a light pulse passes through the central area of the region $W_m$, which is defined by a position of a peak shown in FIG. 91. When a light velocity in an optical waveguide is indicated by c , a relation is obtained: $t_{m+1}-t_m=l_{m, m+1}/c$. Therefore, in order to make a wave form shown in FIG. 91 as orderly as can, the following condition is necessary to be met:

$$\min(l_{1,2},l_{2,3},\ldots,l_{N-1,N})/c > \max(\Delta t_1, \Delta t_2, \ldots, \Delta t_N)$$

A device which can satisfies the above condition can be designed by adjusting $l_{m, m+1}$ and $W_m$.

Since a velocity at which light propagates is very fast, a time length (a delay time) in which a current comes out from a cell and reaches the sense amplifier is required to be paid attention. When a delay time for a cell m is indicated by $\tau m$, the following condition is necessary to be met.

$$\min(l_{1,2},l_{2,3},\ldots,l_{N-1,N})/c \gg \max(\tau_1, \tau_2, \ldots, \tau_N)$$

It is required to adjust $l_{m, m+1}$, a parasitic capacitance, a length of an interconnect up to a sense amplifier and the like in order to meet the condition. In addition, a wave form can be adjusted by changing a sign or a magnitude of $V_m$ as well.

As is described above, when one light pulse is emitted, a wave form of an output current has N peaks. If a second light pulse is emitted at a time of $\Delta$ after the first light pulse is emitted, a new wave form is a superposition of the previous wave form and the first light emission. Therefore, a wave form can be adjusted by operating $\Delta$ as well.

Embodiments of the aspect L of the present invention will be described.

Figure 92:
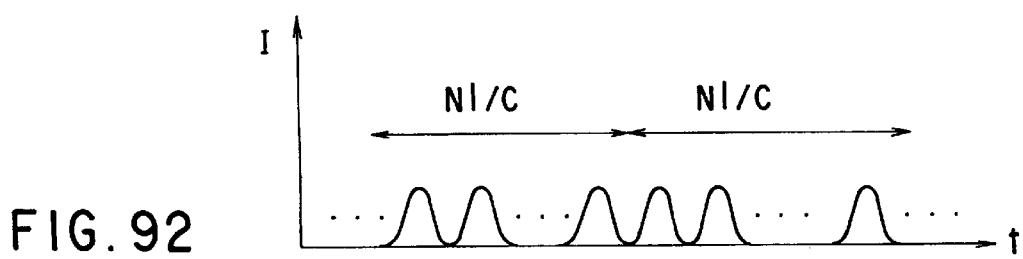
FIG. 92 is a diagram showing an output wave form when a large peak does not arise according to the aspect L of the present invention.

A first embodiment will first be described. The case where light pulses are continued to be emitted at a time interval $\Delta=N1/c$ is considered, where $V_m=V$, $l_{m,m+1}=l$. In this case, a wave form obtained is shown in FIG. 92 and it can be seen from the figure that two wave forms are connected in a continuous manner. Since a time interval between adjacent peaks is l/c, a super high frequency oscillating device having a frequency of c/l can be realized.

Figure 93A:
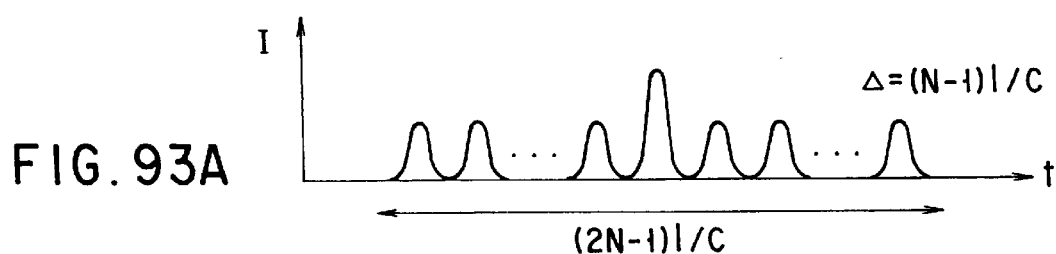
FIGS. 93A to 93C are diagrams showing output wave forms when a large peak arises by superposition according to the aspect L of the present invention.
Figure 93B:
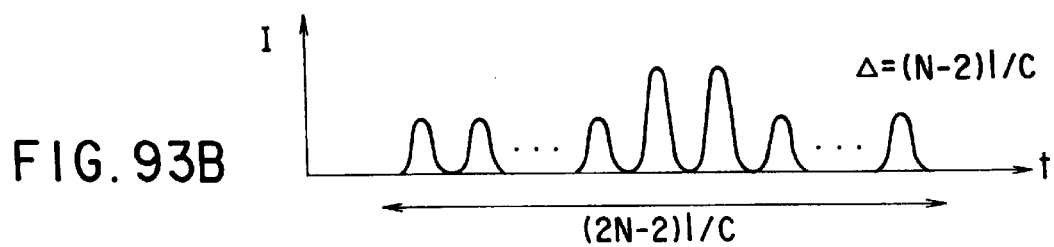
Figure 93C:
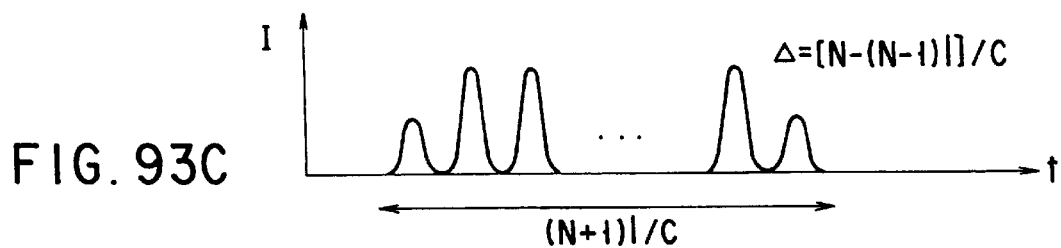

A second embodiment will be described. The cases where two light pulses are projected at an interval of Δ, wherein $V_m=V$, $1_{m,m+1}=1$. In FIG. 93A, a wave form when $\Delta=(N-1)l/c$ is shown. A large peak in the center is produced by superposition of contributions of light passing through a cell 1 and of that through a cell N. In FIG. 93B, a wave form when $\Delta=(N-2)l/c$ is shown. Two large peaks in the center are produced respectively by superposition of current increases from a cell N-1 and a cell 1 on the left side and by superposition of current increases from a cell N a cell 2 on the right side. In FIG. 93C, a wave form when $\Delta=[N-(N-1)]l/c=l/c$ is shown. Large peaks are respectively produced from superpositions of current increases in a cell 2 and a cell 1, a cell 3 and a cell 2, a cell 4 and a cell 3, . . . , a cell N-I and a cell N-2 and a cell N and a cell N-1. The cases where 3 or more light pulses are oscillated are simple expansions of the above description and therefore detailed description is omitted. In the case where Q light pulses are oscillated, however, correspondence between a sequence of time intervals of oscillation ($\Delta_{1,2}$, $\Delta_{2,3}$, . . . , $\Delta_{Q-1,Q}$) and output wave forms are possible. In such a manner, there is realized a device in which an the optical signal can be converted to an electric signal when light oscillation sequence is used as an optical signal.

[Embodiment of the Aspect M of the Present Invention]

A fundamental constitution of the aspect M of the present invention will first be described.

The aspect M is directed to a semiconductor composite substrate, for example, wherein two kinds of semiconductor of Si and GaAs each in the shape of a band are provided in one substrate. A composite substrate including a semiconductor other than silicon and GaAs may be used and in addition plural kinds of semiconductor which are different from each other or one another in surface orientation or molecular structure are provided on one substrate may be used as well.

Figure 94:
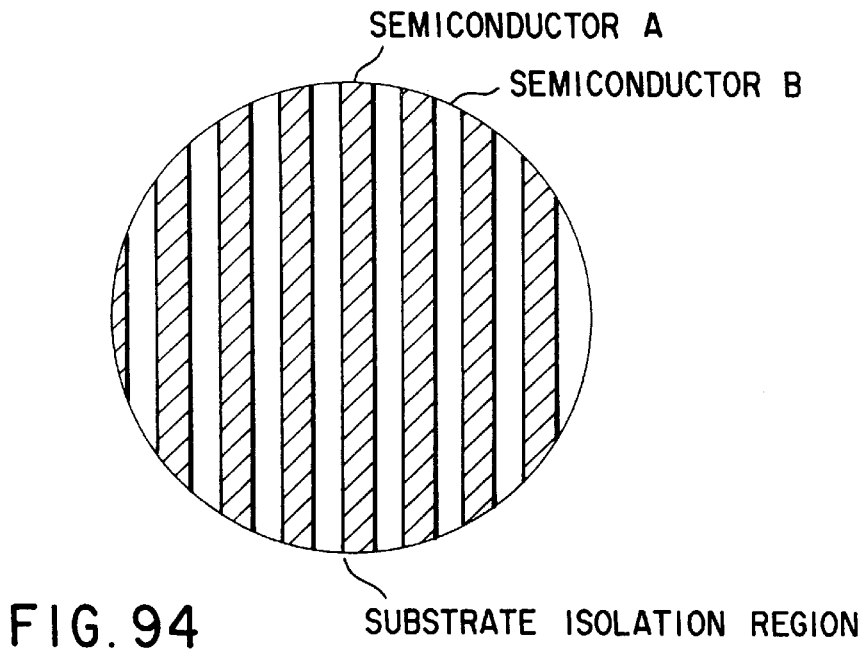
FIG. 94 is a view showing a structure of a semiconductor composite wafer comprising two kinds of semiconductor according to the aspect M of the present invention.
Figure 95:
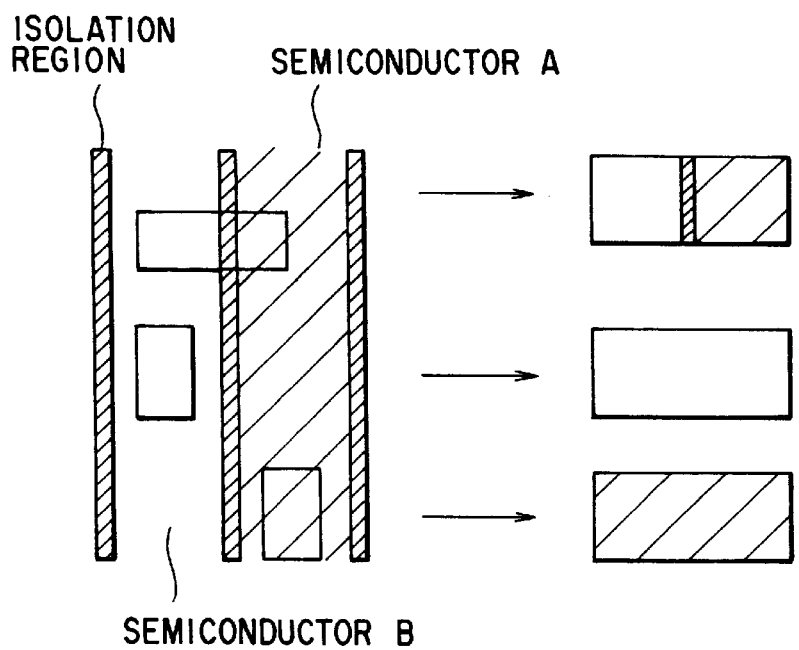
FIG. 95 is a diagram showing a way of producing a chip by cutting a semiconductor composite wafer according to the aspect M of the present invention.

In FIG. 94, a semiconductor composite wafer comprising two kinds of semiconductor A, B is shown. In the figure, hatched regions are of semiconductor A, white regions are of semiconductor B, and black regions are isolation regions of the substrate. In FIG. 95, there is shown a process in which a chip is cut out from the composite wafer. As shown in FIG. 95, three kinds of chip can be cut out from the composite substrate, that is a composite chip, a semiconductor A chip and a semiconductor B chip can be cut out. In the case of a composite wafer using three kinds of semiconductor, a semiconductor chip or a semiconductor composite chip comprising any one, any two or three of three kinds of semiconductor can be cut out. A semiconductor chip or a semiconductor composite chip in the case of four or more kinds can be obtained in a similar way to the case of three kinds.

Embodiments of the aspect M will be described.

Figure 107:
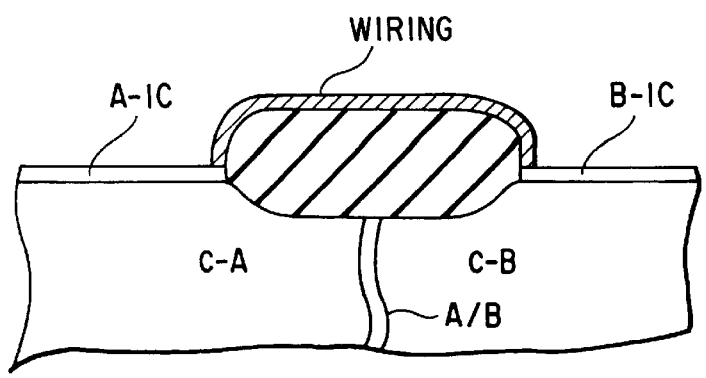
FIG. 107 is a sectional view partly showing a structure of a high functionality integrated circuit fabricated on a semiconductor composite substrate according to the aspect M of the present invention.

As shown in FIG. 107, integrated circuits (A-IC and B-IC) are respectively and independently fabricated on a single crystal semiconductor A(c-A) and a single crystal semiconductor B(c-B), both semiconductors sandwiching a substrate isolation region fabricated by use of an oxide film therebetween, and there is formed wiring which connects A-IC and B-IC striding across an oxide film which works as a substrate isolation region. The wiring includes all means each of which makes it possible to exchange of a signal between A-IC and B-IC, such as optical wiring, electric wiring and the like.

Figure 96:
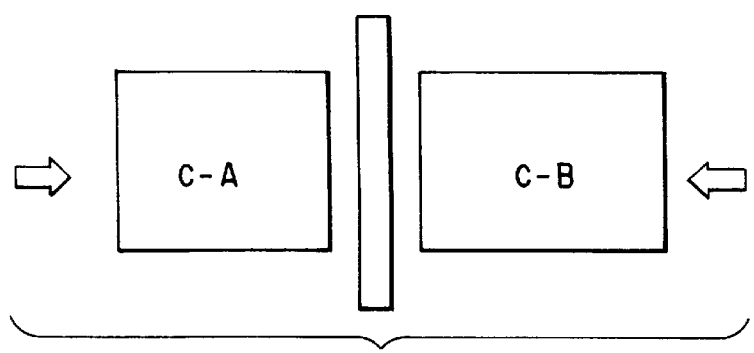
FIG. 96 is a diagram showing a step of a manufacturing process of a semiconductor composite wafer according to the aspect M of the present invention.
Figure 97:
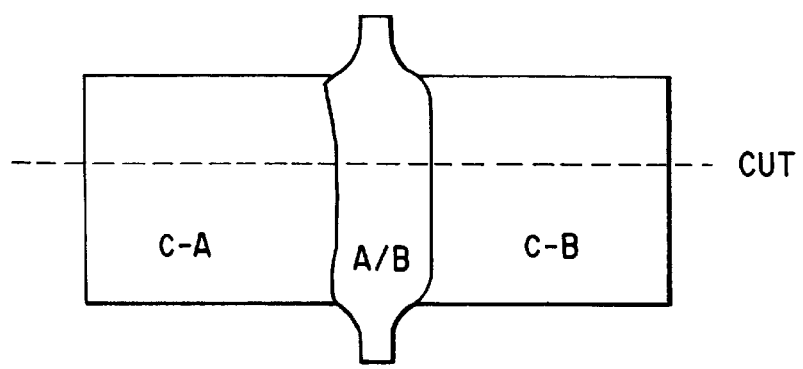
FIG. 97 is a diagram showing a step of a manufacturing process of a semiconductor composite wafer according to the aspect M of the present invention.

Description will be given following the order of steps of a fabrication process. First of all, as shown in FIG. 96, single crystal semiconductor A and single crystal semiconductor B respectively cut out so as to acquire a flat surface in a proper direction are bonded to each other with an adhesive therebetween by heat pressing and as shown in FIG. 97, a bonded layer A/B is formed. This process can be performed without any adhesive.

Figure 98:
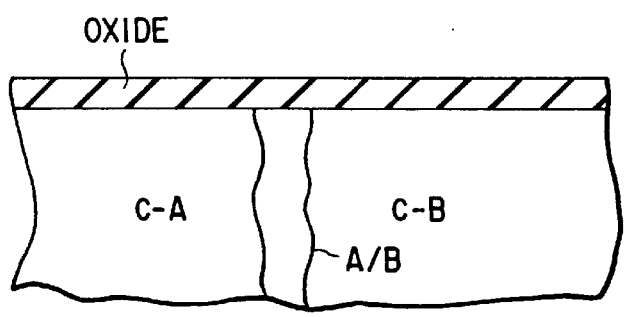
FIG. 98 is a diagram showing a step of a manufacturing process of a semiconductor composite wafer according to the aspect M of the present invention.
Figure 99:
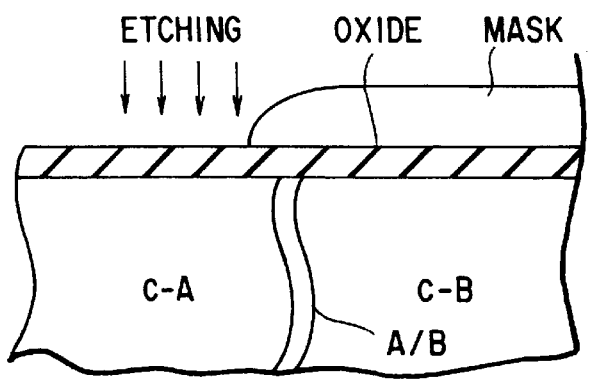
FIG. 99 is a diagram showing a step of a manufacturing process of a semiconductor composite wafer according to the aspect M of the present invention.
Figure 100:
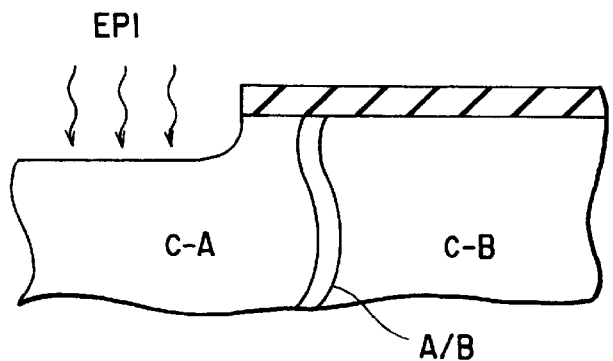
FIG. 100 is a diagram showing a step of a manufacturing process of a semiconductor composite wafer according to the aspect M of the present invention.
Figure 101:
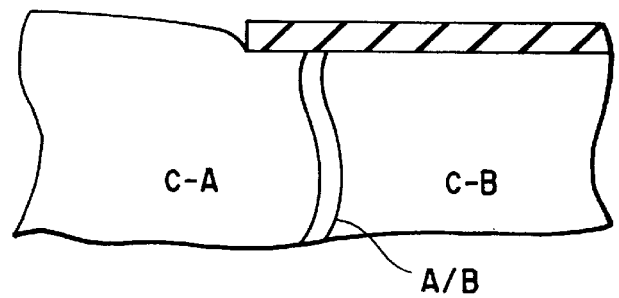
FIG. 101 is a diagram showing a step of a manufacturing process of a semiconductor composite wafer according to the aspect M of the present invention.
Figure 102:
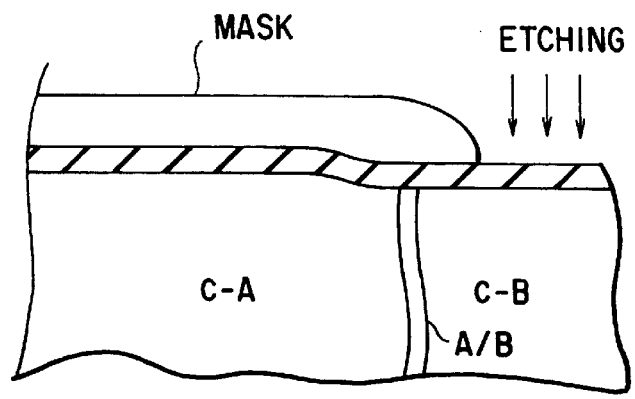
FIG. 102 is a diagram showing a step of a manufacturing process of a semiconductor composite wafer according to the aspect M of the present invention.
Figure 103:
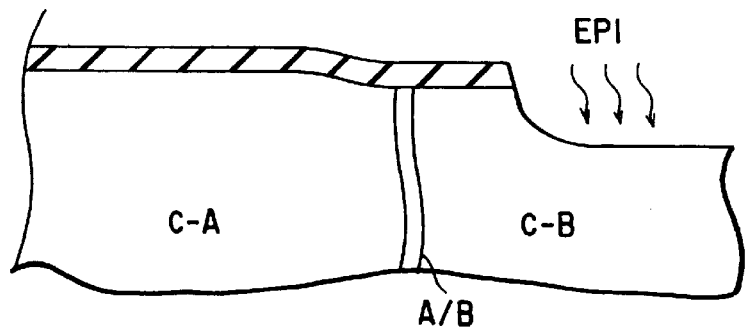
FIG. 103 is a diagram showing a step of a manufacturing process of a semiconductor composite wafer according to the aspect M of the present invention.
Figure 104:
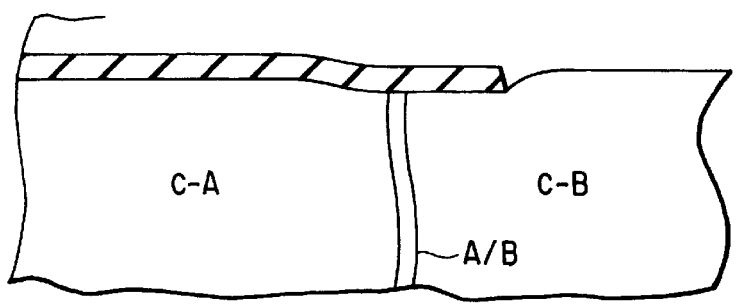
FIG. 104 is a diagram showing a step of a manufacturing process of a semiconductor composite wafer according to the aspect M of the present invention.
Figure 105:
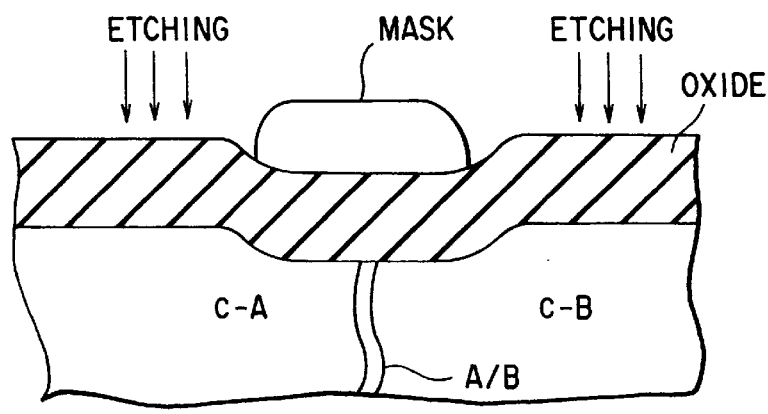
FIG. 105 is a diagram showing a step of a manufacturing process of a semiconductor composite wafer according to the aspect M of the present invention.
Figure 106:
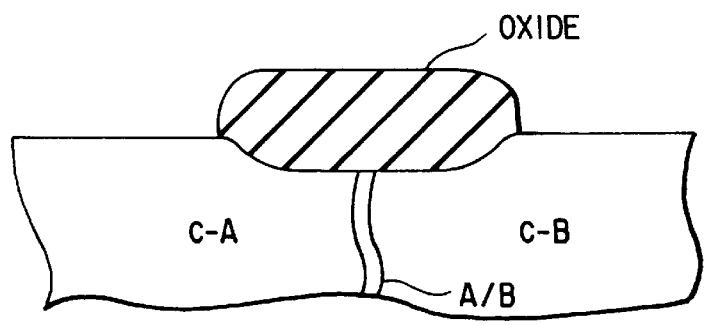
FIG. 106 is a diagram showing a step of a manufacturing process of a semiconductor composite wafer according to the aspect M of the present invention.

Then the bonded semiconductor is cut out along a dotted line shown in FIG. 97 and an oxide film is formed on a surface as shown in FIG. 98. Subsequently, a mask is formed on the oxide film and thereafter etching is conducted to expose a substrate A as shown in FIG. 99. As shown in FIGS. 100 and 101, epitaxial growth of semiconductor A is conducted on the exposed surface of the substrate A. Subsequently, second oxidation is conducted, thereafter a mask is formed and etching follows to expose a substrate B as shown in FIG. 102. As shown in FIGS. 103 and 104, epitaxial growth of semiconductor B is conducted on the exposed surface of the substrate B. Thereafter, all the surface is oxidized and thereafter a mask is formed and etching follows as shown in FIG. 105 and a substrate isolation region by an oxide film is fabricated as is shown in FIG. 106.

Finally, integrated circuits are independently and respectively fabricated on the substrates A and B and wiring is formed so as to stride across the oxide film. In such a manner, integrated circuits can be fabricated on a composite substrate as shown in FIG. 107.

According to the present invention, since absorption of energy quantum by a tunneling electron is adopted as an operational principle, there can be obtained a new device having a feature that there are available a margin in reliability of an insulating film and the like.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A device using BL tunnel elements, comprising:
    a plurality of MOS type BL tunnel elements each defined by a quantum effect device including,
    a semiconductor layer,
    an insulating film formed on said semiconductor layer,
    a channel region formed in said semiconductor layer and having a potential barrier,
    first and second terminals from which a tunnel current flows into said channel region, wherein said first end second terminals are provided at both ends of said channel region, respectively,
    a third terminal formed on said insulating film and configured to supply a high frequency vibration to the potential barrier of said channel region through said insulating film, and
    a mechanism configured to exponentially increase the tunnel current flowing into said channel region with a predetermined threshold vibration frequency as a boundary value;
    a word line control device coupled to each of said third terminals of said plurality of BL tunnel elements;
    a data line control device coupled to each of said first terminals of said plurality of BL tunnel elements; and
    a reference line coupled to each of said second terminals of said plurality of BL tunnel elements.

2. The device according to claim 1, wherein said mechanism configured to exponentially increase the tunnel current achieves a switching on a presence or a non-presence of an exponential increase of the tunnel current.

3. The device according to claim 1, further comprising a data line configured to output a numerical sequence consisting of "0" and "1".

4. The device according to claim 3, wherein said BL tunnel elements flow an exponentially increased tunnel current when an input frequency is greater than said boundary value.

5. The device according to claim 4, wherein the numerical sequence has a length determined by a number of said BL elements.

6. The device according to claim 1, wherein the predetermined threshold vibration frequencies for each of the plurality of BL tunnel elements are different.

7. The device according to claim 1, wherein said device comprises a frequency counter device.

8. The device according to claim 1, wherein said device comprises an analog/digital conversion device.

9. The device according to claim 1, wherein said BL elements comprise one of a switching device and a high pass filter.

10. A device using BL tunnel elements, comprising:
a plurality of MOS type BL tunnel elements each defined by a quantum effect device including,
a tunnel film having a potential barrier,
first and second terminals from which a tunnel current flows through said tunnel film, and
a mechanism configured to apply a high frequency voltage to of said first terminal, to supply a high frequency vibration to the potential barrier of said tunnel film, and to exponentially increase the tunnel current flowing through said tunnel film with a predetermined threshold frequency as a boundary value;
a word line control device coupled to each of said first terminals of said plurality of BL tunnel elements; and
a data line control device coupled to each of said second terminals of said plurality of BL tunnel elements.

11. The device according to claim 10, wherein the predetermined threshold frequency is determined by said tunnel film.

12. A device using BL tunnel elements, comprising:
a plurality of MOS type BL tunnel elements each defined by a quantum effect device including,
a tunnel film having a potential barrier,
first and second terminals from which a tunnel current flows through said tunnel film,
a third terminal through which a high frequency vibration is supplied to the potential barrier of said tunnel film, and
a mechanism configured to exponentially increase the tunnel current flowing through said tunnel film with a predetermined threshold vibration frequency as a boundary value;
a word line control device coupled to each said third terminal of said plurality of BL tunnel elements;
a data line control device coupled to each of said first terminals of said plurality of BL tunnel elements; and
a reference line coupled to each of said second terminals of said plurality of BL tunnel elements.

13. A device using BL tunnel elements, comprising:
a plurality of MOS type BL tunnel elements each defined by a quantum effect device including,
a substrate,
a first tunnel film formed on said substrate,
a first gate formed on said first tunnel film,
a second tunnel film formed on said first gate,
a second gate formed on said second tunnel film,
a mechanism configured to supply high frequency vibration to said first gate and to exponentially increase a tunnel current flowing between said first gate and said substrate and flowing between said first gate and said second gate with a predetermined threshold vibration frequency as a boundary value;
a word line control device coupled to each first gate of said plurality of BL tunnel elements;
a data line control device coupled to each second gate of said plurality of BL tunnel elements; and
a reference line coupled to each substrate of said plurality of BL tunnel elements.

14. A device using BL tunnel elements, comprising:
a plurality of MOS type BL tunnel elements each defined by a quantum effect device including,
a substrate,
a first tunnel film formed on said substrate,
a first gate formed on said first tunnel film,
a second tunnel film formed on said first gate,
a second gate formed on said second tunnel film, and
a mechanism configured to supply high frequency vibration to said second gate and to exponentially increase a tunnel current flowing between said first gate and said second gate with a predetermined threshold vibration frequency as a boundary value;
a word line control device coupled to each second gate of said plurality of BL tunnel elements;
a data line control device coupled to each first gate of said plurality of BL tunnel elements; and
reference line coupled to each substrate of said plurality of BL tunnel elements.

15. The device according to claim 14, further comprising:
a source region formed in said substrate;
a drain region formed in said substrate; and
a channel region formed in said substrate and abutted to said source region and said drain region.

* * * * *